(12) United States Patent
Kawada et al.

(10) Patent No.: US 7,363,857 B2
(45) Date of Patent: Apr. 29, 2008

(54) CYLINDRICAL OUTER SURFACE SCANNING APPARATUS

(75) Inventors: Toru Kawada, Kyoto (JP); Toshio Tamura, Kyoto (JP); Shiro Kitawaki, Kyoto (JP)

(73) Assignee: Dainippon Screen Mfg. Co., Ltd., Kyoto (JP)

(*) Notice: Subject to any disclaimer, the term of this patent is extended or adjusted under 35 U.S.C. 154(b) by 1284 days.

(21) Appl. No.: 10/140,195

(22) Filed: May 8, 2002

(65) Prior Publication Data

US 2003/0147107 A1  Aug. 7, 2003

(30) Foreign Application Priority Data

| May 11, 2001 | (JP) | ............................ 2001-142340 |
| May 11, 2001 | (JP) | ............................ 2001-142341 |
| May 11, 2001 | (JP) | ............................ 2001-142342 |

(51) Int. Cl.
*B32B 1/188* (2006.01)

(52) U.S. Cl. ................... 101/477; 101/378; 101/382.1; 101/485

(58) Field of Classification Search ................ 101/378, 101/382.1, 383, 389.1, 401.1, 409, 477, 481, 101/485

See application file for complete search history.

(56) References Cited

U.S. PATENT DOCUMENTS

| 3,160,096 | A | | 12/1964 | Norton |
| 3,882,775 | A | * | 5/1975 | Lytle et al. ............... 101/415.1 |
| 4,628,815 | A | * | 12/1986 | Van Kanegan ........... 101/415.1 |
| 5,052,120 | A | | 10/1991 | Lubberts |
| 5,255,607 | A | | 10/1993 | Nishiyama et al. |

(Continued)

FOREIGN PATENT DOCUMENTS

EP    0 667 237 B1    8/1995

(Continued)

OTHER PUBLICATIONS

Partial European Search Report issued in corresponding European Patent Application No. EP 02 00 9398, dated Apr. 16, 2007.

(Continued)

*Primary Examiner*—Daniel J. Colilla
*Assistant Examiner*—Kevin D. Williams
(74) *Attorney, Agent, or Firm*—McDermott Will & Emery LLP

(57) ABSTRACT

Depending on the lateral width thereof, an image recording material P is stably positioned on a recording drum, employing two positioning pins with an appropriate pitch therebetween. Non-contacting portions prevent any irrelevant positioning pins from coming into contact with the material P. The material P may be transported onto the recording drum 5 while one end thereof constitutes an angle U with a rotation axis 5N of the recording drum 5. A reference notch 44*ae* first fits with a positioning pin 51*a*. Thereafter, as the aforementioned end of the material P abuts with a positioning pin 51*b*, accurate positioning occurs. Each positioning pin 51 includes a tapered portion having a reference taper angle 2T. When a leading-end clamp 52 clamps the aforementioned end, the material P comes in contact with the tapered portion, with a, reduced friction force against the positioning pin 51, thereby preventing deformation of the material P.

26 Claims, 33 Drawing Sheets

U.S. PATENT DOCUMENTS

| | | | |
|---|---|---|---|
| 5,526,746 A | 6/1996 | Capdeboscq | |
| 5,634,406 A | 6/1997 | Lindner et al. | |
| 6,016,752 A | 1/2000 | Harari | |
| 6,135,027 A | 10/2000 | Rudzewitz et al. | |
| 6,213,020 B1 | 4/2001 | Kawada et al. | |
| 6,299,572 B1 | 10/2001 | Harari | |
| 6,321,651 B1 | 11/2001 | Tice et al. | |
| 6,418,849 B1 * | 7/2002 | Fukui | 101/409 |

FOREIGN PATENT DOCUMENTS

| | | |
|---|---|---|
| EP | 0 686 503 A1 | 12/1995 |
| EP | 0 933 204 A1 | 12/1998 |
| EP | 0 950 925 A2 | 4/1999 |
| EP | 1 084 842 A2 | 9/2000 |
| JP | 7-241979 | 9/1995 |
| JP | 08-039779 | 2/1996 |
| JP | 8-207251 | 8/1996 |
| JP | 2000-056482 A | 2/2000 |

OTHER PUBLICATIONS

European Search Report, issued in corresponding European Application No. 02009398.5, dated on Aug. 30, 2007.

European Office Action issued in corresponding European Patent Application No. 02 009 398.5-2222, dated on Jan. 8, 2008.

* cited by examiner

FIG. 19

| PLATE LATERAL WIDTH | RANGE OF LATERAL WIDTH | PUNCH ACTIVATION | | | POSITIONING PIN | | |
|---|---|---|---|---|---|---|---|
| | | 44a | 44b | 44c | 51a | 51b | 51c |
| Lmin | $Q1+2t$ | on | off | off | ○ | ○ | — |
| L1 | $Lmin < L1 < 2Q2-Q1-2r$ | on | off | off | ○ | ○ | — |
| L2 | $2Q2-Q1-2r \leqq L2 < 2Q2-Q1+2t$ | on | off | on | ○ | ○ | NON-CONTACTING |
| L3 | $2Q2-Q1+2t \leqq L3 < Lmax$ | on | on | off | ○ | NON-CONTACTING | ○ |
| Lmax | Lmax | on | on | off | ○ | NON-CONTACTING | ○ |

FIG. 22A
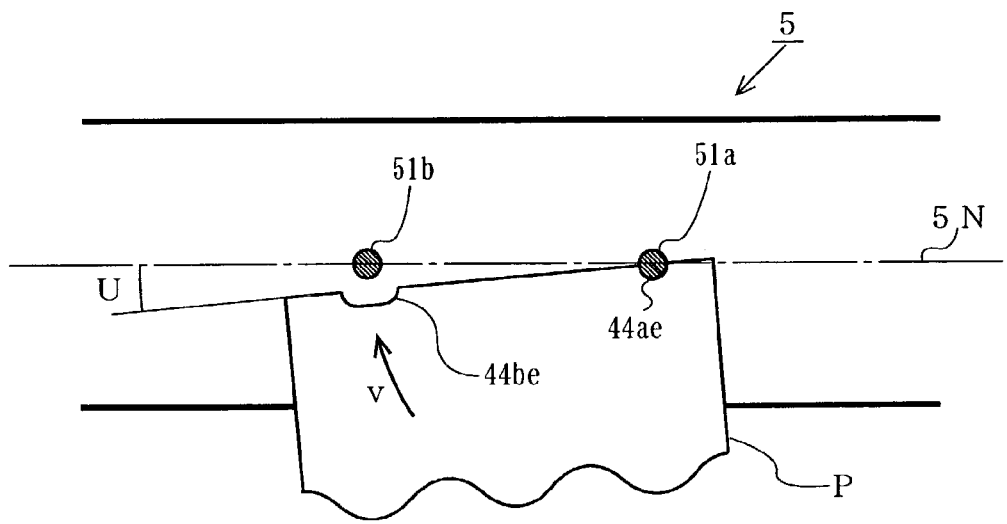
FIG. 22B
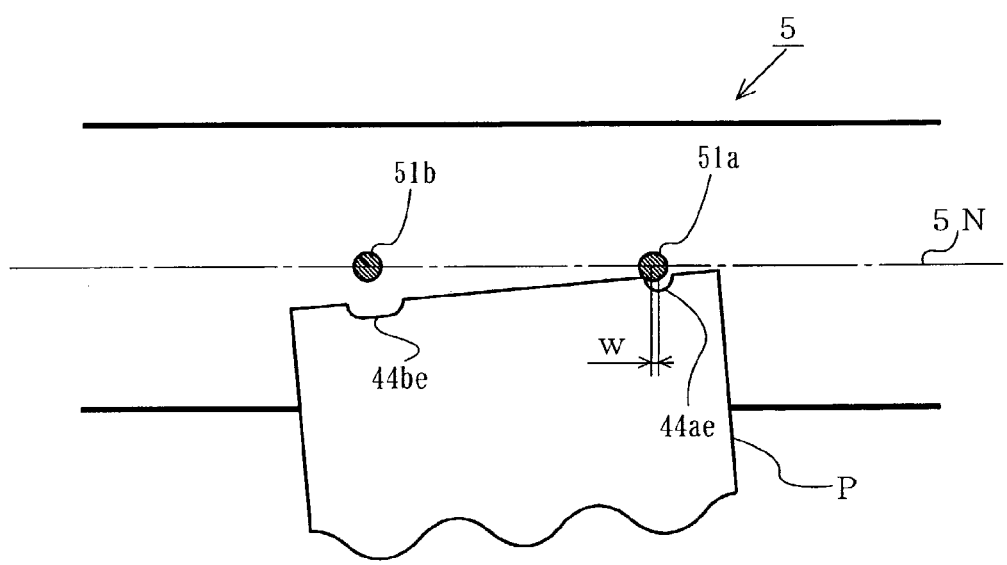
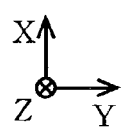

CYLINDRICAL OUTER SURFACE SCANNING APPARATUS

BACKGROUND OF THE INVENTION

1. Field of the Invention

The present invention relates to a cylindrical outer surface scanning apparatus and a method for use therewith. More particularly, the present invention relates to: a cylindrical outer surface scanning apparatus comprising a recording drum having a cylindrical outer surface for mounting a plate thereon, and an exposure section for scanning the drum with a light beam in a circumferential direction as well as an axial direction of the drum to perform an exposure process for the plate; and a method for use with the cylindrical outer surface scanning apparatus.

2. Related Art Statement

Conventionally, color printed materials are produced through a number of processes such as an exposure process (which serves as an image recording process), a printing process, and the like. Prior to the exposure process, an original image of a color printed material is separated into a plurality of colors, which typically are: Y(Yellow), M(Magenta), C(Cyan), and K(Kuro, i.e., "black"). Thus, image data of the respective colors are generated. Such image data are supplied to a cylindrical outer surface scanning apparatus which is used for an exposure process. The cylindrical outer surface scanning apparatus incorporates a recording drum. On the outer surface of the recording drum, a sheet-shaped plate which serves as an image recording material, e.g., a so-called PS plate(Presensitized Plate), is mounted. A "PS plate" is a plate comprising a plate material (e.g., an aluminum plate, a plastic sheet, or paper) and a photo-sensitive layer preapplied on the plate material.

In the exposure process, the cylindrical outer surface scanning apparatus subjects the plate which is mounted on the outer surface of the recording drum to an exposure process in order to form an image of each of the respective separated colors on a plate based on the image data thus supplied. In other words, in the case where the original image is color-separated into Y, M, C, and K, the cylindrical outer surface scanning apparatus draws images of the four different colors on four plates.

A printing machine which is used in a printing process applies inks to the plates which have been exposed, each ink being in a color corresponding to the associated plate, so as to overlay the respective images on a final color printed material. If the images of one or more colors are misaligned with each other when overlaid, the result color printed material will be of an inferior quality. In order to prevent such misalignment between images, positioning holes for the printing process, which are used as a positioning reference during the printing process, are formed in predetermined positions in the plate, prior to the exposure process. Each plate can be positioned in place by fitting pins which are provided on a printing drum of the printing machine into the positioning holes for the printing process. In some cases, e.g., where the specific printing machine to be used is still undecided at the prepress stage, the positioning holes for the printing process may be formed after the prepress.

Misalignments between images may also occur if the positions of one or more images drawn during the exposure process are misaligned with respect to the plates of the corresponding colors. In order to prevent such image misalignments with respect to the plates during the exposure process, positioning pins for positioning each plate in place are provided on the outer surface of the recording drum of the cylindrical outer surface scanning apparatus. Together with the holes for the printing process, positioning notches for the recording drum are provided along one end of the plate, the positioning notches being configured so as to receive the positioning pins. Thus, the positioning notches for the recording drum and the positioning holes for the printing process are formed in each plate prior to an exposure process. During the exposure process, the positioning notches for the recording drum can be used as a reference for aligning the images to be exposed. During the printing process, the positioning holes for the printing process can be used as a reference for aligning the images to be printed.

Each plate is mounted on the outer surface of the recording drum of the cylindrical outer surface scanning apparatus. The plate is subjected to an exposure process while rotating the recording drum at a high speed (e.g., 1000 rpm). In order to prevent the plate from dropping off the outer surface of the recording drum, the plate is pinched by means of clamps at the leading end and the trailing end, and held in close contact on the recording drum surface with a negative pressure applied from the recording drum surface. Since it is highly dangerous if the plate drops off during an exposure process, latch holes are formed in the plate as safety means. Through the latch holes, the plate is latched on latch pins which are provided on the recording drum surface, whereby the plate is prevented from dropping off.

FIG. 26 is a schematic diagram showing the relative positions of holes which are provided in a plate with various purposes and pins which are provided on the recording drum. For conciseness, the holes for the printing process, which are to be provided in accordance with the specifications of the printing machine used, are omitted from FIG. 26. In FIG. 26, positioning pins 170a and 170b and latch pins 175a and 175b are provided on the outer surface of the recording drum 160. In the plate 150, positioning notches 151a and 151b for the recording drum are formed in positions corresponding to the positioning pins 170. The positioning notch 151a have a semicircular shape having the same inner diameter as that of the positioning pin 170a. The positioning notch 151b has an elongated semicircular shape as if the semicircular shape of the positioning pin 170b were elongated in the lateral direction in the figure. An intra-central intra-central pitch between the positioning pins 170 and an intra-central pitch between the positioning notches 151 are both set equal to a pitch J. Also in the plate 150, latch holes 152a and 152b are formed so as to correspond to the positions of the latch pins 175a and 175b when the positioning pins 170 are fitted in the positioning notches 151. Each of the latch holes 152a and 152b is formed so as to be larger than the latch pins 175 in both vertical and lateral directions in the figure.

When the plate 150 is mounted on the recording drum 160, the plate 150 is transported by a transporter (not shown) in an X direction shown in FIG. 26 until positioned in place as the positioning pins 170 fit into the positioning notches 151. More specifically, the plate 150 is positioned along the axial direction of the recording drum 160 as the positioning pin 170a fits into the positioning notch 151a, and along the circumferential direction (i.e., the X direction) as the two positioning pins 170 fit into the two positioning notches 151. Once the plate 150 is positioned, the plate is latched on the latch pins 175 through the latch holes 152. Since the latch holes 152 are formed larger than the latch pins 175, some interspace is left between the latch holes 152 and the latch pins 175 in a latched state.

FIG. 27A is a schematic diagram illustrating leading-end clamps 180a, 180b, and 180c provided on the recording drum 160. FIG. 27B is a schematic diagram illustrating the plate 150 being stabilized on the recording drum 160. For conciseness, the aforementioned latch pins 175 and the latch holes 152 are omitted from FIG. 27A. As shown in FIG. 27B, the plate 150 is stabilized as the leading-end clamps 180a to 180c pinch the plate 150 against the recording drum 160 at one end thereof.

However, the aforementioned method of positioning and stabilizing the plate 150 onto the recording drum 160 has first to third problems described below.

(First Problem)

A minimum lateral width Lmin of a plate 150 which can be positioned on the recording drum 160 (shown in FIG. 26) is equal to a pitch J of the positioning pins 170 plus a margin t on either side thereof, i.e., Lmin=J+2t. On the other hand, a maximum lateral width Lmax of a plate 150 which can be exposed is limited by a dimension of the recording drum 160 along the axial direction.

However, since there is a desire to support various plate geometries, it may become necessary to perform an exposure process for a plate 150 having a pitch J which is smaller than the minimum lateral width Lmin. In order to address such situations, the pitch J may be simply reduced so as to correspond to shorter plates 150. However, a reduced pitch J will generally result in a poorer positioning accuracy when positioning a plate 150 having a lateral width which is closer to the maximum lateral width Lmax. Another method for supporting a minimum lateral width Lmin shorter than the pitch J might be to provide a further positioning pin between the two positioning pins 170, so that three (or more) positioning pins will be used to position the plate 150 in place.

According to the latter method, a plate 150 having a lateral width greater than the pitch J can be positioned by fitting the three or more positioning pins into three or more corresponding positioning notches. Under such a positioning method, however, minute discrepancies in the dimensional accuracy of the positions of the positioning pins and the positions/shapes of the positioning notch may affect the positioning accuracy of the plate 150 more substantially than in the case of the method of using two positioning pins for positioning, thereby resulting in a poorer stability of positioning accuracy. Specifically, it may often be the case that two of the three (or more) positioning pins are fitted in the corresponding positioning notches while the other positioning pin(s) is not in proper contact with the corresponding positioning notch(s).

(Second Problem)

As shown in FIGS. 28A and 28B, after positioning notches 151 are formed in the plate 150, the plate 150 is transported onto the recording drum 160. In general, this transportation of the plate 150 is achieved by means of transportation rollers or the like (see the transition from a state shown in FIG. 28A to a state shown in FIG. 28B). Depending on the transportation positioning accuracy of the transportation rollers and/or the flexure of the plate 150, the positioning pins 170 may not fit into the positioning notches 151. FIG. 28C illustrates an exemplary case where a plate 150 which has been transported onto the recording drum 160 by means of the transportation rollers the positioning pin 170b first comes in contact with the positioning notch 151b. In this case, the plate 150 rotates while sliding along a T direction in FIG. 28(C) within the bounds of the positioning notch 151b. Since the plate 150 in this case will eventually rotate around a center of rotation which exists at a position along the edge of the positioning notch 151b tending toward the center of the plate 15, the positioning pin 170a may not fit in the positioning notch 151a, so that the plate 150 is not properly positioned on the recording drum 160.

(Third Problem)

FIGS. 29A and 29B are longitudinal cross-sectional views illustrating how the plate 150 is positioned and stabilized on the recording drum 160, as seen from an s direction in FIG. 27B. The longitudinal cross-sectional view of FIG. 29A illustrates the neighborhood of one of the positioning pins 170 and a corresponding one of the leading-end clamps 180. The longitudinal cross-sectional view of FIG. 29B provides an enlarged view of the neighborhood of the positioning pin 170. Referring to FIG. 29A, the positioning pin 170 comprises a cylindrical-shaped pin 171 (having a radius r) being internally fastened with a bolt 172, thereby being fixed on the recording drum 160. The leading-end clamp 180 is disposed so as to pivot around a leading-end clamp axis 181. At one end, the leading-end clamp 180 is biased by a spring 182 so as to pivot in an Fcl direction in FIGS. 29A and 29B and clamp one end (i.e., "the leading end") the plate 150. The plate 150 is transported onto the recording drum 160 by means of the transportation rollers 190 of the transporter, at a transportation angle (angle M) with respect to a normal of the central axis of the positioning pin 170. Then, the plate 150 is transported by means of the transportation rollers 190 in an Fr direction shown in FIG. 29B, until the positioning pin 170 fits in the positioning notch 151 formed in the plate 150 (as represented by the plate 150a). Next, the leading-end clamp 180 is pivoted in the Fcl direction, so that the leading end of the plate 150 is pinched down and stabilized on the recording drum 160. Thereafter, the recording drum 160 is rotated in an Fd direction, so that the plate 150 is completely taken off the transporter and wound around the outer surface of the recording drum 160 in close contact thereto (as represented by the plate 150b).

Now, the manner in which reference notch 151 receiving the positioning pin 170 is clamped will be described in detail. As shown in FIGS. 29A and 29B, when the plate 150 is transported onto the recording drum 160 by the transporter so that the positioning pin 170 is fitted in the reference notch 151, the reference notch is at a distance H off the outer surface of the cylindrical recording drum 160, where the distance H is given as follows:

$$H \geq r \cdot \tan M.$$

Next, the leading end of the plate 150 is clamped by the leading-end clamp 180 while receiving a driving force in the Fr direction from the transportation rollers 190. Through this clamping operation, the peripheries of the reference notches are pressed against the outer surface of the cylindrical recording drum 160. In other words, the peripheries of the reference notches must travel the distance H while being in contact with the positioning pins 170 under the driving force applied in the Fr direction. Since the plate 150 is prevented from moving in a direction perpendicular to the outer surface of the cylindrical recording drum 160 due to a friction force against the positioning pins 170, deformation occurs around the reference notches, such that the deformed portions do not come in close contact with the outer surface of the cylindrical recording drum 160. FIG. 30 is a plan view schematically showing the plate 150 which has been deformed in the aforementioned manner. In FIG. 30, the deformed portions Ua and Ub, which are not in close contact with the outer surface of the cylindrical recording drum 160, are lifted off the recording drum 160 relative to the regions of the plate 150 which are in contact with the recording drum 160. If the deformed portions Ua and Ub are in an exposure region W of the plate 150 and the amount of lift exceeds the depth of focus of an exposure head optical system, a blur will occur in the image which is exposed deformed in the portions Ua and Ub. When such a blur occurs in the exposed image, the plate 150 cannot be used for printing because it will produce an unsatisfactory printing result.

In order to reduce the aforementioned distance H, it may be conceivable to transport the plate 150 in a direction perpendicular to the central axis of the positioning pins 170 (i.e., angle M=0 in FIG. 29A). However, it will be difficult to align such a recording drum 160 with a transporter. Coupled with an influence of the flexure of the plate 150, etc., it is difficult to reduce the distance H to zero, and hence deformation of the plate 150 cannot be prevented.

SUMMARY OF THE INVENTION

Thus, an object of the present invention is to provide a cylindrical outer surface scanning apparatus for mounting for exposure a plate on the outer surface of a recording drum, such that the plate can be accurately positioned on the outer surface of the recording drum without being restricted by the lateral width of the plate. A further object of the present invention is to provide a cylindrical outer surface scanning apparatus which is capable of stabilizing an accurately positioned plate on the outer surface of the recording drum without allowing the plate to be deformed.

The present invention has the following features to attain the object above.

A first aspect of the present invention is directed to a cylindrical outer surface scanning apparatus for recording an image on an image recording material mounted thereon, comprising: a recording section having a cylindrical outer surface on which the image recording material is mounted, wherein the recording section at least includes: a first positioning member fixed on the cylindrical outer surface; a second positioning member fixed on the cylindrical outer surface and located at a first pitch from the first positioning member along a cylindrical axis direction of the recording section; and a third positioning member fixed on the cylindrical outer surface and located at a second pitch from the first positioning member along the cylindrical axis direction, so that the third positioning member is further away from the first positioning member than the second positioning member, the second pitch being greater than the first pitch, wherein the cylindrical outer surface scanning apparatus further comprises a first non-contacting portion forming section for forming a first non-contacting portion in the image recording material to prevent the second positioning member from coming in contact with the image recording material when the image recording material is mounted and positioned in place on the recording section by the first and third positioning members.

Thus, according to the first aspect, an image recording material is positioned in place by using the first and third positioning members fixed on the recording section. Since the second positioning member, which is not used for positioning in this case, is prevented from being in contact with the image recording material, the image recording material can be stably positioned in place on the recording section.

The cylindrical outer surface scanning apparatus may further comprise a punching section for punching the image recording material to specify where on the recording section the image recording material is to be mounted, wherein the punching section at least includes: the first non-contacting portion forming section; and a fitting portion forming section for forming a fitting portion in the image recording material, such that the first positioning member fits in the fitting portion, wherein, in a case where the image recording material is to be positioned in place on the recording section by using the first and second positioning members, the fitting portion forming section may form the fitting portion in the image recording material, so that the image recording material is positioned in place by fitting the first positioning member in the fitting portion and abutting the second positioning member with an end of the image recording material, and wherein, in a case where the image recording material is to be positioned in place on the recording section by using the first and third positioning members, the fitting portion forming section and the first non-contacting portion forming section may form the fitting portion and the first non-contacting portion, respectively, in the image recording material, and the image recording material is positioned in place by fitting the first positioning member in the fitting portion and abutting the third positioning member with the end of the image recording material.

Thus, two appropriate positioning members are selected from among at least three positioning members fixed on the recording section, to be used for positioning the image recording material, depending on the lateral width of the image recording material mounted on the recording section. Since any second positioning members that are not used for positioning are prevented from being in contact with the image recording material, the image recording material can be stably positioned in place on the recording section.

In a case where the end of the image recording material along which the fitting portion is formed is shorter than the second pitch, the fitting portion forming section may form the fitting portion in the image recording material, and the image recording material may be positioned in place by fitting the first positioning member in the fitting portion and abutting the second positioning member with the end of the image recording material, and in a case where the end of the image recording material along which the fitting portion is formed is longer than the second pitch, the fitting portion forming section and the first non-contacting portion forming section may form the fitting portion and the first non-contacting portion, respectively, in the image recording material, and the image recording material may be positioned in place by fitting the first positioning member in the fitting portion and abutting the third positioning member with the end of the image recording material.

Thus, for an image recording material having a relatively short lateral width, two short-pitched positioning members are used for positioning the image recording material on the recording section. On the other hand, for an image recording material having a relatively long lateral width, two long-pitched positioning members on the opposite ends are used for positioning the image recording material on the recording section, this being made possible by providing non-contacting portions which prevent any intermediate positioning members from being in contact with the image recording material. Thus, for a wide range of lateral widths, the image recording material can be stably positioned in place on the recording section by employing two positioning members provided at an appropriate pitch.

The punching section may further include: a second non-contacting portion forming section for forming a second non-contacting portion in the image recording material to prevent the third positioning member from coming in contact with the image recording material when the image recording material is mounted on the recording section, and, in a case where a corner along the end of the image recording material is to be located near the third positioning member when the image recording material is positioned in place on the recording section, the fitting portion forming section and the second non-contacting portion forming section may form the fitting portion and the second non-contacting portion, respectively, in the image recording material, and the image recording material is positioned in place by fitting the first positioning member in the fitting portion and abutting the second positioning member with the end of the image recording material.

Thus, in the case where a corner of the image recording material to be positioned on the recording section is located near a positioning member, such that the lateral width of the image recording material is insufficient for that positioning member to be used for positioning and yet that the image recording material comes in contact with the positioning member, a non-contacting portion can effectively prevent the positioning member from being in contact, thereby enabling stable positioning. In accordance with this positioning technique, the image recording material can be stably positioned in place on the recording section by employing two positioning members provided at an appropriate pitch, for a wide range of lateral widths thereof.

A center line of the image recording material may be aligned with a middle point between the first and second positioning members for positioning, wherein, in a case where the end of the image recording material along which the fitting portion is formed is shorter than a first length, the first length being a sum of the second pitch and a difference between the second and first pitches, the fitting portion forming section may form the fitting portion in the image recording material, and the image recording material may be positioned in place by fitting the first positioning member in the fitting portion and abutting the second positioning member with the end of the image recording material, wherein, in a case where the end of the image recording material along which the fitting portion is formed is longer than a second length, the second length being a sum of the second pitch, the difference between the second and first pitches and a predetermined margin, the fitting portion forming section and the first non-contacting portion forming section may form the fitting portion and the first non-contacting portion, respectively, in the image recording material, and the image recording material may be positioned in place by fitting the first positioning member in the fitting portion and abutting the third positioning member with the end of the image recording material, and wherein, in a case where the end of the image recording material along which the fitting portion is formed is longer than the first length and shorter than the second length, the fitting portion forming section and the second non-contacting portion forming section may form the fitting portion and the second non-contacting portion, respectively, in the image recording material, and the image recording material may be positioned in place by fitting first positioning member in the fitting portion and abutting the second positioning member with the end of the image recording material.

Thus, an image recording material which is positioned on the recording section by relying on a center line image recording material, which may have a wide range of lateral widths, can be stably positioned in place on the recording section by employing two positioning members provided at an appropriate pitch.

Each of the first to third positioning members may be a positioning pin having a radius r, and the second and third positioning members may be disposed at the distance of r from the first positioning member along a circumferential direction of the cylindrical outer surface.

Thus, by composing each positioning member with a pin having a radius r, and employing two pins which are set apart by the radius r along the circumferential direction, the present invention can be realized with ease.

The cylindrical outer surface scanning apparatus may further comprise a transportation section for transporting the image recording material having been punched by the punching section onto the recording section, wherein the recording section rotates around the cylindrical axis of the recording section, and wherein, when transporting the image recording material having been punched by the punching section onto the recording section, the transportation section may transport the image recording material in such a manner that the end of the image recording material is tilted with respect to the cylindrical axis of the recording section, and the image recording material may be positioned in place on the recording section by fitting the first positioning member in the fitting portion formed in the image recording material and thereafter abutting the second positioning member with the end of the image recording material.

Thus, the transportation section transports the image recording material in such a manner that the end of the image recording material is tilted with respect to the cylindrical axis of the recording section. As a result, the image recording material is positioned along the circumferential direction by first fitting the fitting portion (which is used to determine the positioning along the cylindrical axis direction of the recording section) with the first positioning member, and then abutting the second positioning member with the aforementioned end. Thus, the image recording material can be accurately positioned in place on the recording section. Furthermore, even if the fitting portion (which is used to determine the positioning along the cylindrical axis direction of the recording section) in the image recording material is initially dislocated from the first positioning member, the image recording material rotates as the first positioning member gradually fits into the fitting portion, until the first positioning member fits substantially completely in the fitting portion and the second positioning member abuts with the aforementioned end. In other words, by first fitting the positioning member (for determining the positioning along the cylindrical axis direction of the recording section), it is possible to accurately position the image recording material in place on the recording section.

The punching section and the transportation section may be disposed in such a manner that a punching reference line, on which the end of the image recording material is aligned when the fitting portion forming section forms the fitting portion, is not perpendicular to a direction in which the transportation section transports the image recording material, and wherein the transportation section may transport the image recording material in such a manner that the end of the image recording material is tilted with respect to the cylindrical axis of the recording section.

Thus, by ensuring that a punching reference line on which the aforementioned end of the image recording material is aligned at the time of punching constitutes a predetermined angle with the direction in which the transportation section transports the image recording material, the transportation section can easily transport the image recording material onto the recording section while keeping the end of the image recording material tilted.

The recording section and the transportation section may be disposed in such a manner that the cylindrical axis of the recording section is not perpendicular to a direction in which the transportation section transports the image recording material, and wherein the transportation section may transport the image recording material in such a manner that the end of the image recording material is tilted with respect to the cylindrical axis of the recording section.

Thus, by ensuring that the cylindrical axis of the recording section constitutes a predetermined angle with the direction in which the transportation section transports the image recording material, the transportation section can easily transport the image recording material onto the recording section while retaining the predetermined angle between the end of the image recording material tilted and the cylindrical axis of the recording section.

Each of the first and second positioning members may be a positioning pin having a radius r, and the first and second positioning members may be disposed at the distance of r from each other along a circumferential direction of the cylindrical outer surface, and wherein the fitting portion may be a semicircular notch having the radius r.

Thus, the end of the image recording material can be easily positioned in accordance with the cylindrical axis direction of the recording section. Moreover, the fitting portion in the image recording material and the positioning members fixed on the recording section can be easily provided.

The cylindrical outer surface scanning apparatus may further comprise a transportation section for transporting the image recording material having been punched by the punching section onto the recording section, wherein the recording section may rotate around the cylindrical axis of the recording section, and wherein, when transporting the image recording material having been punched by the punching section onto the recording section, the transportation section may transport the image recording material in such a manner that the end of the image recording material is tilted with respect to the cylindrical axis of the recording section, and the image recording material may be positioned in place on the recording section by fitting the first positioning member in the fitting portion formed in the image recording material and thereafter abutting the third positioning member with the end of the image recording material.

Thus, the transportation section transports the image recording material in such a manner that the end of the image recording material is tilted with respect to the cylindrical axis of the recording section. Therefore, since the image recording material is positioned by first fitting the fitting portion (for determining the positioning along the cylindrical axis direction of the recording section) with the first positioning member and then abutting the third positioning member with the aforementioned end (for determining the positioning along the circumferential direction), the image recording material can be accurately positioned in place on the recording section. Furthermore, even if the fitting portion formed in the image recording material is initially dislocated from the first positioning member (which is used for determining the positioning along the cylindrical axis direction of the recording section), the image recording material rotates as the first positioning member gradually fits into the fitting portion, until the first positioning member fits substantially completely in the fitting portion and the third positioning member abuts with the aforementioned end. In other words, by first fitting the positioning member (for determining the positioning along the cylindrical axis direction of the recording section), it is possible to accurately position the image recording material in place on the recording section.

The punching section and the transportation section may be disposed in such a manner that a punching reference line, on which the end of the image recording material is aligned when the fitting portion forming section forms the fitting portion, is not perpendicular to a direction in which the transportation section transports the image recording material, and wherein the transportation section may transport the image recording material in such a manner that the end of the image recording material is tilted with respect to the cylindrical axis of the recording section. Alternatively, the recording section and the transportation section may be disposed in such a manner that the cylindrical axis of the recording section is not perpendicular to a direction in which the transportation section transports the image recording material, and wherein the transportation section may transport the image recording material in such a manner that the end of the image recording material is tilted with respect to the cylindrical axis of the recording section.

Each of the first and third positioning members may be a positioning pin having a radius r, and the first and second positioning members may be disposed at the distance of r from each other along a circumferential direction of the cylindrical outer surface, and wherein the fitting portion may be a semicircular notch having the radius r.

The cylindrical outer surface scanning apparatus may further comprise: a punching section for punching the image recording material to specify where on the recording section the image recording material is to be mounted; and a transportation section for transporting the image recording material having been punched by the punching section onto the recording section, wherein the punching section at least includes: the first non-contacting portion forming section; a first fitting portion forming section for forming a first fitting portion in the image recording material such that the first fitting portion fits with the first positioning member; and a second fitting portion forming section for forming a second fitting portion in the image recording material such that the second fitting portion fits with the third positioning member, wherein the recording section may rotate around the cylindrical axis of the recording section, and wherein, when transporting the image recording material having been punched by the punching section onto the recording section, the transportation section may transport the image recording material in such a manner that the end of the image recording material is tilted with respect to the cylindrical axis of the recording section, and the image recording material may be positioned in place on the recording section by fitting the first positioning member in the fitting portion formed in the image recording material and thereafter fitting the third positioning member in the second fitting portion formed in the image recording material.

Thus, the transportation section transports the image recording material in such a manner that the end of the image recording material is tilted with respect to the cylindrical axis of the recording section. Therefore, since the image recording material is positioned by first fitting the fitting portion (for determining the positioning along the cylindrical axis direction of the recording section) with the first positioning member and then abutting the third positioning member with the second fitting portion (for determining the positioning along the circumferential direction), the image recording material can be accurately positioned in place on the recording section. Furthermore, even if the fitting portion formed in the image recording material is initially dislocated from the first positioning member (which is used for determining the positioning along the cylindrical axis direction of the recording section), the image recording material rotates as the first positioning member gradually fits into the fitting portion, until the first positioning member fits substantially completely in the fitting portion and the third positioning member abuts with the second fitting portion. In other words, by first fitting the positioning member (for determining the positioning along the cylindrical axis direction of the recording section), it is possible to accurately position the image recording material in place on the recording section.

Each of the first and third positioning members may be a positioning pin having a radius r, and the first and third positioning members may be aligned in a direction parallel to the cylindrical axis of the recording section, and wherein the first fitting portion may be a semicircular notch having the radius r.

The cylindrical outer surface scanning apparatus may further comprise: a clamp section disposed on the cylindrical outer surface of the recording section for pinching the end of the image recording material against the cylindrical outer surface of the recording section to stabilize the image recording material on the recording section; and a transportation section for transporting the image recording material with the fitting portion into the clamp section on the recording section, wherein the recording section rotates around the cylindrical axis of the recording section, wherein the first positioning member includes a tilted portion presenting a tilt toward a direction in which the transportation section transports the image recording material, such that the fitting portion formed in the image recording material is fitted with the tilted portion when positioning the image recording material in place on the recording section, and wherein, the transportation section may transport the image recording material with the fitting portion into the clamp section in such a manner the tilted portion of the first positioning member fits in the fitting portion, and wherein the clamp section may stabilize on the recording section the image recording material having been transported by the transportation section so that the tilted portion of the first positioning member fits in the fitting portion.

Thus, by employing a first positioning member which includes a tilted portion with a predetermined angle toward the direction in which the image recording material is transported onto the recording section, the image recording material can be prevented from undergoing deformation when clamped on the recording section. This allows the image recording material mounted on the recording section to be in close contact with the recording section across the entire area, and an exposure process using an exposure head can be successfully carried out because all area falls in the depth of focus for an exposure head. Thus, unsatisfactory printing results such as blurred images can be precluded.

A relationship $\gamma=90°-\alpha-\beta$ may exist among: an angle $\alpha$ with which the transportation section transports the image recording material into the clamp section relative to a tangent of the cylindrical outer surface of the recording section extending through the clamp section; a tilt angle $\beta$ of the tilt of the tilted portion toward the direction in which the transportation section transports the image recording material; and an angle $\gamma$ of the image recording material existing when the fitting portion fits with the tilted portion.

Thus, the angle of the image recording material which exists when the fitting portion fits with the first positioning member is effectively reduced by the tilt angle of the tilted portion. Therefore, since the friction force against the first positioning member during clamping is reduced, the image recording material can be prevented from undergoing deformation.

The tilted portion may be constituted by a tapered portion formed in at least a portion of the first positioning member, a smaller end of the tilted portion being fixed on the cylindrical outer surface of the recording section. Thus, the aforementioned tilted portion can be easily provided by forming a tapered portion in at least a portion of the first positioning member, with a smaller end of the tilted portion being fixed on the cylindrical outer surface of the recording section.

A taper angle of the tapered portion of the first positioning member may be about 30°. Thus, by setting the taper angle of the tilted portion of the first positioning member at about 30°, the image recording material can be prevented substantially completely from undergoing deformation during clamping.

The tilted portion may be constituted by a cylindrical portion formed in at least a portion of the first positioning member, the cylindrical portion being fixed on the cylindrical outer surface of the recording section in such a manner that a central axis of the cylindrical portion is tilted toward the direction in which the transportation section transports the image recording material.

Thus, the aforementioned tilted portion can be easily provided by at least partially forming the first positioning member in a cylindrical shape, and ensuring that the central axis thereof is tilted toward the transportation section.

A tilt angle of the cylindrical portion of the first positioning member may be about 15°.

Thus, by setting the taper angle of the tilted portion of the first positioning member at about 15°, the image recording material can be prevented substantially completely from undergoing deformation during clamping.

A second aspect of the present invention is directed to a cylindrical outer surface scanning apparatus for recording an image on an image recording material mounted thereon, comprising: a recording section having a cylindrical outer surface on which the image recording material is mounted, wherein the recording section at least includes: a first positioning member fixed on the cylindrical outer surface; a second positioning member fixed on the cylindrical outer surface and located at a first pitch from the first positioning member along a cylindrical axis direction of the recording section; and a third positioning member fixed on the cylindrical outer surface and located at a second pitch from the first positioning member along the cylindrical axis direction, so that the third positioning member is further away from the first positioning member than the second positioning member, the second pitch being greater than the first pitch, wherein the cylindrical outer surface scanning apparatus further comprises a non-contacting portion forming section for forming a non-contacting portion in the image recording material to prevent the third positioning member from coming in contact with the image recording material when the image recording material is mounted and positioned in place on the recording section by the first and second positioning members.

Thus, according to the second aspect, an image recording material is positioned in place by using the first and second positioning members fixed on the recording section. Since the third positioning member, which is not used for positioning in this case, is prevented from being in contact with the image recording material, the image recording material can be stably positioned in place on the recording section The cylindrical outer surface scanning apparatus may further comprise: a punching section for punching the image recording material to specify where on the recording section the image recording material is to be mounted; and a transportation section for transporting the image recording material having been punched by the punching section onto the recording section, wherein the punching section at least includes: the non-contacting portion forming section; a first fitting portion forming section for forming a first fitting portion in the image recording material such that the first fitting portion fits with the first positioning member; and a second fitting portion forming section for forming a second fitting portion in the image recording material such that the second fitting portion fits with the second positioning member, wherein the recording section rotates around the cylindrical axis of the recording section, and wherein, when transporting the image recording material having been punched by the punching section onto the recording section, the transportation section transports the image recording material in such a manner that the end of the image recording material is tilted with respect to the cylindrical axis of the recording section, and the image recording material is positioned in place on the recording section by fitting the first positioning member in the first fitting portion formed in the image recording material and thereafter fitting the second positioning member in the second fitting portion formed in the image recording material.

Thus, the transportation section transports the image recording material in such a manner that the end of the image recording material is tilted with respect to the cylindrical axis of the recording section. As a result, the image recording material is positioned along the circumferential direction by first fitting the fitting portion (which is used to determine the positioning along the cylindrical axis direction of the recording section) with the first positioning member, and then fitting the second positioning member in the second fitting portion. Thus, the image recording material can be accurately positioned in place on the recording section. Furthermore, even if the fitting portion (which is used to determine the positioning along the cylindrical axis direction of the recording section) in the image recording material is initially dislocated from the first positioning member, the image recording material rotates as the first positioning member gradually fits into the first fitting portion, until the first positioning member fits substantially completely in the first fitting portion and the second positioning member fits in the second fitting portion. In other words, by first fitting the positioning member (for determining the positioning along the cylindrical axis direction of the recording section), it is possible to accurately position the image recording material in place on the recording section.

Each of the first and second positioning members may be a positioning pin having a radius r, and the first and third positioning members may be aligned in a direction parallel to the cylindrical axis of the recording section, and wherein the first fitting portion may be a semicircular notch having the radius r.

A third aspect of the present invention is directed to a cylindrical outer surface scanning apparatus for recording an image on an image recording material mounted thereon, at least one fitting portion being formed in an end of the image recording material, comprising: a recording section having a cylindrical outer surface on which the image recording material is mounted, and rotating around a cylindrical axis of the recording section; and a transportation section for transporting the image recording material onto the recording section, with the end having the fitting portion therein first, wherein the recording section includes: a first positioning member fixed on the cylindrical outer surface, such that the first positioning member fits in the fitting portion formed in the image recording material for positioning the image recording material in place; and a second positioning member fixed on the cylindrical outer surface and located at a first pitch from the first positioning member along the cylindrical axis direction, wherein, when transporting the image recording material onto the recording section, the transportation section transports the image recording material in such a manner that the end of the image recording material is tilted with respect to the cylindrical axis of the recording section, and the image recording material is positioned in place on the recording section by fitting the first positioning member in the fitting portion formed in the image recording material and thereafter abutting the second positioning member with the end of the image recording material.

Thus, the transportation section transports the image recording material in such a manner that the end of the image recording material having a prefabricated fitting portion is tilted with respect to the cylindrical axis of the recording section. As a result, the image recording material is positioned along the circumferential direction by first fitting the fitting portion (which is used to determine the positioning along the cylindrical axis direction of the recording section) with the first positioning member, and then abutting another positioning member with the aforementioned end. Thus, the image recording material can be accurately positioned in place on the recording section. Furthermore, even if the fitting portion (which is used to determine the positioning along the cylindrical axis direction of the recording section) in the image recording material is initially dislocated from the first positioning member, the image recording material rotates as the first positioning member gradually fits into the fitting portion, until the first positioning member fits substantially completely in the fitting portion and the other positioning member abuts with the aforementioned end. In other words, by first fitting the positioning member (for determining the positioning along the cylindrical axis direction of the recording section), it is possible to accurately position the image recording material in place on the recording section.

A fourth aspect of the present invention is directed to a cylindrical outer surface scanning apparatus for recording an image on an image recording material mounted thereon, at least one fitting portion being formed in an end of the image recording material, comprising: a recording section having a cylindrical outer surface on which the image recording material is mounted, and rotating around a cylindrical axis of the recording section; a clamp section disposed on the cylindrical outer surface of the recording section for pinching the end of the image recording material against the cylindrical outer surface of the recording section to stabilize the image recording material on the recording section; a transportation section for transporting the image recording material into the clamp section on the recording section; and at least one positioning member fixed on the cylindrical outer surface of the recording section, having a tilted portion tilted toward a direction in which the transportation section transports the image recording material, such that the tilted portion fits in the fitting portion formed in the image recording material for positioning the image recording material in place on the recording section, wherein, when transporting the image recording material with the fitting portion into the clamp section, the transportation section transports the image recording material in such a manner that the tilted portion of the positioning member fits in the fitting portion, and wherein the clamp section stabilizes on the recording section the image recording material having been transported by the transportation section so that the tilted portion of the positioning member fits in the fitting portion.

Thus, according to the fourth aspect, by employing a positioning member which includes a tilted portion with a predetermined angle toward the direction in which the image recording material is transported onto the recording section, the image recording material having a prefabricated fitting portion can be prevented from undergoing deformation when clamped on the recording section. This allows the image recording material mounted on the recording section to be in close contact with the recording section across the entire area, and an exposure process using an exposure head can be successfully carried out because all area falls in the depth of focus for an exposure head. Thus, unsatisfactory printing results such as blurred images can be precluded.

A fifth aspect of the present invention is directed to a cylindrical outer surface scanning method for recording an image on an image recording material mounted on a cylindrical outer surface, comprising: a mounting step of mounting the image recording material on the cylindrical outer surface, wherein the mounting step further comprises a positioning step of positioning the image recording material in place on the cylindrical outer surface by selectively employing: a first positioning member fixed on the cylindrical outer surface; a second positioning member fixed on the cylindrical outer surface and located at a first pitch from the first positioning member along a cylindrical axis direction of cylindrical outer surface; and a third positioning member fixed on the cylindrical outer surface and located at a second pitch from the first positioning member along the cylindrical axis direction, so that the third positioning member is further away from the first positioning member than the second positioning member, the second pitch being greater than the first pitch, wherein the cylindrical outer surface scanning method further comprises: a non-contacting portion forming step of forming a non-contacting portion in the image recording material to prevent the second positioning member from coming in contact with the image recording material when the positioning step positions the image recording material in place on the cylindrical outer surface by employing the first and third positioning members.

A sixth aspect of the present invention is directed to a cylindrical outer surface scanning method for recording an image on an image recording material mounted on a cylindrical outer surface, comprising: a mounting step of mounting the image recording material on the cylindrical outer surface, wherein the mounting step further comprises a positioning step of positioning the image recording material in place on the cylindrical outer surface by selectively employing: a first positioning member fixed on the cylindrical outer surface; a second positioning member fixed on the cylindrical outer surface and located at a first pitch from the first positioning member along a cylindrical axis direction of cylindrical outer surface; and a third positioning member fixed on the cylindrical outer surface and located at a second pitch from the first positioning member along the cylindrical axis direction, so that the third positioning member is further away from the first positioning member than the second positioning member, the second pitch being greater than the first pitch, wherein the cylindrical outer surface scanning method further comprises: a non-contacting portion forming step of forming a non-contacting portion in the image recording material to prevent the third positioning member from coming in contact with the image recording material when the positioning step positions the image recording material in place on the cylindrical outer surface by employing the first and second positioning members.

These and other objects, features, aspects and advantages of the present invention will become more apparent from the following detailed description of the present invention when taken in conjunction with the accompanying drawings.

BRIEF DESCRIPTION OF THE DRAWINGS

FIG. 19 is a table illustrating the operations of the punches 44 and the statuses of the positioning pins 51 associated with the various positioning methods;

FIGS. 22A and 22B are plan views schematically illustrating manners in which the plate P may be positioned with respect to the recording drum 5;

DESCRIPTION OF THE PREFERRED EMBODIMENTS

Figure 1:
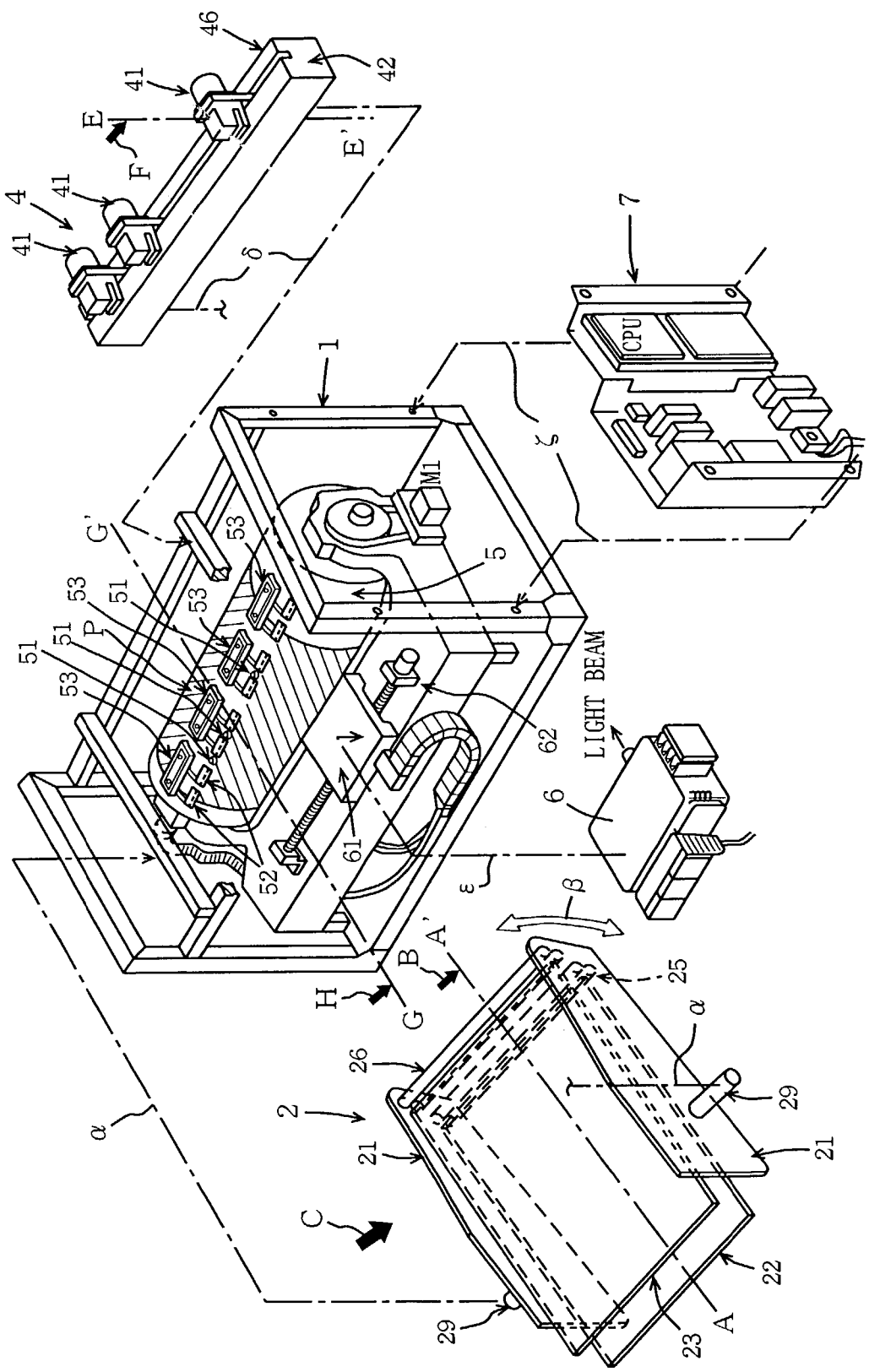
FIG. 1 is an exploded view showing a cylindrical outer surface scanning apparatus according to one embodiment of the present invention.

FIG. 1 is an exploded view showing a cylindrical outer surface scanning apparatus according to one embodiment of the present invention. The cylindrical outer surface scanning apparatus comprises a frame 1 which is in the shape of a generally rectangular solid. On the frame 1, a storage/transportation mechanism 2, a drive mechanism (not shown; see 3 in FIGS. 3 and 4), a punch unit 4, a recording drum 5, an exposure head 6, and an electrical circuitry section 7 are mounted. For clarity, the drive mechanism is not shown in FIG. 1.

Figure 2:
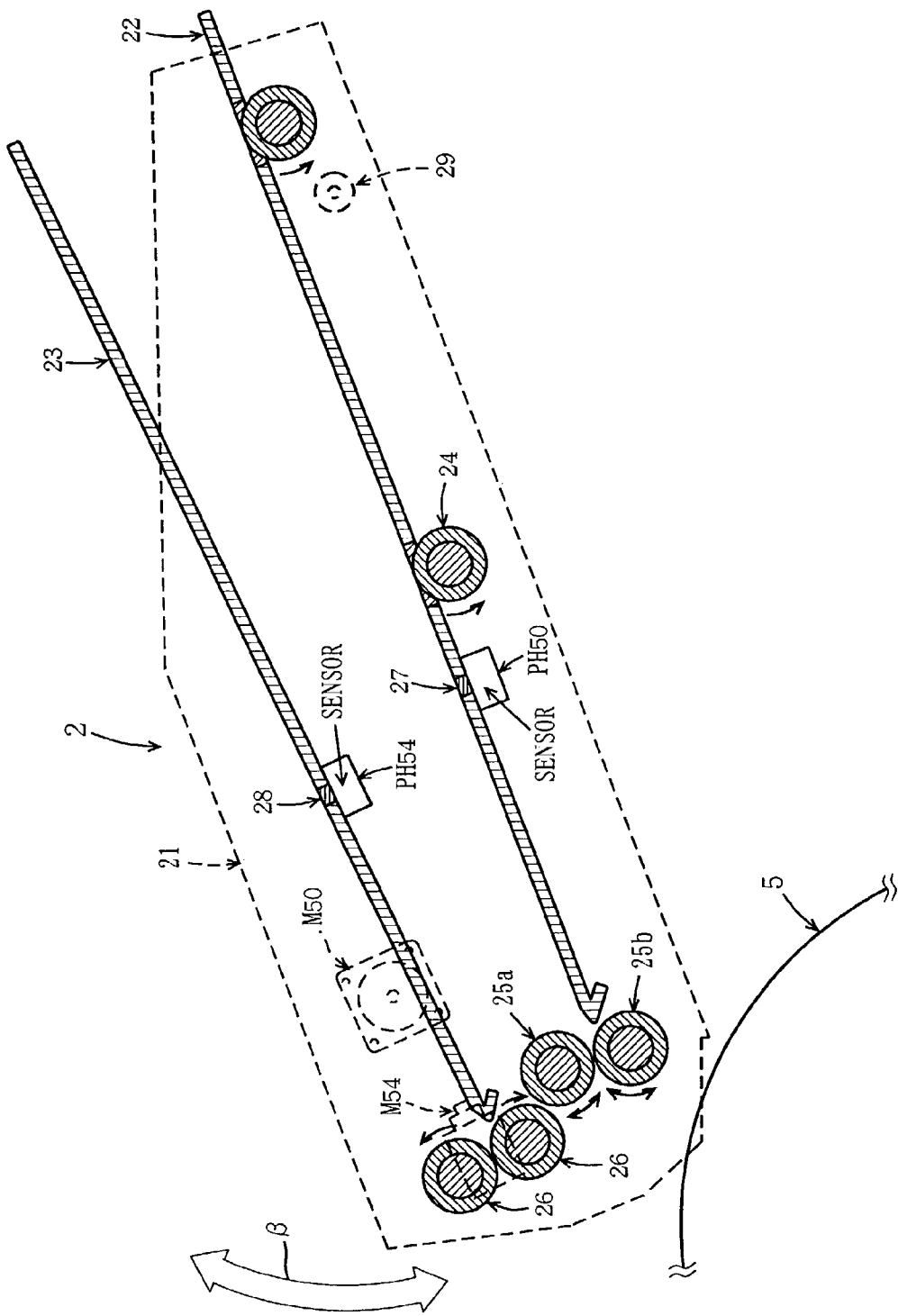
FIG. 2 is a cross-sectional view of a storage/transportation mechanism 2, taken at a dash-dot line A-A' and as seen in the direction of arrow B in FIG. 1.

FIG. 2 is a cross-sectional view of the storage/transportation mechanism 2, taken at a dash-dot line A-A' and as seen in the direction of arrow B in FIG. 1. Note that not all of the component elements shown in FIG. 2 are shown in FIG. 1. As shown in FIGS. 1 and 2, the storage/transportation mechanism 2 comprises: two trays 22 and 23 which are fixed by being interposed between two side plates 21; a feed roller 24; a pair of transportation rollers 25 for loading purposes; and a pair of transportation rollers 26 for unloading purposes. Thus, by means of the two side plates 21, the two trays 22 and 23 are held together in an integral manner, so that the tray 23 comes generally above the tray 22. Since the tray 23 comes generally above the tray 22, the tray 23 will hereinafter be referred to as an "upper tray 23", and the tray 22 as a "lower tray 22".

The feed roller 24 is a roller for transporting an image recording material (hereinafter referred to as a "plate") which is accommodated in the lower tray 22 in the direction of the transportation rollers 25. The pair of transportation rollers 25, and the pair of transportation rollers 26, are disposed in the manner of a bridge astride one of the side plates 21 and the other side plate 21. The pair of transportation rollers 25 are disposed in the neighborhood of the leading end of the lower tray 22, in such a manner that the two rollers abut each other from above and from below. The upper transportation roller 25a can be driven to move up and down by means of a transportation roller up/down drive (not shown). Furthermore, the pair of transportation rollers 26 are disposed in the neighborhood of the leading end of the upper tray 23, in such a manner that two rollers abut each other. The feed roller 24 and the transportation rollers 25 are coupled via a belt (not shown) to a motor M50 which is fixed on one of the side plates 21, so as to be rotated by a driving force generated by the motor M50. The transportation rollers 26 are coupled via a belt (not shown) to a motor M54 which is fixed on one of the side plates 21, so as to be rotated by a driving force generated by the motor M54.

Small holes 27 and 28 are formed in predetermined positions of the lower tray 22 and the upper tray 23. Sensors PH50 and PH54 are fixed immediately under the small holes 27 and 28, respectively. The sensors PH50 and PH54 detect whether or not a plate is present above the small holes 27 and 28.

Figure 3:
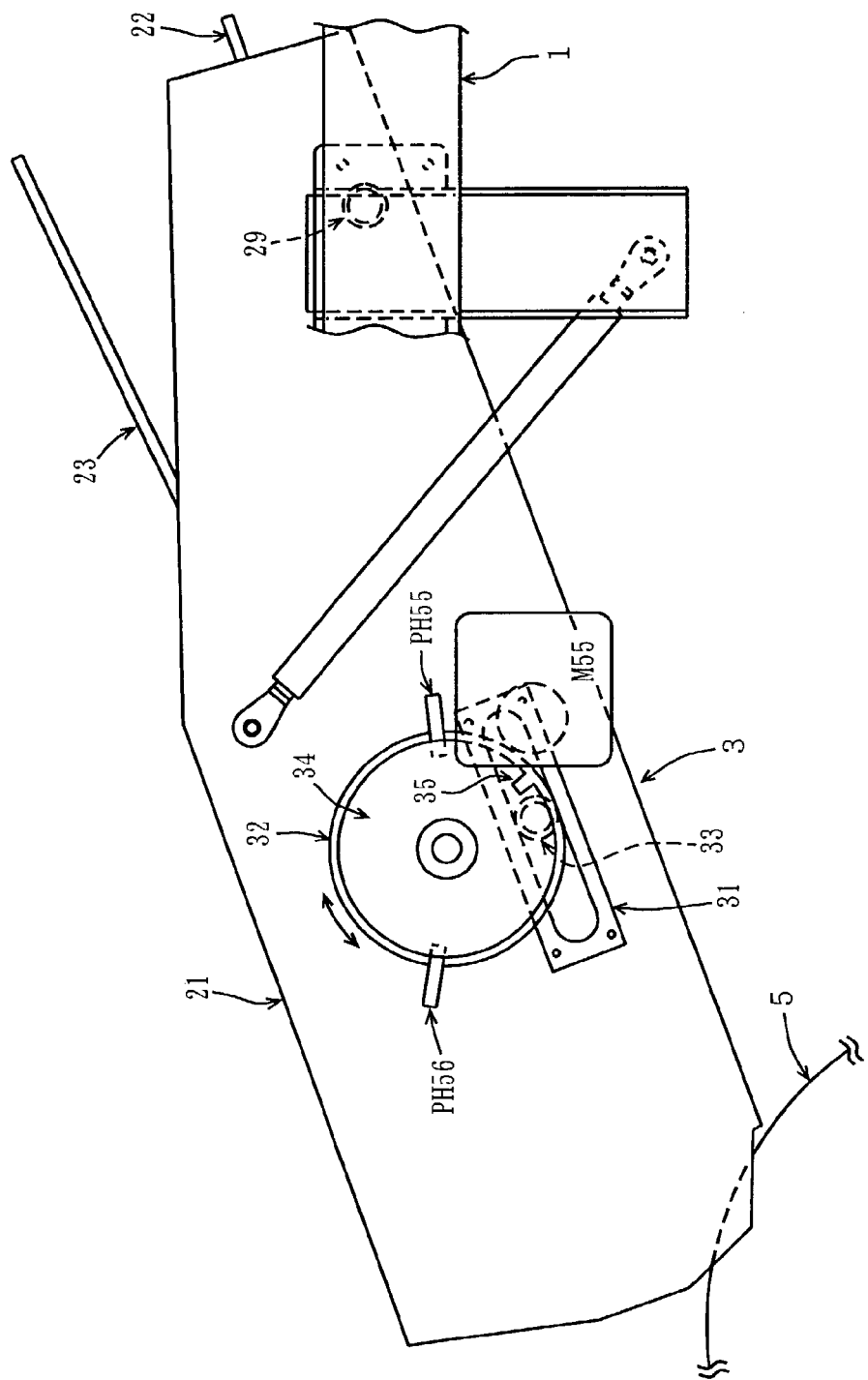
FIG. 3 is a view showing a drive mechanism 3 as seen in the direction of arrow C in FIG. 1.
Figure 4:
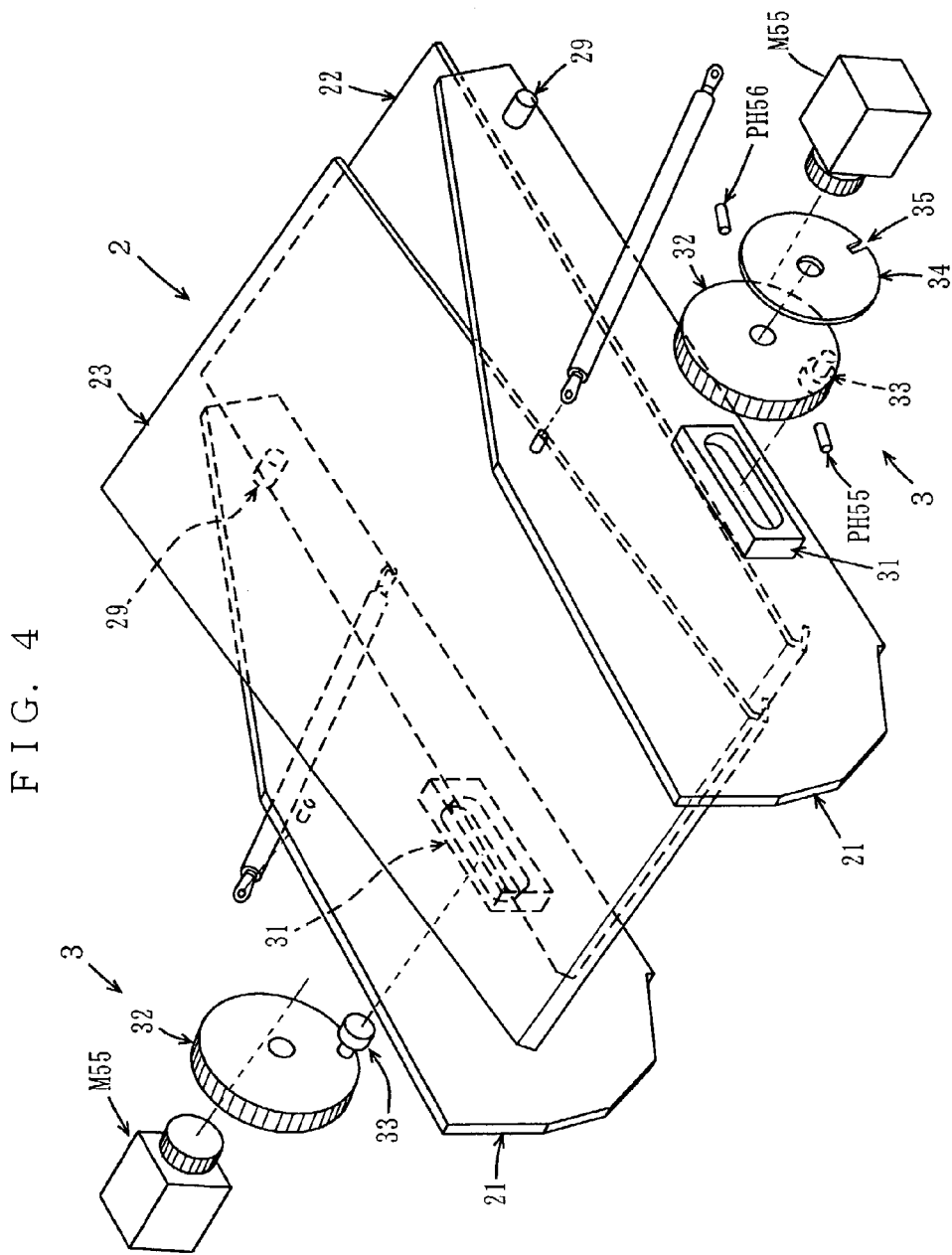
FIG. 4 is an exploded view of the drive mechanism 3 shown in FIG. 3.

The storage/transportation mechanism 2 having the above structure is fixed in an upper portion of the frame 1 as indicated by a dash-dot arrow α in FIG. 1, so as to be capable of rotating within a predetermined range (see arrow β in FIGS. 1 and 2) around a center of rotation defined by a rotation axis 29 protruding outward from the two side plates 21. The drive mechanism 3 realizes the rotation of the storage/transportation mechanism 2. FIG. 3 is a view showing the drive mechanism 3 as seen in the direction of arrow C in FIG. 1. FIG. 4 is an exploded view of the drive mechanism 3 shown in FIG. 3.

In FIGS. 3 and 4, the drive mechanism 3 comprises a pair of cam follower guides 31, a pair of motors M55, a pair of cam gears 32, and a pair of cam followers 33, and at least one sensor detection plate 34, at least one sensor PH55, and at least one PH56. Each cam follower guide 31 has an outer shape of a rectangular solid, with elongated-circular through holes being formed in the rectangular solid. The cam follower guides 31 are fixed on the side plates 21, one on each side plate, in such a manner that the two through holes oppose each other with the storage/transportation mechanism 2 generally interposed therebetween (see FIG. 4). The motors M55 are disposed in the neighborhood of the respective side plates 21 so as to oppose each other, with the storage/transportation mechanism 2 interposed therebetween, and fixed on the frame 1. The cam gears 32 are fixed on the frame 1 so as to face the respective side plates 21, in such a manner that each cam gear 32 is capable of rotating around its axis with a driving force generated by the corresponding motor M55. Each cam follower 33, which is fixed at the outer edge of a face of the corresponding cam gear 32 facing the side plate 21, rotates in a circular motion around the axis of the cam gear 32. Each cam follower 33 has a disk shape with a diameter substantially identical to the shorter width of the through hole in the cam follower guide 31, so that the cam follower 33 is received in the through hole as indicated by a dash-dot arrow D in FIG. 4. As a result, each cam follower guide 31 and the corresponding cam gear 32 are coupled by means of the cam follower 33, whereby the storage/transportation mechanism 2 is supported by the drive mechanism 3.

Each disk-shaped sensor detection plate 34, which is disposed concentrically with the corresponding cam gear 32, rotates along with the cam gear 32. A slit 35 is formed in the outer periphery of each sensor detection plate 34. The sensors PH55 and PH56 are fixed on the frame 1 in such a manner as to be capable of detecting the slit 35 formed in the corresponding rotating sensor detection plate 34.

Figure 5A:
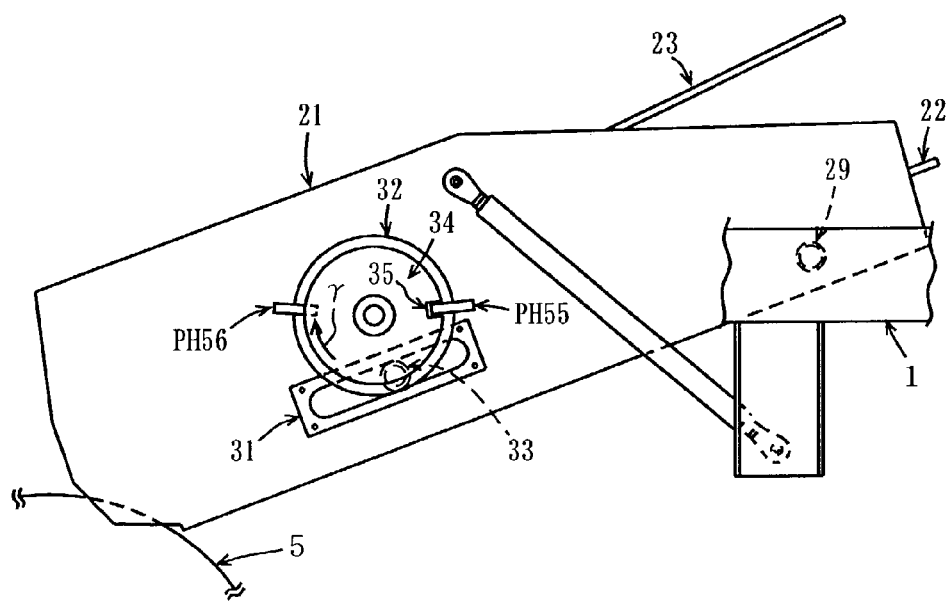
FIGS. 5A and 5B are diagrams for illustrating the operation of the drive mechanism 3 shown in FIGS. 3 and 4.

Now, the operation of the drive mechanism 3 having the above structure will be described with reference to FIGS. 5A and 5B. For clarity, the motor M55 is not shown in FIGS. 5A and 5B. In FIG. 5A, the slit 35 in the sensor detection plate 34 is being detected by the sensor PH55 because the slit 35 is situated immediately above the sensor PH55. When the slit 35 is being detected by the sensor PH55, each cam follower 33 is situated in the vicinity of the lowermost end of the circular motion thereof. Therefore, the storage/transportation mechanism 2 is being supported by the drive mechanism 3 at a position (hereinafter referred to as a "lower position") corresponding to the vicinity of the lowermost end of the circular motion of each cam follower 33. In this situation, as each cam gear 32 begins to rotate in a direction indicated by arrow γ due to a driving force generated by the corresponding motor M55, the corresponding cam follower 33 begins a circular motion in that direction, i.e., in an upper direction from the vicinity of the lowermost end of the circular motion of each cam follower 33. As a result, each cam follower 33 causes the storage/transportation mechanism 2, on which the corresponding cam follower guide 31 is fixed, to move in the upper direction from the lower position.

Figure 5B:
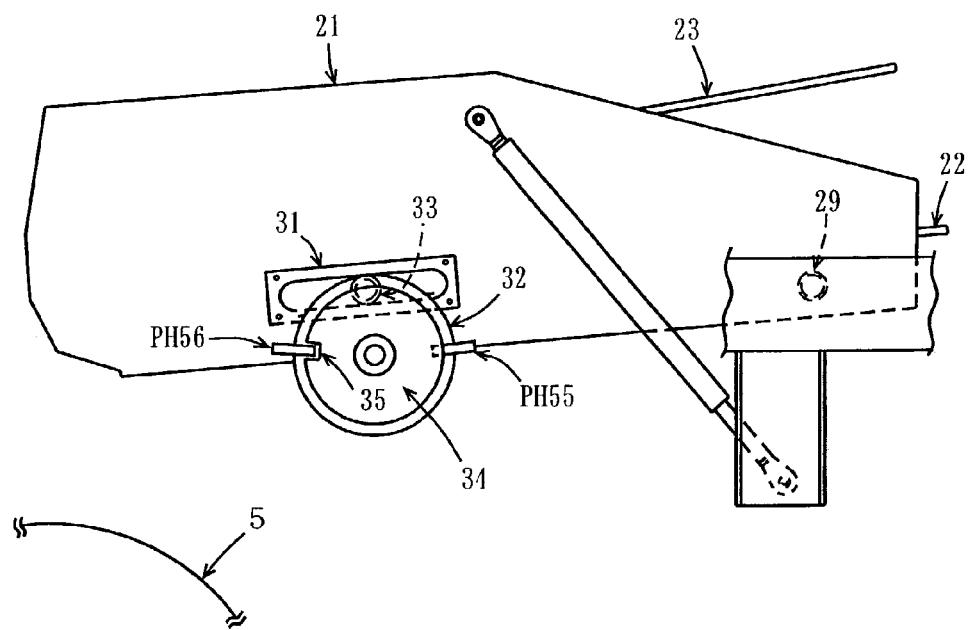

As shown in FIG. 5B, the rotation of the cam gear 32 causes the slit 35 in the sensor detection plate 34 to move in a circular motion in the direction of arrow γ from the position immediately above the sensor PH55, until the slit 35 comes immediately above the sensor PH56. The sensor PH56 detects the slit 35 situated immediately above the sensor PH56. When the slit 35 is detected by the sensor PH56, the motor M55 stops the generation of the driving force. As a result, each cam follower 33 is situated in the vicinity of the uppermost end of the circular motion of each cam follower 33, and the storage/transportation mechanism 2 is halted at a position (hereinafter referred to as a "upper position") corresponding to the vicinity of the uppermost 46 in the attachment member 42, the punchers 41 may be affixed by means of knock holes, bolt holes, and the like. The punch unit 4 having the above structure is fixed on the frame 1, as indicated by a dash-dot arrow δ in FIG. 1.

Figure 7:
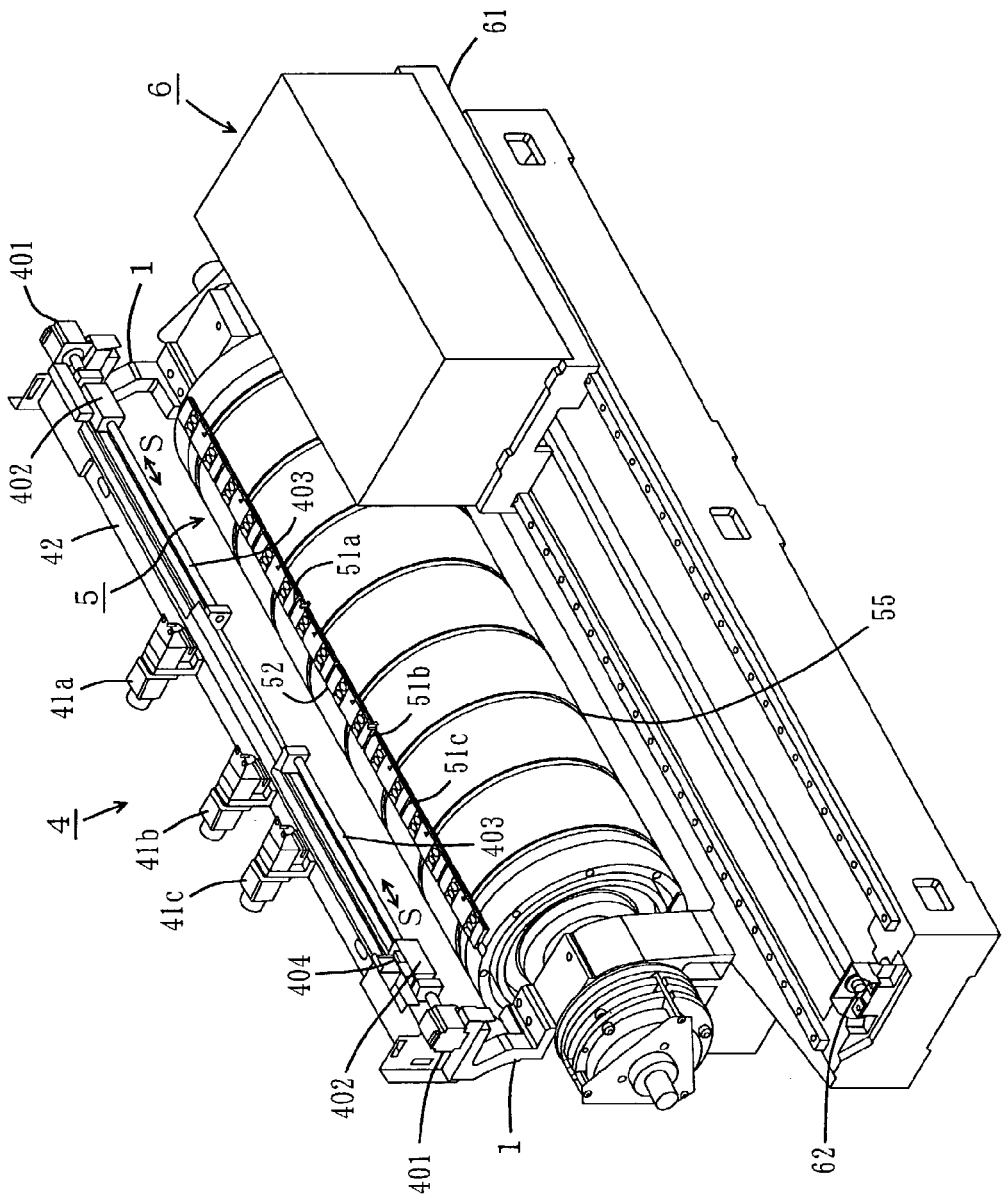
FIG. 7 is a perspective view showing the punch unit 4 and the recording drum 5 shown in FIG. 1 as well as the vicinity thereof.

FIG. 7 is a perspective view showing the punch unit 4, the recording drum 5, and the exposure head 6, which are fixed to the frame 1 in the above-described manners. For clarity, the storage/transportation mechanism 2, the drive mechanism 3, and the electrical circuitry section 7 are omitted from FIG. 7. Although positioning punchers for punching holes used in conjunction with a printing machine may also be mounted on the punch unit 4, only the positioning punchers 41 for punching holes used in conjunction with the recording drum are illustrated for conciseness.

As shown in FIG. 7, three punchers 41a, 41b, and 41c are fixed on the attachment member 42. The puncher 41a is used for punching a reference notch, whereas the punchers 41b and 41c are used for punching non-contacting notches (the specific positions and shapes of these notches will be described later). At opposite ends of the front face of the attachment member 42, centering motors 401 are fixed. The centering motors 401 respectively drive a pair of ball screws 403, which extend in the horizontal direction along the front face of the attachment member 42 and which are capable of rotating. A centering bearing 402 is in screw-engagement with each ball screw 403. On an upper face end of the circular motion of each cam follower 33 while being supported by the drive mechanism 3. Through the above operation of the drive mechanism 3, the storage/transportation mechanism 2 moves up and down between its lower position and upper position.

Figure 6:
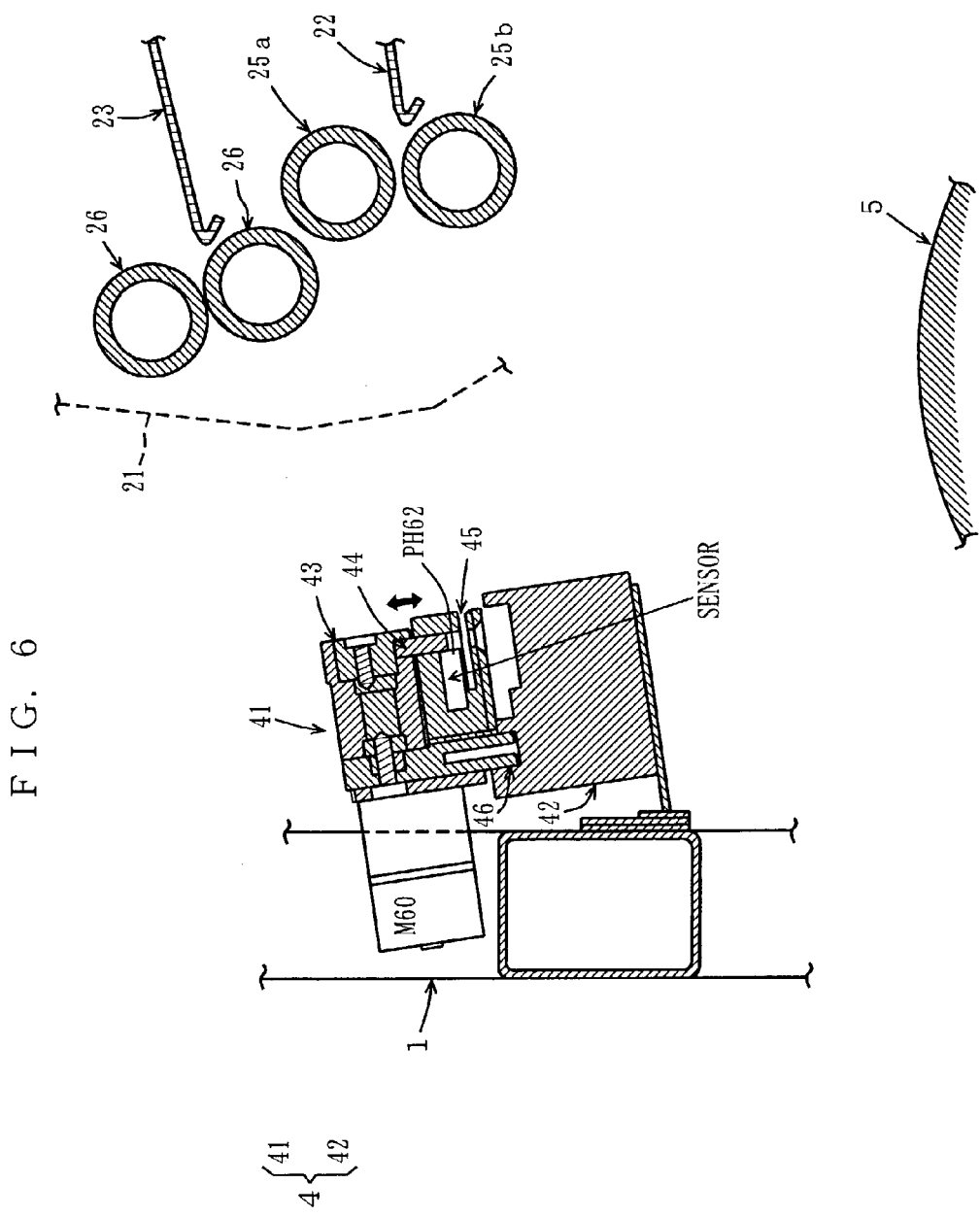
FIG. 6 is a cross-sectional view showing a punch unit 4, taken at a dash-dot line E-E' in FIG.1 and seen in the direction of arrow F.

Next, the punch unit 4 shown in FIG. 1 will be described. FIG. 6 is a cross-sectional view showing the punch unit 4, taken at a dash-dot line E-E' in FIG. 1 and seen in the direction of arrow F. As shown in FIG. 1, the punch unit 4 includes at least three punchers 41 and an attachment member 42. As shown in FIG. 6, each puncher 41 includes a main body 43, a sensor PH62, motor M60, and a punch 44. The main body 43 has an inlet 45 formed therein. A plate which comes transported along a first supply path line (described later) is inserted in the inlet 45. The sensor PH62 detects whether or not a plate has been inserted in the inlet 45. Upon detection of a plate by the sensor PH62, the motor M60 generates a driving force, which is converted to a force for moving the punch 44 up and down by means of a cam mechanism (not shown) within the main body. The punch 44 moves up and down due to the force which has been transmitted from the cam mechanism, so as to punch a hole in the plate which is placed in the inlet 45. As a result, a punch hole and/or a notch is formed at one end of the plate. The attachment member 42 has the shape of a generally rectangular solid. A groove 46 is formed along a longitudinal direction of the attachment member 42. The respective punchers 41 are attached in the groove 46. In stead of forming the groove of each centering bearing 402, a cylindrical retention member 404 capable of rotating is provided (note that one of the retention members 404 is not shown in FIG. 7). Thus, as the centering motors 401 are run, the centering bearings 402 move in an S direction shown in FIG. 7.

When the plate is introduced into the punch unit 4, the plate is placed between the pair of centering bearings 402. When the centering motors 401 are run so as to move the pair of centering bearings 402 toward the center from predetermined original positions, the outer surfaces of the retention members 404 on the centering bearing 402 abut the end faces of the plate on both sides, thereby positioning the plate in the center of the attachment member 42 (hence, this mechanism will be referred to as a "centering mechanism").

Figure 8:
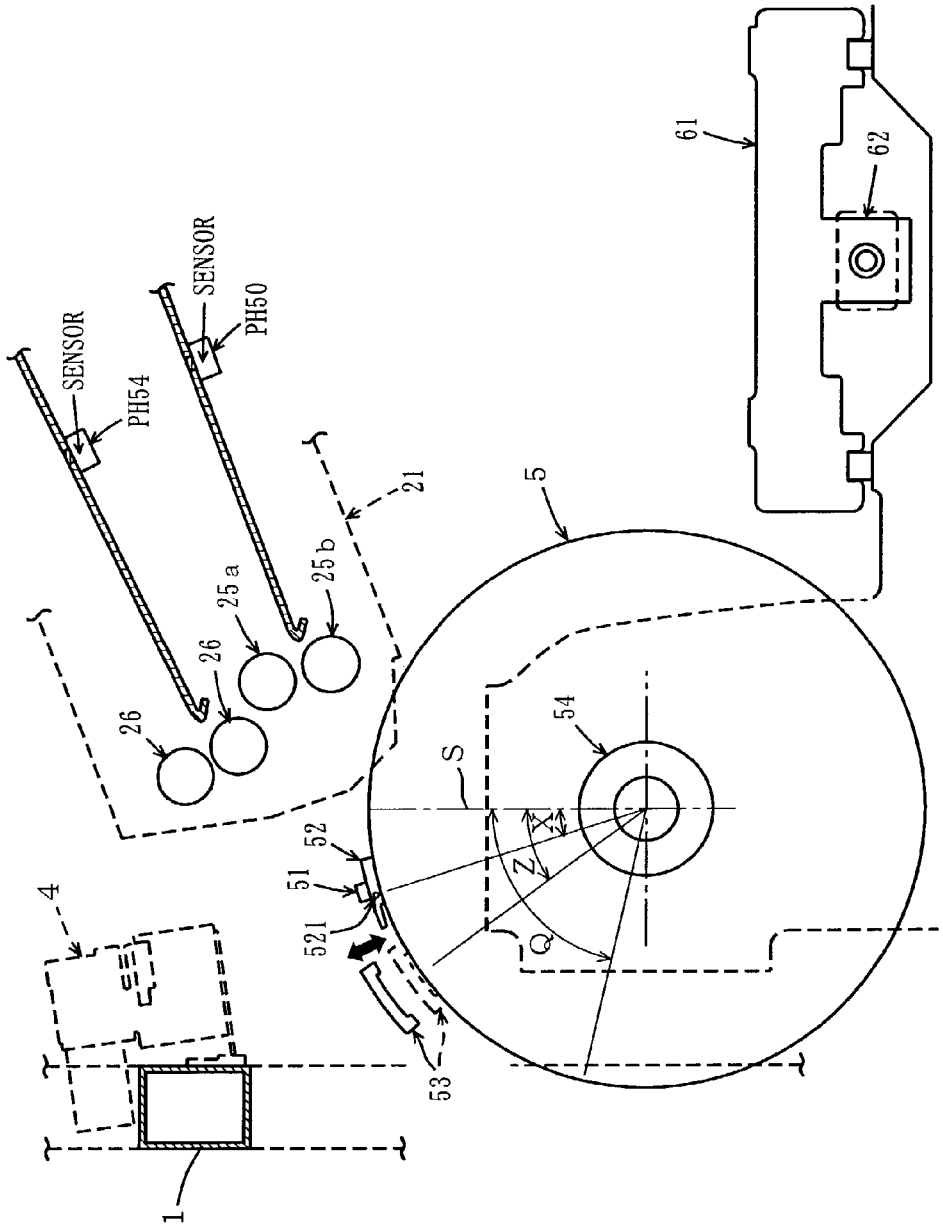
FIG. 8 is a cross-sectional view showing the recording drum 5, taken at a dash-dot line G-G' in FIG. 1 and as seen in the direction of arrow H.

Next, the recording drum 5 shown in FIGS. 1 and 7 will be described. FIG. 8 is a cross-sectional view showing the recording drum 5, taken at a dash-dot line G-G' in FIG. 1 and as seen in the direction of arrow H. Referring to FIGS. 1, 7, and 8, the recording drum 5 is disposed within the frame 1 so that the recording drum 5 is located obliquely below the storage/transportation mechanism 2 and the punch unit 4. The recording drum 5 having a generally cylindrical shape rotates around the cylindrical axis due to a driving force generated by the motor M1. A plate P (corresponding to the portion hatched with oblique line in FIG. 1), which comes transported along a second supply path line (described later), is mounted and wound around the outer surface (annular surface) of the recording drum 5.

As a structure for stabilizing the plate P on the outer surface of the recording drum 5, the cylindrical outer surface scanning apparatus comprises at least three positioning pins 51, leading-end clamps 52, and trailing-end clamps 53. The positioning pins 51 are fixed on the outer surface of the recording drum 5 (the specific positions thereof will be described later). The positioning pins 51 are arranged so that it is possible to clamp one end (i.e., the leading end) of the plate which comes transported along the second supply path line (described later) while the positioning pin 51a fits in a notch created by the puncher 41a. The trailing-end clamp 53 is configured so as to be releasable from the outer surface of the recording drum 5. While the trailing-end clamp 53 is released from the recording drum 5, the trailing-end clamp 53 is retained by a first clamp driving section (not shown). Once attached on the recording drum 5, the trailing-end clamp 53 functions to clamp the other end (i.e., the trailing end) of the plate which comes transported along the second supply path line (described later).

The rotary encoder 54 is attached to the rotation axis of the recording drum 5 to detect various angular positions thereof. In the present cylindrical outer surface scanning apparatus, a first angular position X, a second angular position Z, a third angular position Q are previously defined. Specifically, the leading-end clamp 52 clamps at the first angular position X; the second angular position Z concerns the positioning of the trailing-end clamp 53; and the clamping of the leading-end clamp 52 is released at the third angular position Q. As shown in FIG. 8, each angular position is defined relative to a predetermined reference line S. While the recording drum 5 is in the first angular position X, the leading-end clamp 52 is driven by the first clamp driving section (not shown) to clamp the leading end of the plate. While the recording drum 5 is in the third angular position Q, the leading-end clamp 52 is driven by a second clamp driving section (not shown) to release the leading end of the plate which has been clamped. While the recording drum 5 is in the second angular position Z, the trailing-end clamp 53 may be driven by a third clamp driving section (not shown) to be attached on the outer surface of the recording drum 5 so as to clamp the trailing end of the plate. The trailing-end clamp 53 thus attached on the outer surface may be taken off the outer surface by the third clamp driving section while the recording drum 5 is in the second angular position Z, thereby releasing the trailing end of the plate. Since the first to third clamp driving sections do not constitute an essential portion of the present invention, any detailed description thereof will be omitted.

Furthermore, as a structure for keeping the plate in close contact with the outer surface of the recording drum 5, the cylindrical outer surface scanning apparatus comprises: a plurality of small holes and grooves (hereinafter referred to as "suction holes" and "suction grooves 55") provided on the outer surface of the recording drum 5 for plate suction purposes; a blower (not shown) which cooperates with the suction holes and the suction groove 55 to create a vacuum system; and squeeze rollers (not shown) disposed in the neighborhood of the recording drum 5. Since the suction holes, the suction groove 55, the blower, and the squeeze rollers do not constitute an essential portion of the present invention, any detailed description thereof will be omitted.

Next, the exposure head 6 will be described. As indicated by a dash-dot line ε in FIG. 1 and as illustrated in FIG. 7, the exposure head 6 is disposed on a table 61 which is provided in a close vicinity of the recording drum 5. While being conveyed in a direction parallel to the rotation axis of the recording drum 5 due to a driving force generated by a feed screw mechanism 62, the exposure head 6 scans the plate (which is rotating with the recording drum 5) with a light beam which has been modified based on image data supplied from the electrical circuitry section 7 (described later). Thus, an the exposure head 6 performs an exposure process to record an image on the plate P.

The electrical circuitry section 7 is attached to a side of the frame 1, as indicated by a dash-dot arrow ζ in FIG. 1. The electrical circuitry section 7 is electrically coupled with the aforementioned various component elements, so as to control the operation of the entire cylindrical outer surface scanning apparatus while exchanging signals with the respective component elements.

Next, the operation of the storage/transportation mechanism 2 and the plate P will be described with reference to FIGS. 9 to 16, which are schematic side views illustrating the operation of the storage/transportation mechanism 2 and the plate P.

Figure 9:
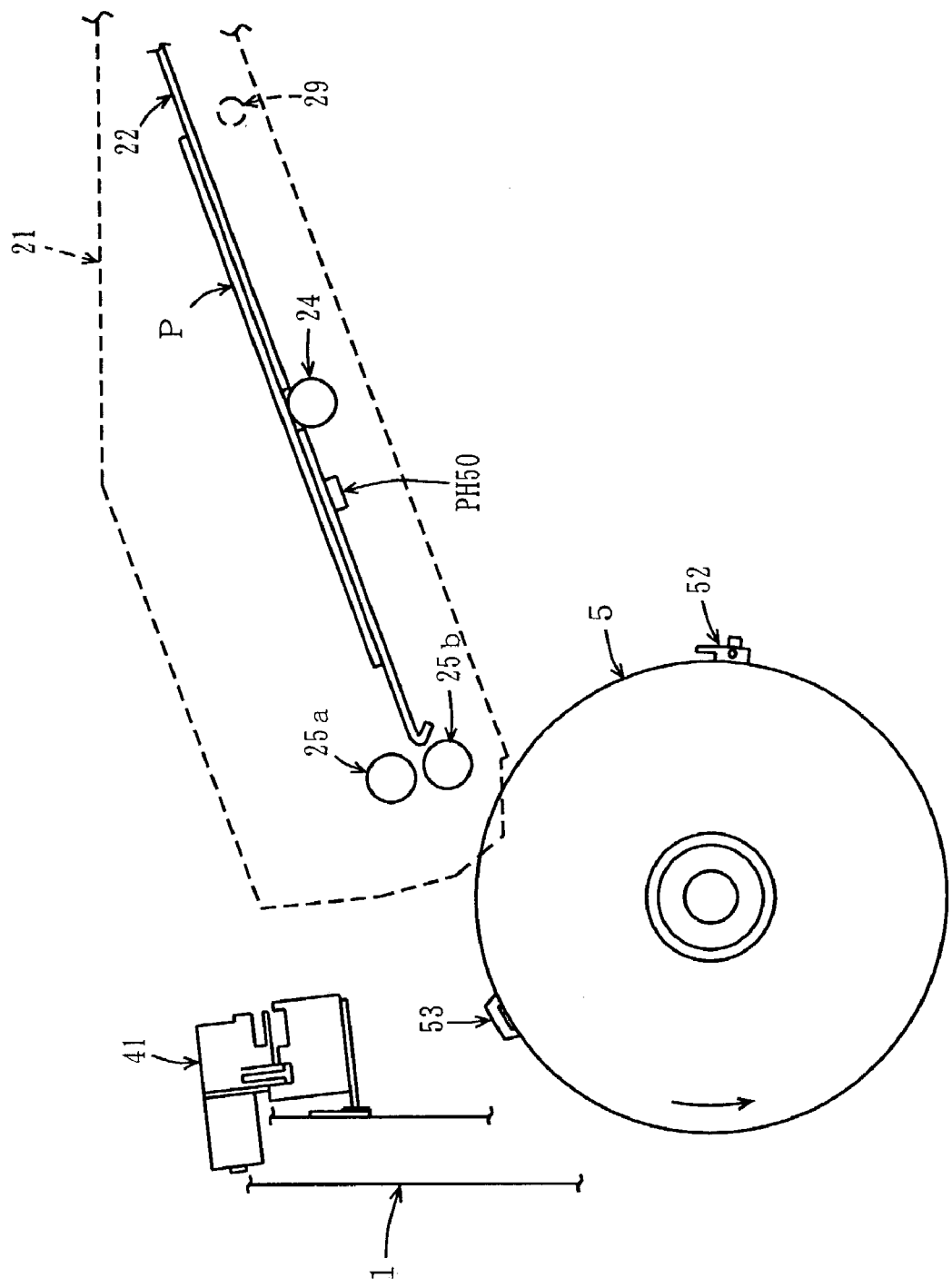
FIG. 9 is a schematic side view illustrating a plate P having been supplied in a lower tray 22 of the storage/transportation mechanism 2.
Figure 10:
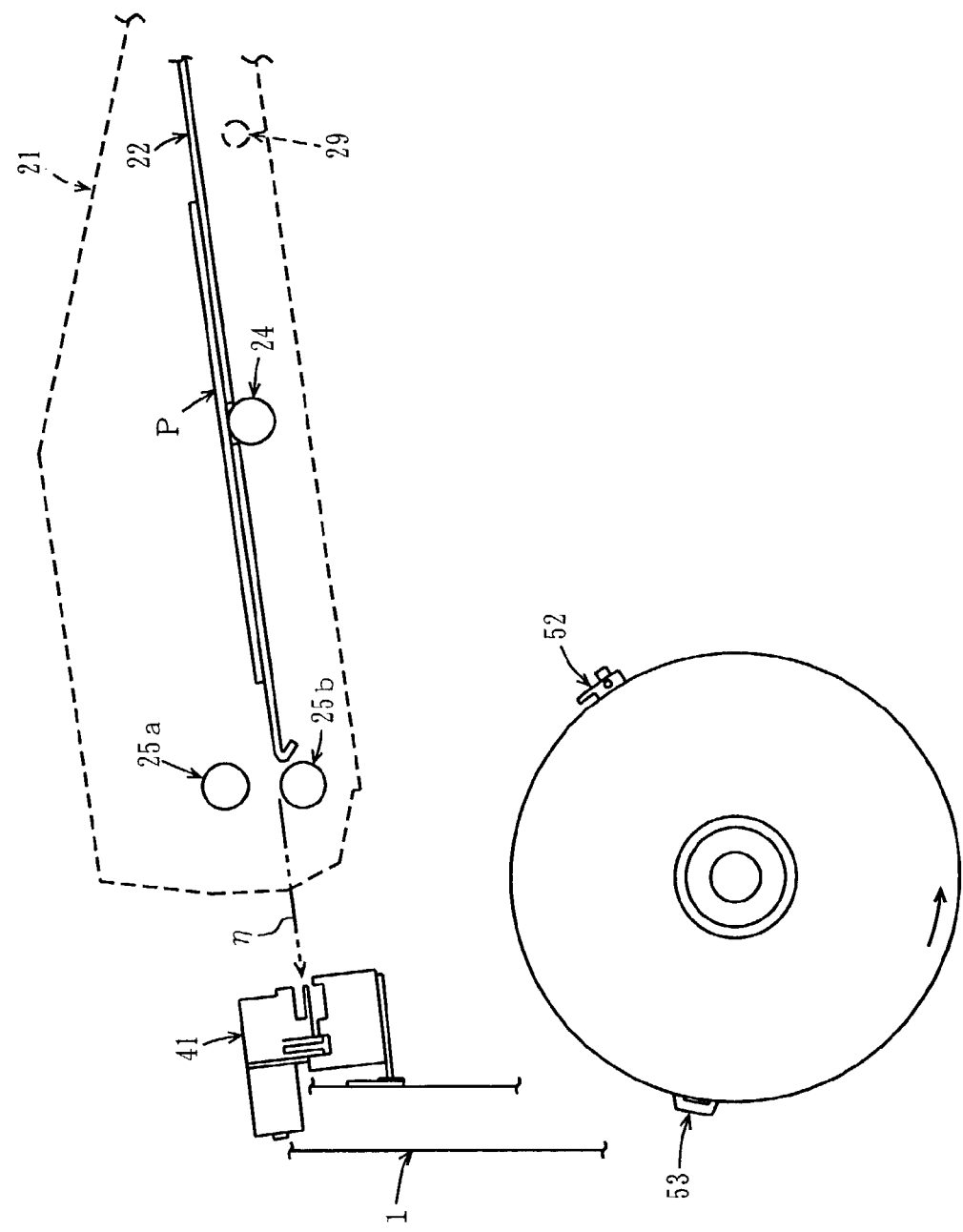
FIG. 10 is a schematic side view illustrating a first supply path line.

First, as shown in FIG. 9, a plate P to be punched is fed to the lower tray 22 of the storage/transportation mechanism 2. The plate P may be manually fed to the lower tray 22 by a human operator, or automatically fed by an automatic plate supplying mechanism (not shown) which may be additionally incorporated in the cylindrical outer surface scanning apparatus. Upon detecting that the plate P has been fed, the sensor PH50 of the storage/transportation mechanism 2 outputs a detection signal indicating the detection to the electrical circuitry section 7. Upon receiving the detection signal, the electrical circuitry section 7 drives the respective motors M55 in order to begin a punching process for the plate P which is currently accommodated in the lower tray 22. Due to the driving force generated by the motors M55, the drive mechanism 3 moves the storage/transportation mechanism 2 from the lower position to the upper position. Consequently, as shown in FIG. 10, the transportation rollers 25 of the storage/transportation mechanism 2 and the inlets 45 of the punch unit 4 are positioned substantially along a single line, with a first supply path line as shown by a dash-double dot arrow η being created therebetween. Note that the transportation roller 25a is disposed over the transportation roller 25b by means of a transportation roller up/down drive (not shown), so as not to be in contact with the transportation roller 25b.

Figure 11:
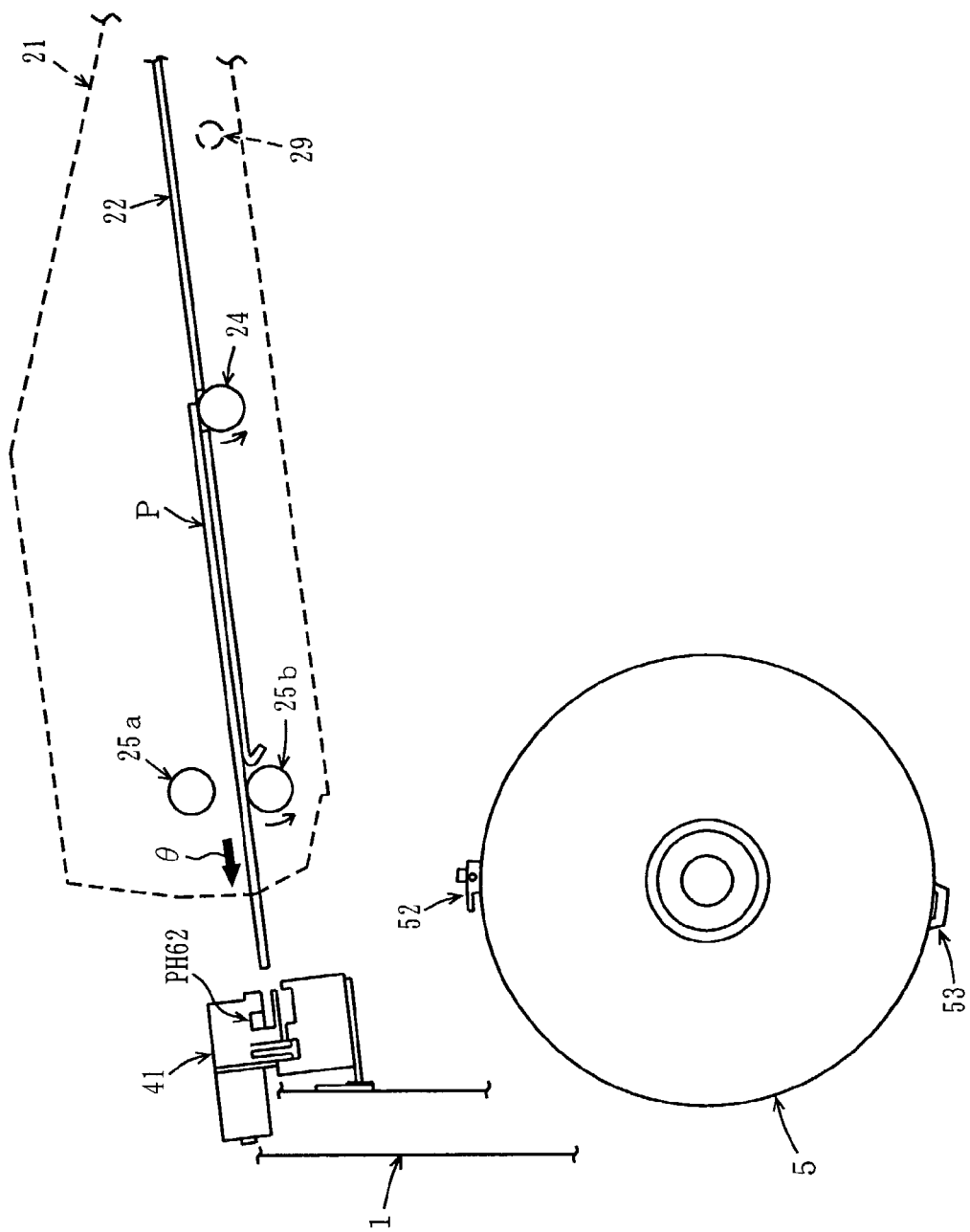
FIG. 11 is a schematic side view illustrating forward rotations of a feed roller 24 and transportation rollers 25.

After the first supply path line is established, the electrical circuitry section 7 drives the motor M50. As shown in FIG. 11, the feed roller 24 and the transportation roller 25b rotate in a direction (see arrow θ) for feeding the plate P from the storage/transportation mechanism 2 to the punch unit, due to the driving force generated by the motor M50. Hereinafter, such rotations of the feed roller 24 and the transportation roller 25b will be referred to as "forward rotations". Thus, the plate P is sent across the lower tray 22 in the direction of the transportation rollers 25 based on the rotation of the feed roller 24, and then sent onto the first supply path line, the leading end first, by the action of the transportation roller 25b. The plate P which has thus been sent along is transported along the first supply path line in a linear trajectory, and at some point along the first supply path line, fine-positioned with respect to the respective punchers 41 by the above-described centering mechanism. The plate P thus fine-positioned is eventually led into the inlets 45 of the respective punchers 41.

When the sensor PH62 of each puncher 41 detects the leading end of the plate P having arrived immediately under itself, the sensor PH62 outputs a detection signal indicating the detection to the electrical circuitry section 7. In response to the detection signal, the electrical circuitry section 7 stops driving the motor M50. As described above, the plate P is fine-positioned with respect to the right-left direction by the centering mechanism, is fine-positioned with respect to the front-back direction based on the detection result by the sensor PH62. As a result, the punch unit 4 can form notches at precise positions in the plate P (the specific positions and shapes of the notches will be described later).

After completing the fine-positioning of the plate P, the electrical circuitry section 7 drives the motors M60 in the punch unit 4. Each punch 44 is moved up and down as appropriate due to the driving force generated by its motor M60 so as to punch a notch in a portion of the plate P lying immediately under the punch 44.

Figure 12:
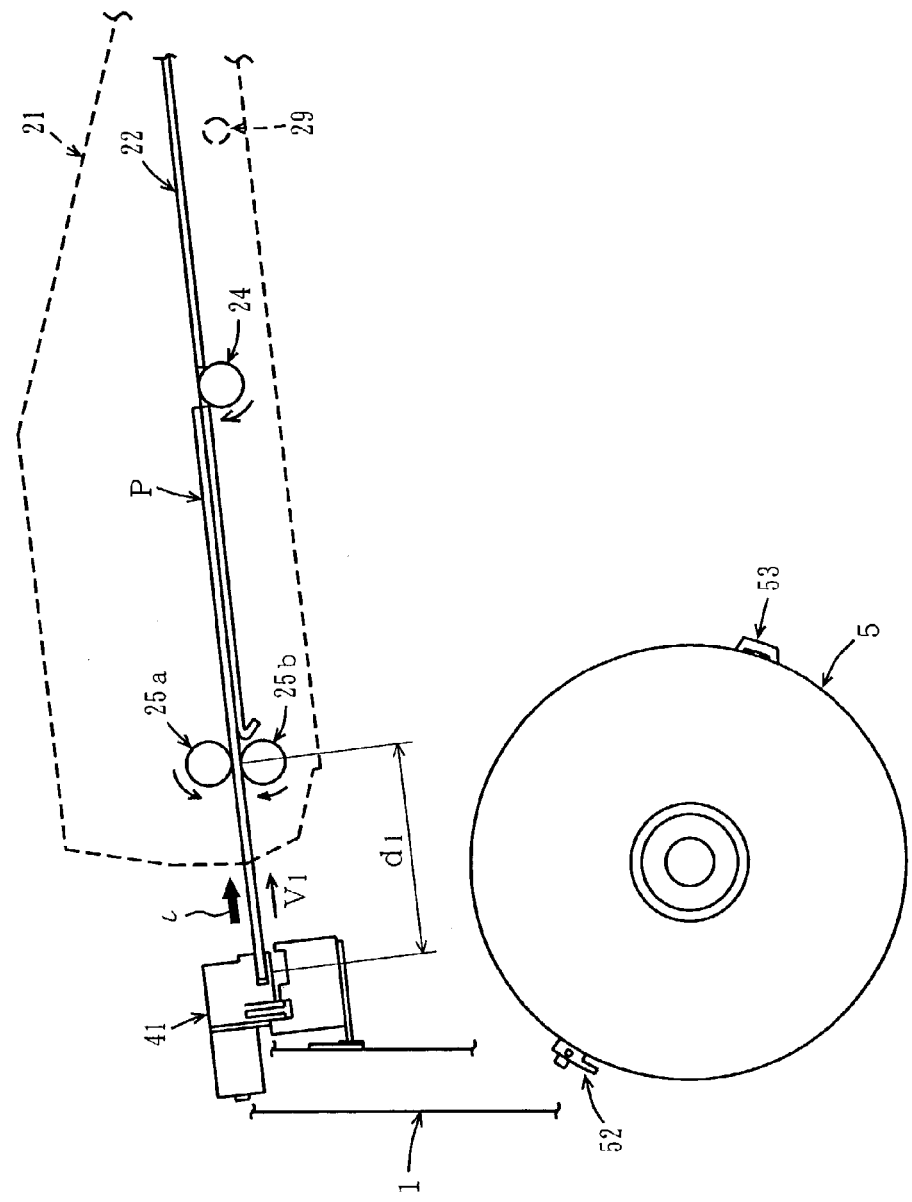
FIG. 12 is a schematic side view illustrating reverse rotations of the feed roller 24 and transportation rollers 25.

After the completion of the punching, the electrical circuitry section 7 drives the motor M50. At this time, the transportation roller 25a is moved down by the transportation roller up/down drive so as to be in an abutting relationship with the transportation roller 25b. As shown in FIG. 12, the feed roller 24 and the transportation rollers 25 rotate at a generally constant speed, in the direction of pulling the punched plate P out of the punch unit 4 back into the storage/transportation mechanism 2 (see arrow ι), due to the driving force generated by the motor M50. Hereinafter, such rotations of the feed roller 24 and the transportation rollers 25 will be referred to as "reverse rotations". Due to such reverse rotations, the punched plate P is again accommodated into the lower tray 22 while travelling backwards along the first supply path line.

Figure 13:
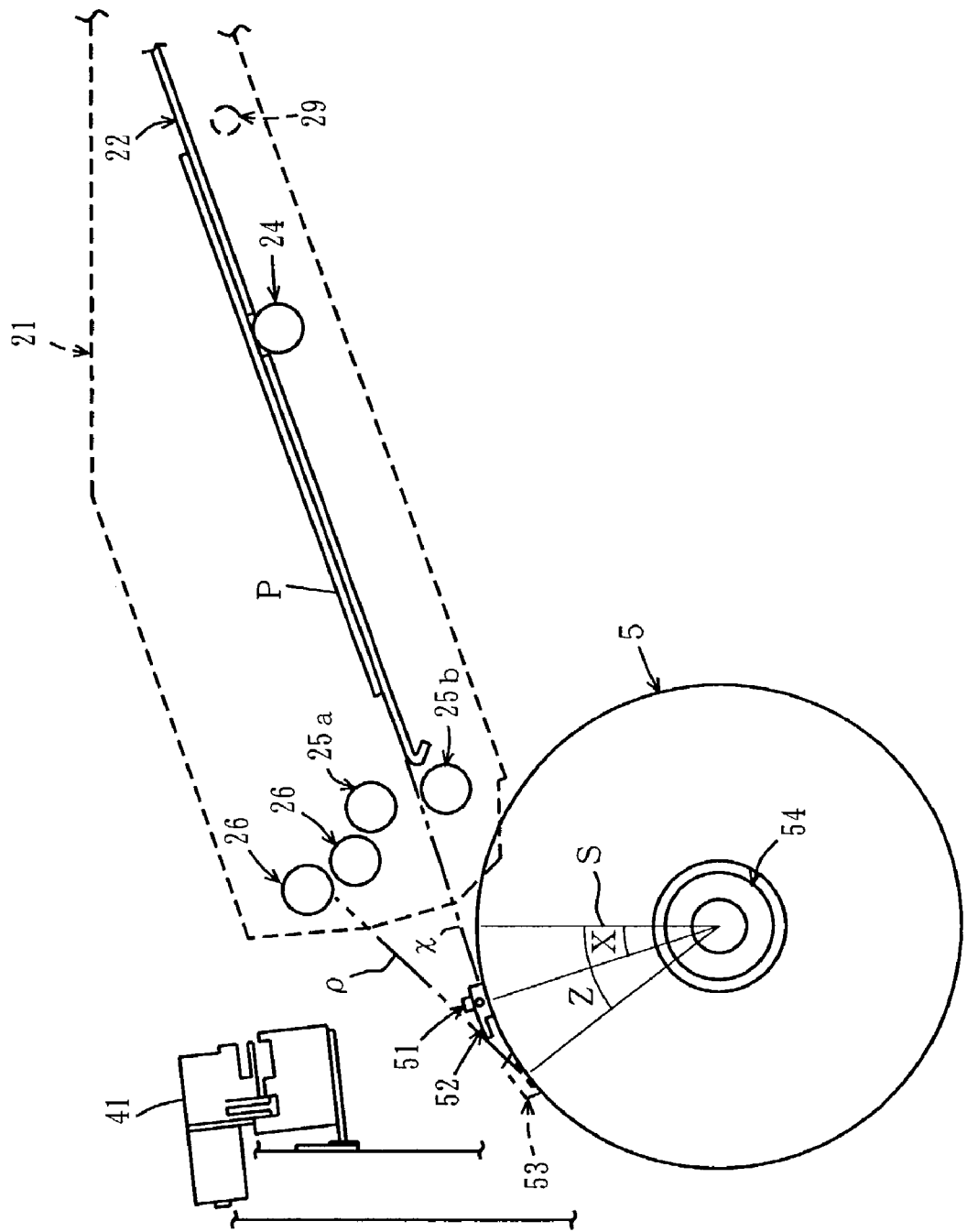
FIG. 13 is a schematic side view illustrating a first angular position X of a leading-end clamp 52.

Next, the electrical circuitry section 7 stop driving the motor M50. The transportation roller up/down drive moves the transportation roller 25a up so as to be in a non-abutting relationship with the transportation roller 25b. Then, the electrical circuitry section 7 drives the respective motors M55. As shown in FIG. 13, the drive mechanism 3 moves the storage/transportation mechanism 2 from the upper position to the lower position due to the driving force generated by the respective motors M55, and the storage/transportation mechanism 2 is halted at the lower position. As a result, the storage/transportation mechanism 2 and the recording drum 5 are positioned so as to face each other. Then, a loading of the plate P which is currently accommodated in the lower tray 22 is performed.

The electrical circuitry section 7 drives the motor M1 to move the recording drum 5 to a position at which the leading-end clamp 52 takes the angular position X, where the recording drum 5 is halted there. When the leading-end clamp 52 takes the angular position X, the storage/transportation mechanism 2 in its lower position and the recording drum 5 are of such a positional relationship that an imaginary line extending in line with the transportation rollers 25 is in contact with (or intersecting) the outer surface of the recording drum 5. Thus, the point of contact (or intersection) between the aforementioned imaginary line and the outer surface of the recording drum 5 defines the angular positionX. Furthermore, a line segment κ connecting the transportation rollers 25 and the leading-end clamp 52 at the angular position X defines the second supply path line.

Figure 14:
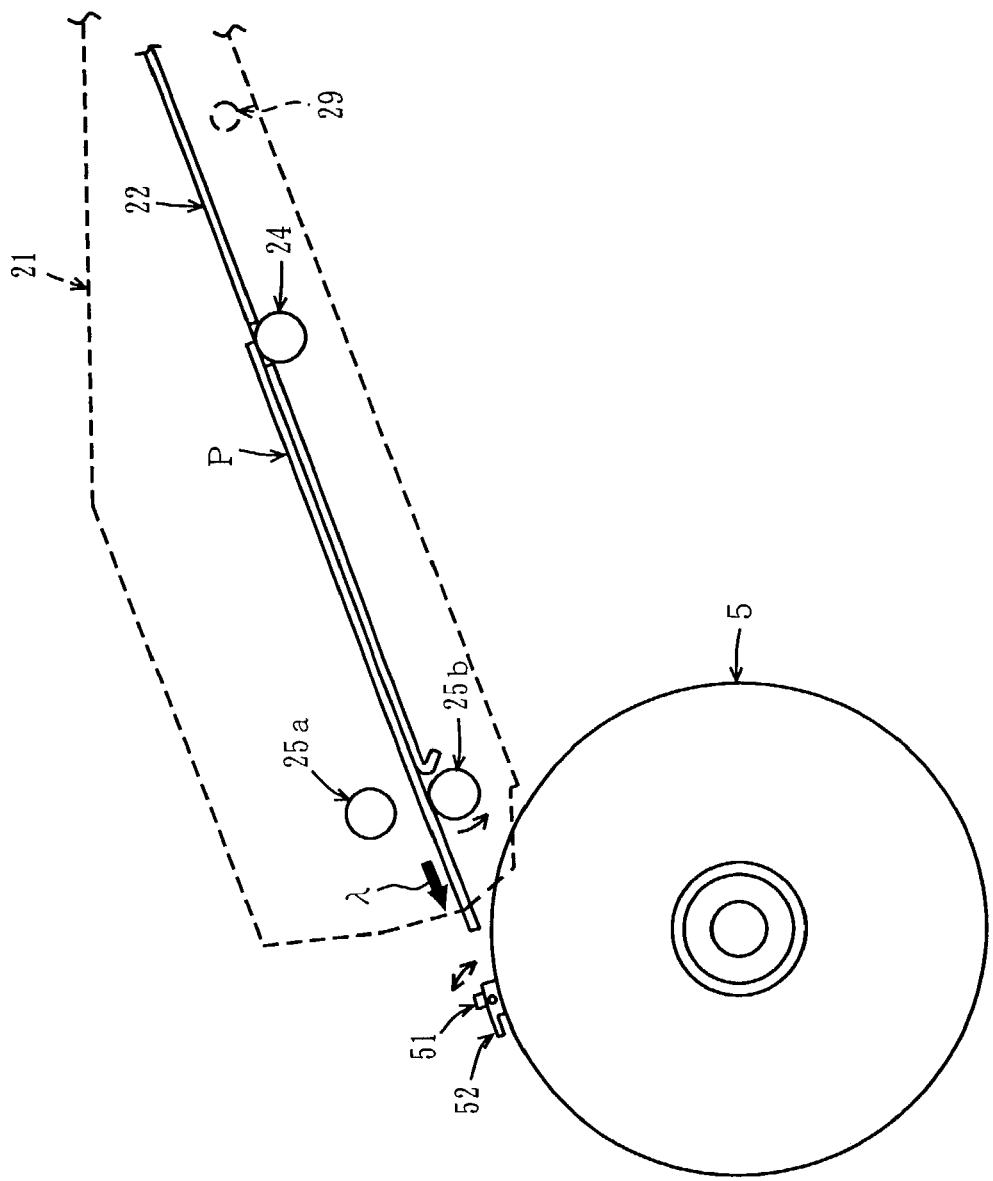
FIG. 14 is a schematic side view illustrating forward rotations of the feed roller 24 and transportation rollers 25 during the loading of the plate P.
Figure 15:
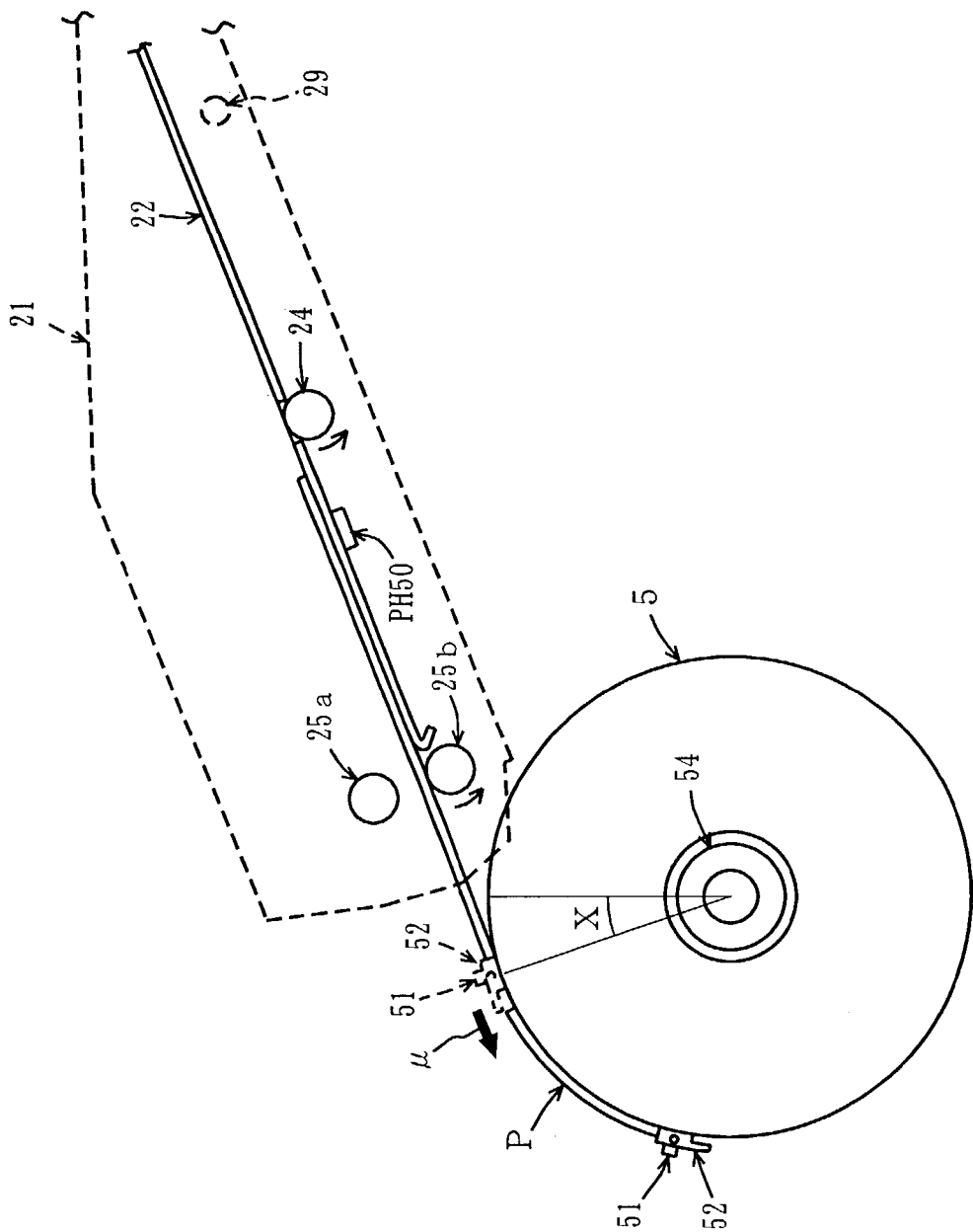
FIG. 15 is a schematic side view illustrating how the plate P is wound around the outer surface of the recording drum 5 due to a forward rotation thereof.

Then, the electrical circuitry section 7 drives the motor M50 to effect forward rotations of the feed roller 24 and the transportation rollers 25 as described above. Thus, as shown in FIG. 14, the plate P is sent off the lower tray 22 toward the recording drum 5, along the second supply path line (see arrow λ). The plate P thus sent-off is positioned with respect to the recording drum 5 as a notch formed in the leading end of the plate P fits with the positioning pin 51.

Once the leading end of the plate P is positioned with respect to the recording drum 5, the electrical circuitry section 7 drives the first clamp driving section so as to cause the leading-end clamp 52 to clamp the leading end of the plate P. Thereafter, the electrical circuitry section 7 runs the motor M1 to rotate in the direction indicated by arrow μ in FIG. 15, i.e., so that the plate P can be wound around the outer surface of the recording drum 5. Hereinafter, the rotation of the recording drum 5 in the direction of arrow μ will be referred to as its "forward rotation".

Figure 16:
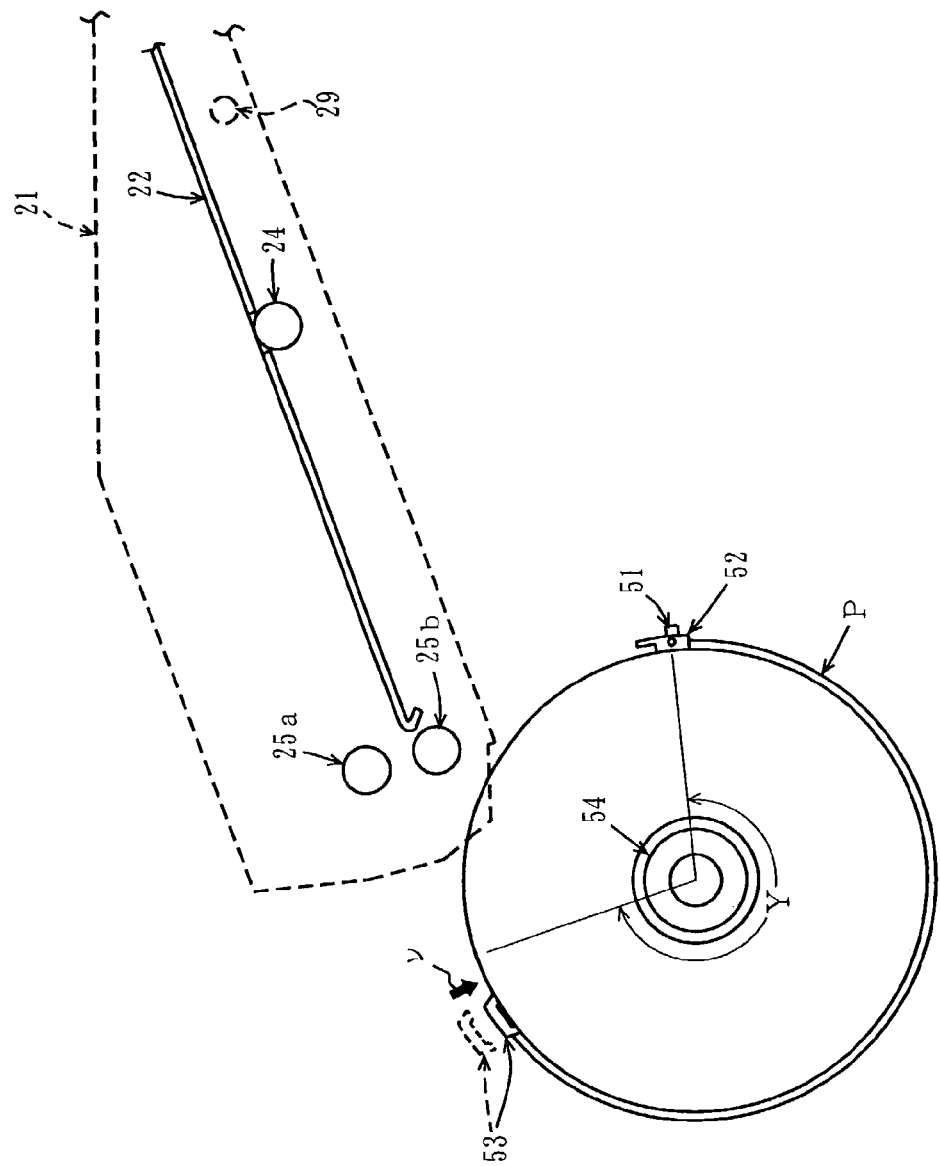
FIG. 16 is a schematic side view illustrating the leading-end clamp 52 having moved in a circular motion by an angle Y from the first angular position X due to the rotation of the recording drum 5.

Consequently, as shown in FIG. 16, the plate P is wound around the outer surface of the recording drum 5 as it is removed from the lower tray 22. While the plate P is being wound around the outer surface of the recording drum 5, the plate P is pressed against the outer surface of the recording drum 5 by the action of squeeze rollers (not shown), and achieves close contact with the outer surface of the recording drum 5 through a vacuum suction realized by the aforementioned vacuum system. Finally, the plate P is completely removed from the lower tray 22 due to the rotation of the transportation rollers 25 and the recording drum 5. As shown in FIG. 16, once the leading-end clamp 52 moves in a circular motion from the first angular position X by an angle Y, the other end (i.e., the trailing end) of the plate P arrives immediately under the trailing-end clamp 53, which is currently retained by the third clamp driving section (i.e., in the second angular position Z).

Then, the electrical circuitry section 7 stops driving the motor M1 at the angle Y. As a result, the other end (i.e., the trailing end) of the plate P is halted immediately under the retained trailing-end clamp 53. Thereafter, as the electrical circuitry section 7 begins driving the third clamp driving section, as indicated by arrow ν in FIG. 16, the respective trailing-end clamps 53 are attached on the outer surface of the recording drum 5. Thus, the respective trailing-end clamp 53 clamp the trailing end of the plate P, thereby stabilizing the trailing end on the outer surface of the recording drum 5. In this manner, the plate P is led into the punch unit 4 by the storage/transportation mechanism 2, and after being punched in accurate positions, led onto the recording drum 5 so as to be mounted in a specific position.

Figure 17:
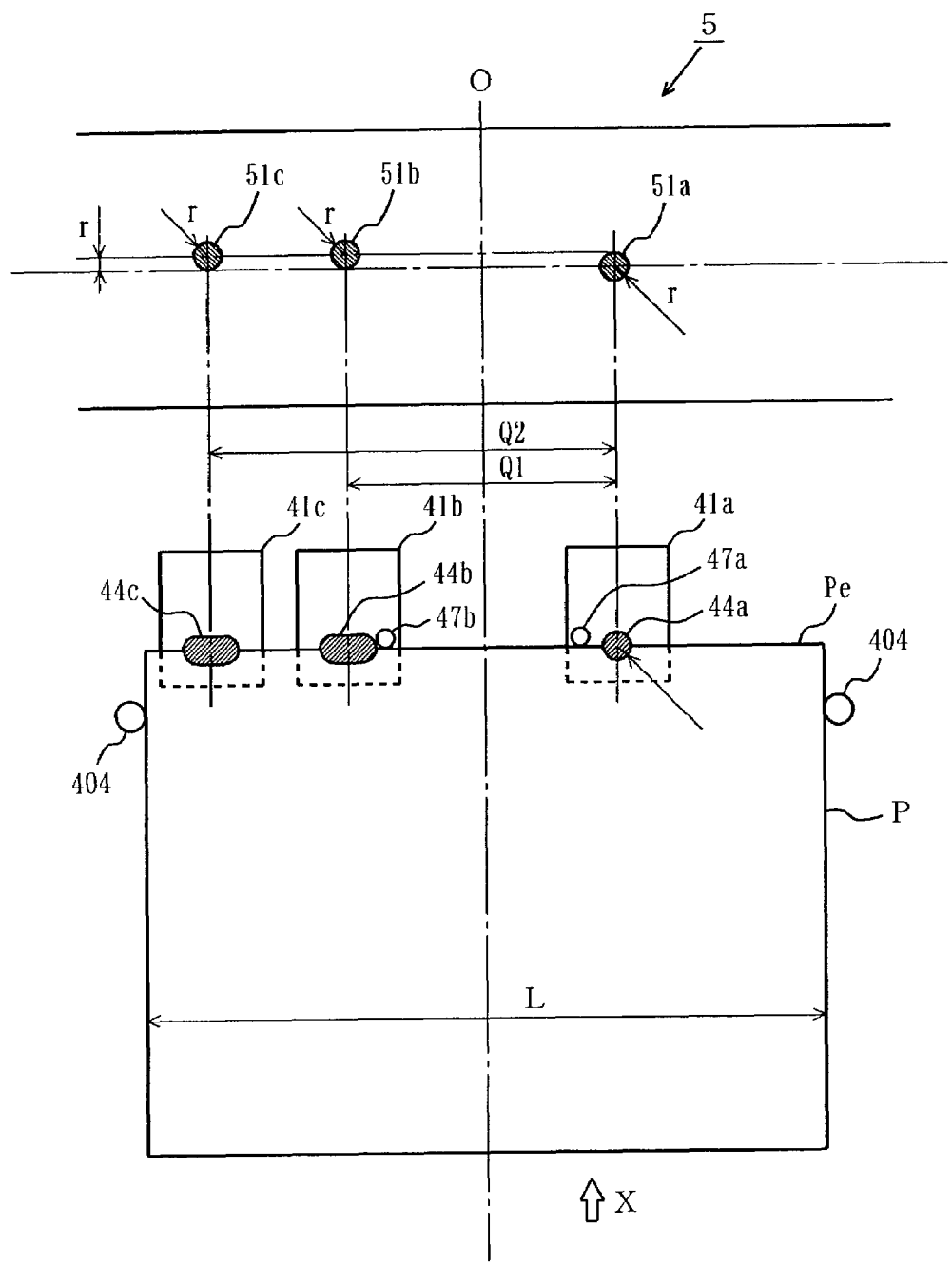
FIG. 17 is a schematic view illustrating the relative positions of a plate P, punches 44 in a puncher 41 and positioning pins 51 on the recording drum 5.

Next, the specific positions and shapes of the notches created by the aforementioned punchers 41, and the specific positions and shapes of the positioning pins 51 provided on the recording drum 5 will be described. FIG. 17 is a schematic view illustrating the relative positions of a plate P, the punches 44 in the puncher 41 and the positioning pins 51 on the recording drum 5. For conciseness, those component elements which are not relevant to the relative positions of the aforementioned component elements are omitted from the following description.

Referring to FIG. 17, the punches 44a, 44b, and 44c are provided in the punchers 41a to 41c in the aforementioned manner, respectively. Moreover, positioning pins 47a and 47b are provided in the punchers 41a and 41b, respectively. The punch 44a has a cross section in the shape of a full circle with a radius r. Each of the punches 44b and 44c has an elongated-circular cross section, the elongation being in the lateral direction in FIG. 17. The punches 44a to 44c are arranged in such a manner that the respective centers thereof are on a single line, with a pitch Q1 (hereinafter referred to as the "intra-central pitch Q1") between the centers of the punches 44a and 44b, and a pitch Q2 (hereinafter referred to as the "intra-central pitch Q2") between the centers of the punches 44a and 44c. Each of the positioning pins 47a and 47b has a cross section in the shape of a full circle. The positioning pins 47a and 47b are disposed so as to be in contact with the line on which the centers of the punches 44 are aligned, closer to the back ends of the inlets 45 of the punchers 41a and 41b.

As described above, when the storage/transportation mechanism 2 (not shown) has transported a plate P having a lateral width L in an X direction in FIG. 17 and led the plate P into the punchers 41, both sides of the plate P receive a centering action by the retention members 404, so as to be centered with respect to a center line O. The plate P thus centered is led into the inlets 45 of the punchers 41, so that positioning pins 47a and 47b disposed at the back ends of the inlets 45 come in contact with a leading end face Pe of the plate P. In other words, the plate P is positioned in such a manner that: the plate P is centered with respect to the center line O by the retention members 404; the positioning of the plate P along the X direction is determined by the positioning pins 47; and the end face Pe coincides with or extends in parallel to the line on which the centers of the punches 44 are aligned. After the sensor PH62 has detected that the plate P sits in this state, necessary notches are formed along the end face Pe of the plate P by the punches 44 (the operation of the punches 44 will be described later).

On the other hand, the positioning pins 51 are provided on the outer surface of the recording drum 5, as described above. Each of the positioning pins 51a, 51b, and 51c has a cross section in the shape of a full circle with the radius r. The positioning pins 51b and 51c are located at a distance r along the circumferential direction (X direction) of the recording drum 5 with respect to the positioning pin 51a. The positioning pins 51b and 51c are disposed at the intra-central pitches Q1 and Q2 from the positioning pin 51a, respectively, along the axial direction of the recording drum 5.

Figure 18:
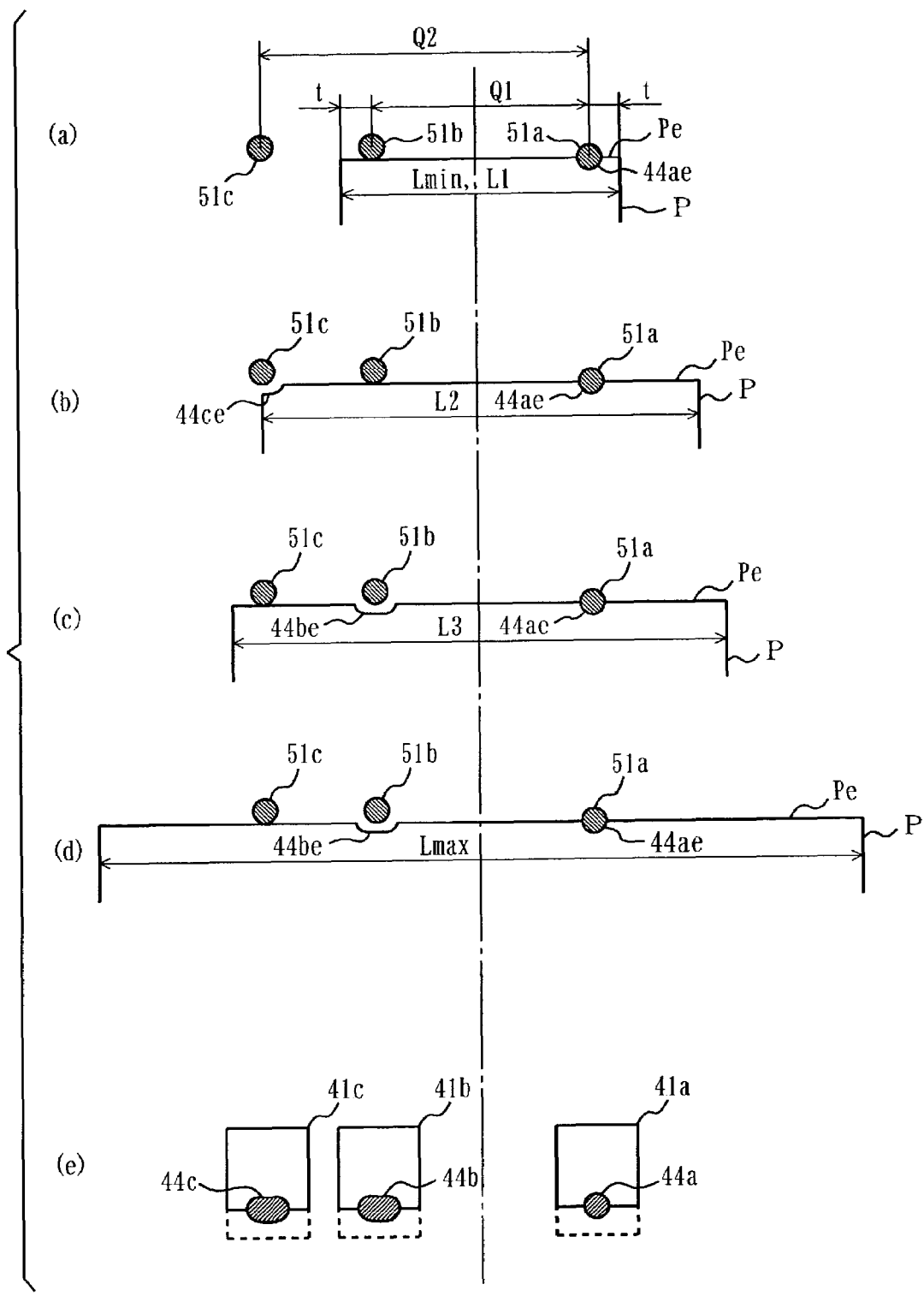
FIG. 18 is a diagram schematically illustrating various positioning methods ((a), (b), (c), and (d)) to be performed depending on the lateral width of the plate P.

Next, the methods for positioning the plate P with respect to the recording drum 5 will be described. According to the present embodiment, different positioning methods are employed depending on the lateral width of the plate P. FIG. 18 is a diagram schematically illustrating various positioning methods ((a), (b), (c), and (d)) to be performed depending on the lateral width of the plate P. FIG. 19 is a table illustrating the operations of the punches 44 and the statuses of the positioning pins 51 associated with the various positioning methods.

FIGS. 18 and 19 illustrate positioning methods for the plate P in accordance with five classes of lateral widths (i.e., Lmin, L1, L2, L3, and Lmax). Note that a plate P having the lateral width Lmin or the lateral width L1 is conveniently illustrated in one diagram, (a), of FIG. 18. Moreover, (e) of FIG. 18 illustrates punches 41 for creating notches 44ae, 44ab, and 44ce as described above.

First, a plate P having the lateral width Lmin will be illustrated with reference to (a) of FIG. 18. Herein, the lateral width Lmin is defined as a minimum lateral width of the plate P that permits positioning by the cylindrical outer surface scanning apparatus. The lateral width Lmin equals the pitch Q1 plus a margin t on either side, that is:

$L\min=Q1+2t.$

The inventors have tentatively set each margin t to be twice the radius r of the positioning pins 51. Hence, $L\min=Q1+4r.$ Since the pitch Q1 is relevant to the minimum lateral width of the plate P that permits positioning, it is desirable to set the pitch Q1 by taking into account the minimum lateral width of plates that need to be subjected to an exposure process on the cylindrical outer surface scanning apparatus. In order to allow a plate P having the lateral width Lmin to be positioned on the recording drum 5, only the punch 41a operates during the punching process, thereby forming the notch 44ae along the end face Pe of the plate P (note that the punch 44c may be allowed to work in vain because the plate P is not led into the punch 44c anyway). Thus, (a) of FIG. 18 shows the plate P, whose lateral width is Lmin and which includes the notch 44ae formed in the aforementioned manner, being positioned on the recording drum 5. Accordingly, the plate P is positioned in place as the positioning pin 51a fits in the notch 44ae and as the end face Pe abuts with the positioning pin 51b. Note that the plate P is not in contact with the positioning pin 51c because the short lateral width Lmin of the plate P. Therefore, the plate P having the lateral width Lmin is positioned in place by the positioning pin 51a along the axial direction of the recording drum 5, and positioned by the positioning pins 51a and 51b along the circumferential direction (i.e., the X direction in FIG. 18).

The above positioning method is applicable not only to plates P having the lateral width Lmin but also plates P having a certain range of lateral widths, named lateral width L1. Specifically, the positioning method is applicable to any plate P whose lateral width is not long enough to reach the positioning pin 51c. Such a lateral width L1 (excluding the lateral width Lmin) can be expressed as (see (b) of FIG. 18):

$L\min<L1<Q2+(Q2-Q1)-2r.$

Next, the method for positioning a plate P having a lateral width which is long enough to reach the positioning pin 51c will be described. Such a lateral width which is long enough to reach the positioning pin 51c can be further classified as either: a lateral width (defined as L3) which is sufficient for utilizing the positioning pin 51c as a positioning reference for the plate P; or a lateral width (defined as L2) which is not sufficient for utilizing the positioning pin 51c as a positioning reference for the plate P. Firstly, the lateral width (L2) which is not sufficient for utilizing the positioning pin 51c as a positioning reference for the plate P will be described.

In order for the positioning pin 51c to be used as a positioning reference, assuming that a margin t is required, the lateral width L2 must satisfy:

$Q2+(Q2-Q1)-2r \leq L2 < Q2+(Q2-Q1)+2t.$

In order to allow a plate P having such a lateral width L2 to be positioned on the recording drum 5, the punches 41a and 41c operate during the punching process, thereby forming the notches 44ae and 44ce along the end face Pe of the plate P. Thus, (b) of FIG. 18 shows the plate P, whose lateral width is L2 and which includes the notches 44ae and 44ce formed in the aforementioned manner, being positioned on the recording drum 5. Accordingly, the plate P is positioned in place as the positioning pin 51a fits in the notch 44ae and as the end face Pe abuts with the positioning pin 51b. Note that the plate P is not in contact with the positioning pin 51c because of the notch 44ce being formed. Therefore, the plate P having the lateral width L2 is positioned in place by the positioning pin 51a along the axial direction of the recording drum 5, and positioned by the positioning pins 51a and 51b along the circumferential direction (i.e., the X direction in FIG. 18).

Secondly, the lateral width (L3) which is sufficient for utilizing the positioning pin 51c as a positioning reference for the plate P will be described. The lateral width L3 corresponds to the case where a margin t or more is available for utilizing the positioning pin 51c as a positioning reference, and can be expressed as:

$Q2+(Q2-Q1)+2t \leq L3 \leq L\max.$

As used herein, the lateral width Lmax is defined as a maximum lateral width of the plate P that permits an exposure process to be successfully performed for the plate P mounted on the recording drum 5. In order to allow a plate P having the lateral width L3 or Lmax to be positioned on the recording drum 5, the punches 41a and 41b operate during the punching process, thereby forming the notches 44ae and 44be along the end face Pe of the plate P. Thus, (c) of FIG. 18 shows the plate P, whose lateral width is L3 and which includes the notches 44ae and 44be formed in the aforementioned manner, being positioned on the recording drum 5. Similarly, (d) of FIG. 18 shows the plate P, whose lateral width is Lmax and which includes the notches 44ae and 44be formed in the aforementioned manner, being positioned on the recording drum 5. Accordingly, the plate P is positioned in place as the positioning pin 51a fits in the notch 44ae and as the end face Pe abuts with the positioning pin 51c. Note that the plate P is not in contact with the positioning pin 51b because of the notch 44be being formed. Therefore, the plate P having the lateral width L3 is positioned in place by the positioning pin 51a along the axial direction of the recording drum 5, and positioned by the positioning pins 51a and 51c along the circumferential direction (i.e., the X direction in FIG. 18).

In connection with the above positioning methods, the inventors have been successful in stably positioning a number of experimental plates P having a lateral width in the range from 450 mm to 1160 mm, where the pitch Q1=302 mm, pitch Q2=451 mm, and r=3.51 mm.

Thus, in accordance with the present cylindrical outer surface scanning apparatus, a plate having a relatively short lateral width is positioned on the recording drum 5 by utilizing the two positioning pins 51a and 51b which are disposed with a relatively short pitch therebetween, whereas a plate having a relatively long lateral width is positioned on the recording drum 5 by utilizing the two positioning pins 51a and 51c which are disposed on the opposite ends with a relatively long pitch therebetween, while preventing contact with a central positioning pin 51b by providing the non-contacting notch 44be. As a result, plates having a broad range of lateral widths can be stably positioned on the recording drum 5 on the basis of two positioning pins with an appropriate pitch therebetween.

Figure 20:
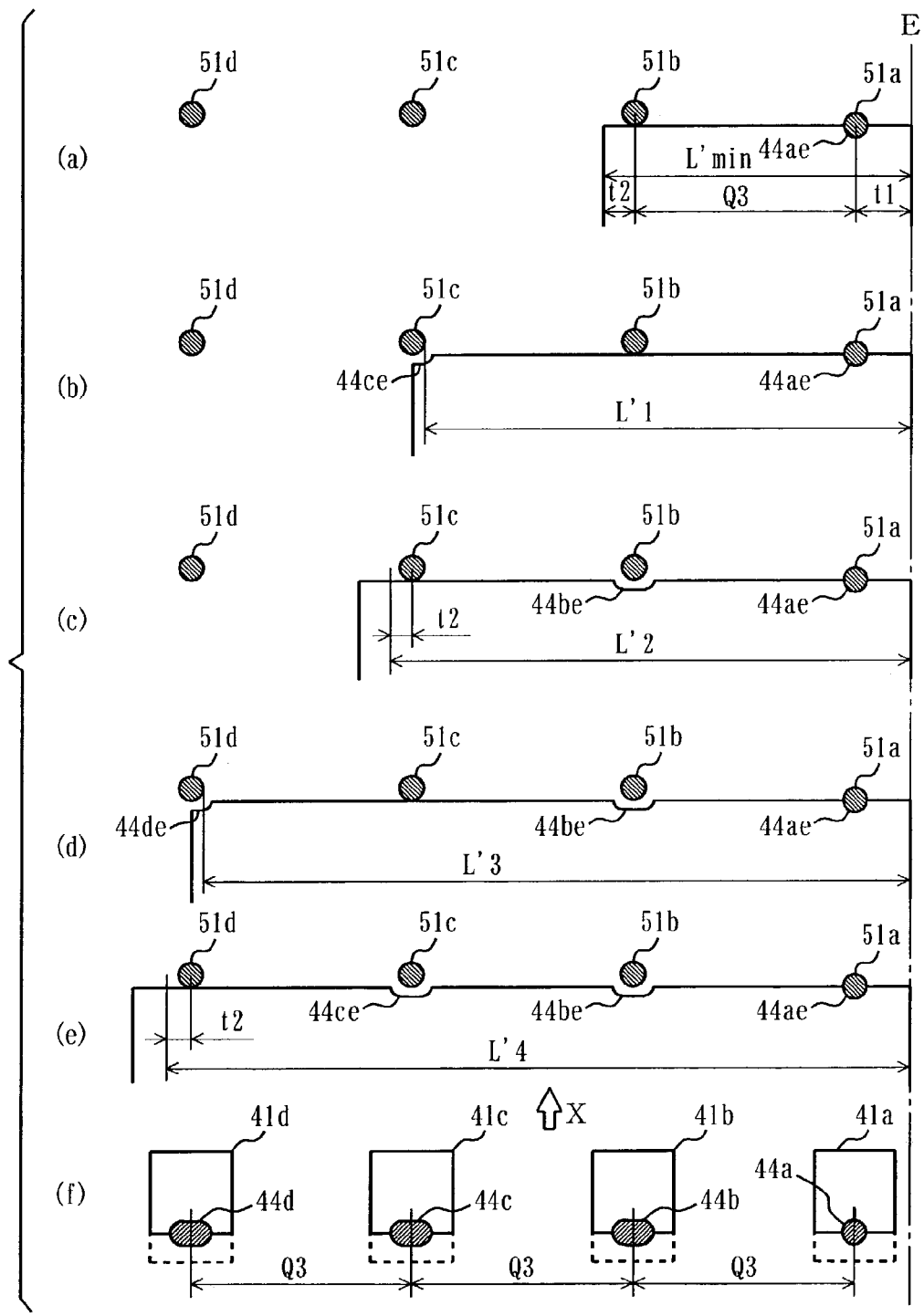
FIG. 20 is a diagram schematically illustrating various positioning methods ((a), (b), (c), (d), and (e)) to be performed depending on the lateral width of the plate P, which involve positioning one of the side ends of the plate P with respect to a reference line E.

While the above-described positioning methods all require centering the plate P with respect to the reference line O, it is also applicable to position one of the side ends of the plate P with respect to a reference line. FIG. 20 is a diagram schematically illustrating various positioning methods ((a), (b), (c), (d), and (e)) to be performed depending on the lateral width of the plate P, which involve positioning one of the side ends of the plate P with respect to a reference line E.

As shown in (f) of FIG. 20, a puncher 41d is provided in addition to the punchers 41 employed in the above-described example based on centering technique (FIG. 18). Furthermore, the punches 44a to 44d are disposed in such a manner that a pitch Q3 exists between the centers of any adjoining two punches 44. In (a) to (e) of FIG. 20, a positioning pin 51d is provided in addition to the positioning pins employed in the above-described example based on centering technique, such that the positioning pin 51d is at the same position along the circumferential direction of the recording drum 5 as the positioning pins 51b and 51c. The positioning pins 51a, 51b, 51c, and 51d are disposed with the pitch Q3 between any adjoining two positioning pins 51 along the axial direction of the recording drum 5. The first positioning pin 51a is located at a distance t1 from the reference line E.

The distance t1 is preferably set to be equal to or greater than twice the radius r of the first positioning pin 51a.

In (a) of FIG. 20, a plate P having a lateral width L'min is illustrated. The lateral width L'min, which is defined as a minimum lateral width of the plate P that permits positioning by using this positioning method, equals the distance t1 plus the pitch Q3 plus a margin t2 (i.e., a margin necessary for positioning the plate P in abutment with the positioning pin 51b). The inventors have tentatively set the margin t2 to be twice the radius r of the positioning pins 51. Hence, the lateral width L'min is:

$$L'\text{min}=t1+Q3+t2.$$

In the case where the lateral width of the plate P is equal to or greater than the lateral width L'min and yet less than a lateral width L'1 (see (b) of FIG. 20) which is just long enough to reach the positioning pin 51c, that is:

$$L'1=t1+2Q3-r,$$

then, only the punch 44a operates to form the notch 44ae during the punching process. Thus, the plate P is positioned in place as the positioning pin 51a fits in the notch 44ae and as the end face Pe abuts with the positioning pin 51b. Therefore, the plate P having the lateral width L'1 is positioned in place by the positioning pin 51a along the axial direction of the recording drum 5, and positioned by the positioning pins 51a and 51b along the circumferential direction (i.e., the X direction in FIG. 20)

As shown in (b) of FIG. 20, in the case where the lateral width of the plate P is equal to or greater than the lateral width L'1 and yet less than a lateral width L'2 (see (c) of FIG. 20) which is at least required for enabling positioning in abutment with the positioning pin 51c, that is:

$$L'2=t1+2Q3+t2,$$

then, the punches 44a and 44c create notches 44ae and 44ce in the plate P during the punching process. The plate P is positioned in place as the positioning pin 51a fits in the notch 44ae and as the end face Pe abuts with the positioning pin 51b. The plate P does not come in contact with the positioning pin 51c because of the notch 44ce being formed. Therefore, the plate P is positioned in place by the positioning pin 51a along the axial direction of the recording drum 5, and positioned by the positioning pins 51a and 51b along the circumferential direction (i.e., the X direction in FIG. 20).

As shown in (c) of FIG. 20, in the case where the lateral width of the plate P is equal to or greater than the lateral width L'2 and yet less than a lateral width L'3 (see (d) of FIG. 20) which is just long enough to reach the positioning pin 51d, that is:

$$L'3=t1+3Q3-r,$$

then, the punches 44a and 44b create notches 44ae and 44be in the plate P during the punching process. The plate P is positioned in place as the positioning pin 51a fits in the notch 44ae and as the end face Pe abuts with the positioning pin 51c. The plate P does not come in contact with the positioning pin 51b because of the notch 44be being formed. Therefore, the plate P is positioned in place by the positioning pin 51a along the axial direction of the recording drum 5, and positioned by the positioning pins 51a and 51c along the circumferential direction (i.e., the X direction in FIG. 20).

As shown in (d) of FIG. 20, in the case where the lateral width of the plate P is equal to or greater than the lateral width L'3 and yet less than the lateral width L'4 (see (e) of FIG. 20) which is at least required for enabling positioning in abutment with the positioning pin 51d, that is:

$$L'4=t1+3Q3+t2,$$

then, the punches 44a, 44b, and 44d create notches 44ae, 44be, and 44de in the plate P during the punching process. The plate P is positioned in place as the positioning pin 51a fits in the notch 44ae and as the end face Pe abuts with the positioning pin 51c. The plate P does not come in contact with the positioning pin 51b or 51d because of the notches 44be and 44de being formed. Therefore, the plate P is positioned in place by the positioning pin 51a along the axial direction of the recording drum 5, and positioned in place by the positioning pins 51a and 51c along the circumferential direction (i.e., the X direction in FIG. 20).

In this positioning method, L'max, which is defined as a maximum lateral width of the plate P that permits positioning of the plate P, is equal to the maximum length of the plate P that permits image recording on the recording drum 5. As shown in (e) of FIG. 20, in the case where the lateral width of the plate P is equal to or greater than the lateral width L'4 and yet less than the lateral width L'max, then, the punches 44a, 44b, and 44c create notches 44ae, 44be, and 44ce in the plate P during the punching process. The plate P is positioned in place as the positioning pin 51a fits in the notch 44ae and as the end face Pe abuts with the positioning pin 51d. The plate P does not come in contact with the positioning pin 51b or 51c because of the notches 44be and 44ce being formed. Therefore, the plate P is positioned in place by the positioning pin 51a along the axial direction of the recording drum 5, and positioned by the positioning pins 51a and 51d along the circumferential direction (i.e., the X direction in FIG. 20).

Thus, in accordance with the present cylindrical outer surface scanning apparatus, it is possible to stably position a plate on the recording drum, regardless of whether the positioning is based on the centering of the plate or the positioning is performed with respect to the side end E of the plate. It will be appreciated that the technique of positioning the plate with respect to a side end thereof can realize stable positioning for a plate having a progressively greater lateral width by providing more positioning pins and more corresponding punchers.

Figure 28A:
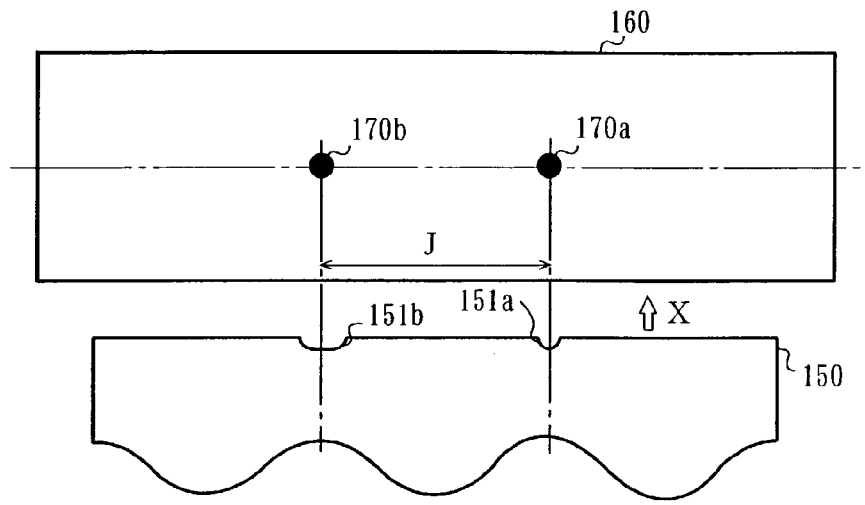
FIGS. 28A, 28B, and 28C are schematic diagrams illustrating exemplary relative positions of positioning notches (for a recording drum) formed on a conventional plate and pins provided on the recording drum.
Figure 28B:
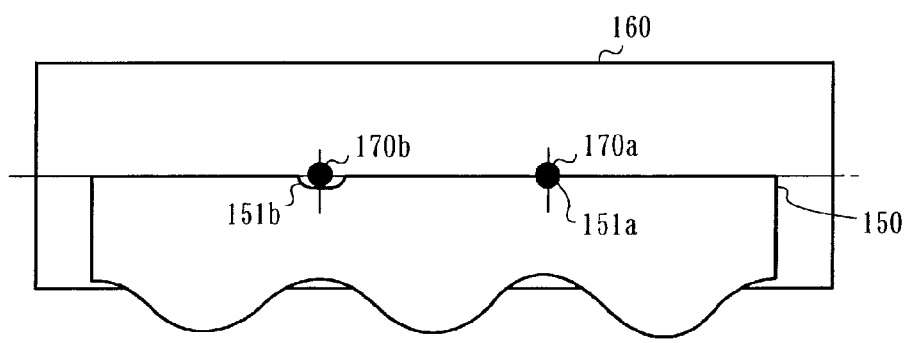
Figure 28C:
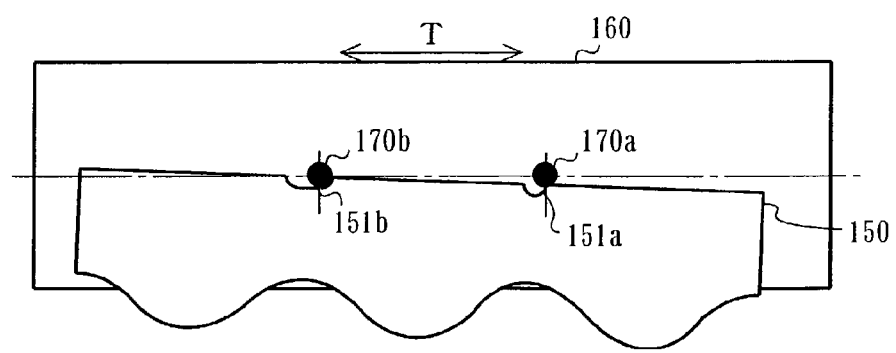
Figure 29A:
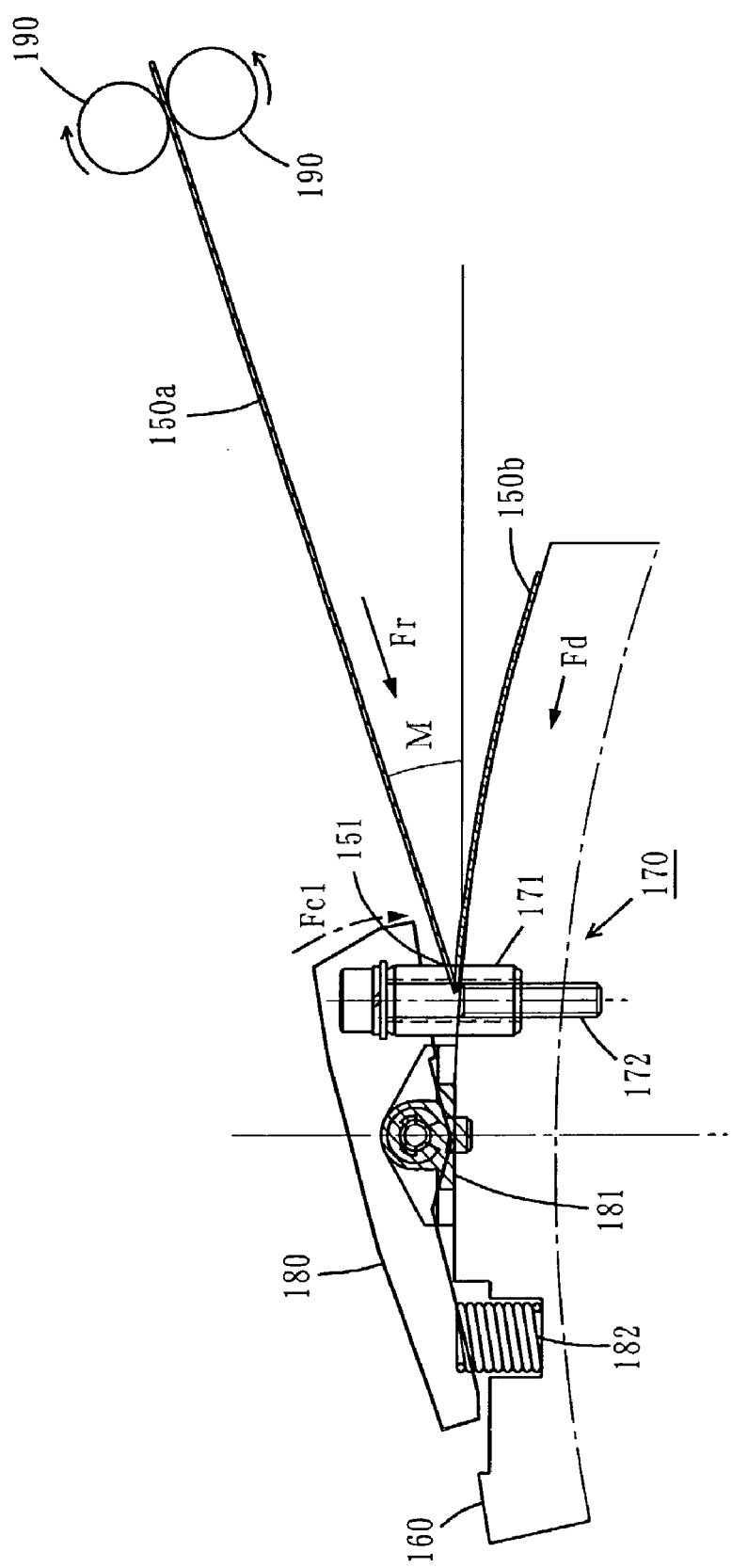
FIGS. 29A and 29B are longitudinal cross-sectional views illustrating how a conventional plate 150 is positioned and stabilized on a recording drum 160, as seen from an s direction in FIG. 27B.
Figure 29B:
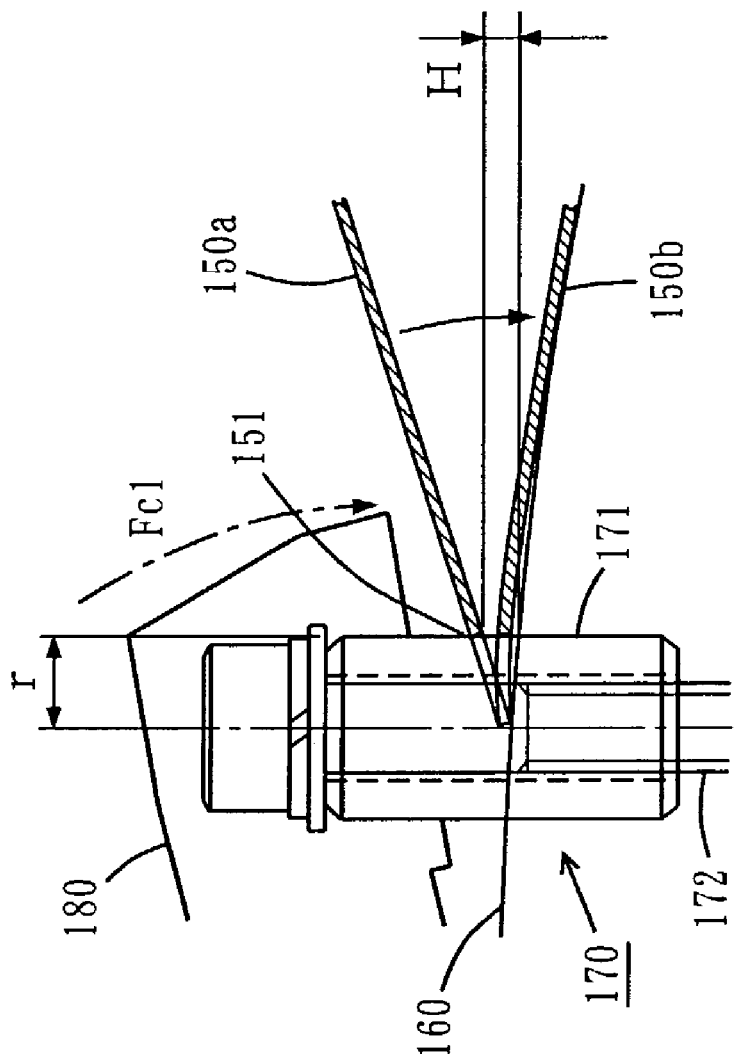
Figure 30:
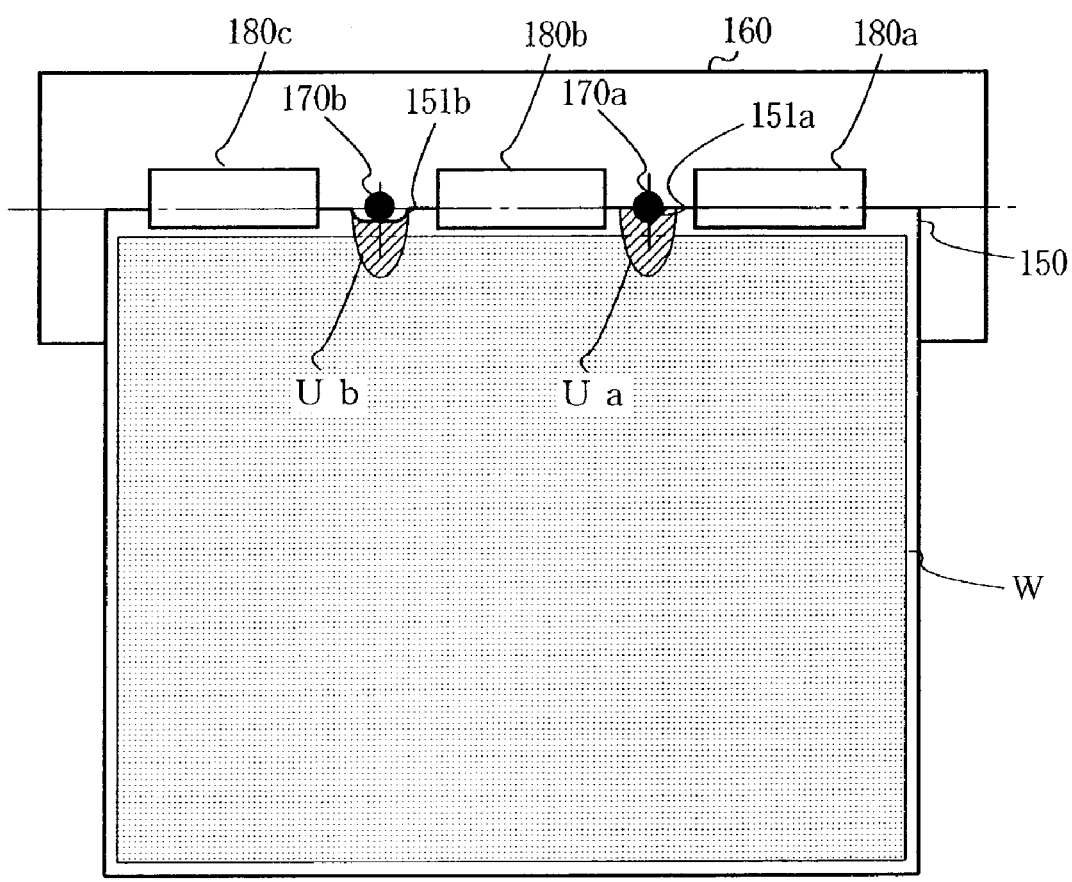
FIG. 30 is a plan view schematically showing the conventional plate 150 having been deformed.

Next, a manner in which the plate P is transported by the storage/transportation mechanism 2 toward the punch unit 4 and the recording drum 5 according to the present invention will be described. As described above, the plate P is positioned in place on the storage/transportation mechanism 2 by the punch unit 4 and the centering mechanism, and thereafter translated (i.e., illustrated with reference to FIGS. 28A and 28B employs two punchers and two positioning pins.

Figure 21:
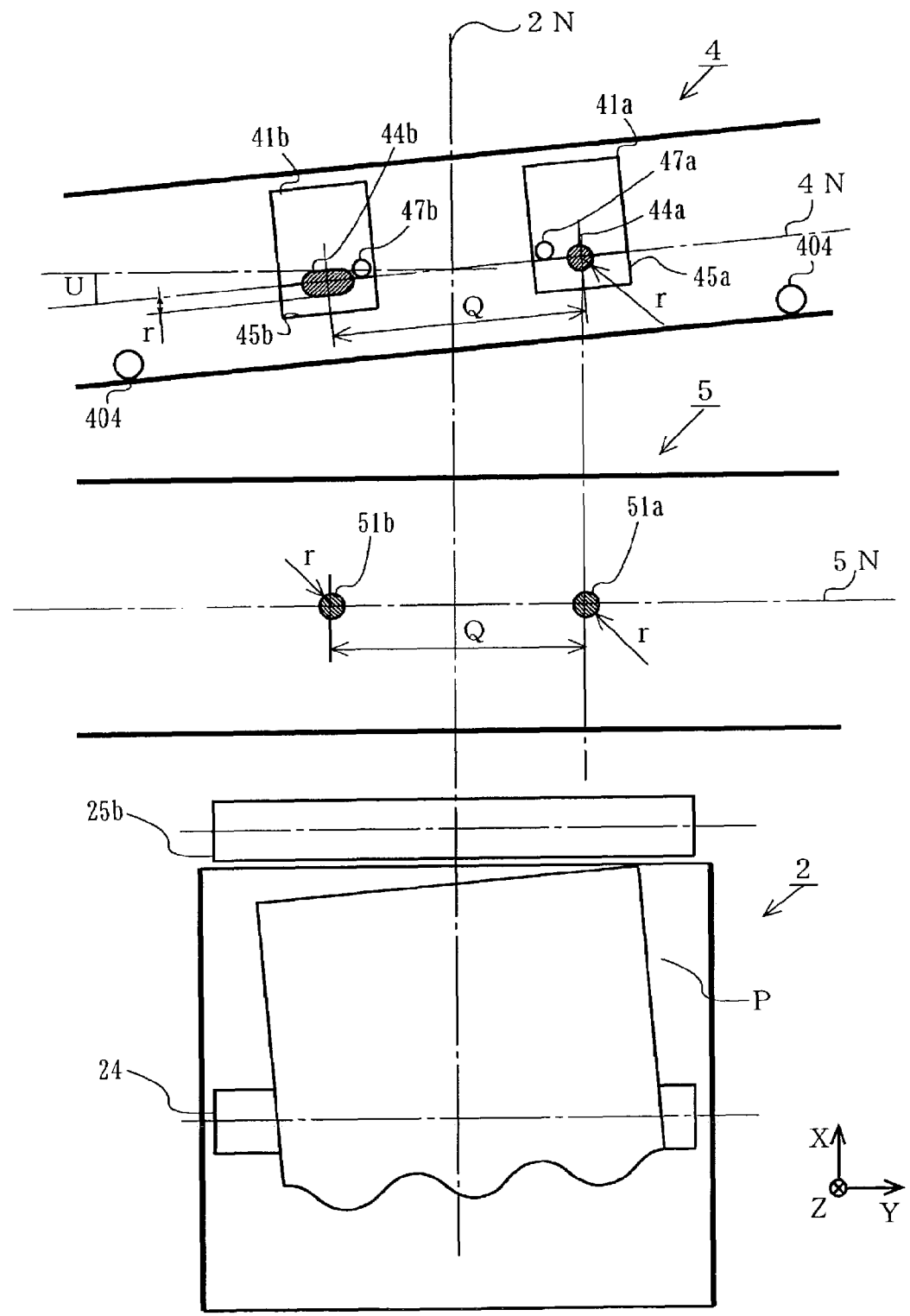
FIG. 21 is a plan view schematically illustrating relative positions of the punch unit 4, the recording drum 5, and the storage/transportation mechanism 2, as viewed from immediately above the cylindrical outer surface scanning apparatus.

As shown in FIG. 21, the punchers 41a and 41b are disposed in the punch unit 4 relative to the reference line 4N. The centers of the punches 44a and 44b which are disposed in the inlets 45 are aligned on the reference line 4N, in such a manner that the positioning pins 47a and 47b are in contact with the back ends of the inlet 45. The storage/transportation mechanism 2 is disposed in such a manner that the plate P is transported by the feed roller 24 and the transportation roller 25b in the direction of a reference line 2N (i.e., the X direction in FIG. 21). It is ensured that the normal of the reference line 2N and the reference line 4N constitute the angle U, so that the punch 44b lies closer to the storage/transportation mechanism 2 than if the normal of the reference line 2N and the reference line 4N did not constitute an angle. The plate P which has been led into the punch unit 4 is centered by means of the retention members 404 with respect to the normal (not shown) of the reference line 4N (which intersects the middle point between the punches 44a and 44b), and then led into the inlets 45 of the punchers 41. The plate P first comes in contact with the positioning pin 47b and then with the positioning pin 47a. Thus, the plate P is positioned in place with the leading end of thereof being aligned with the reference line 4N, and thereafter subjected to a punching process.

On the other hand, the recording drum 5 is disposed so in a parallel movement) within the storage/transportation mechanism 2 so as to be sent out to the recording drum 5. In other words, the plate P is transported onto the recording drum 5 while retaining whatever angle that exists between the punch unit 4 and the storage/transportation mechanism 2. Now, a reference line 4N through the attachment member 42 in the punch unit 4 may be disposed at an angle U with respect to the rotation axis of the recording drum 5, as shown in FIG. 21. Therefore, the leading end of the plate P transported onto the recording drum 5, on which the positioning notches are formed, constitutes the angle U with respect to the rotation axis of the recording drum 5.

FIG. 21 is a plan view schematically illustrating relative positions of the punch unit 4, the recording drum 5, and the storage/transportation mechanism 2, as viewed from immediately above the cylindrical outer surface scanning apparatus. For ease of illustration, the punch unit 4, the recording drum 5, and the storage/transportation mechanism 2 are shown apart from one another along the X direction in FIG. 21, although portions of these component elements would actually appear as overlapping one another when viewed from immediately above. In order to facilitate comparison with the conventional technique, the example illustrated in FIG. 21 employs only two punchers 41 in the punch unit 4 and two positioning pins 51 (as opposed to the aforementioned three punchers 41 and three positioning pins 51) because the conventional positioning method that the rotation axis 5N thereof lies perpendicular to the reference line 2N. The present example illustrates the case where the positioning pin 51a fits in a semicircular shape reference notch 44ae, which is formed in the plate P by means of the punch 44a, so as to position the plate P in place on the outer surface of the recording drum 5, and the positioning pin 51b fits in an elongated semicircular notch 44be, which is formed in the plate P by means of the punch 44b, so as to assist in the positioning, as in the above-described conventional technique. The intra-central pitch between the positioning pins 51a and 51b is equal to the intra-central pitch between the punches 44a and 44b (denoted as "Q"). The relative positions of the positioning pins 51a and 51b are such that a line through the centers of the respective pins is in parallel to the rotation axis 5N of the recording drum 5. Furthermore, the positioning pin 51a and the punch 44a each have a cross section in the shape of a full circle with the same radius r, the centers of the positioning pin 51a and the punch 44a being aligned on the same imaginary line parallel to the direction of the reference line 2N (i.e., the X direction in FIG. 21). The positioning pin 51b has a cross section in the shape of a full circle with the radius r. The punch 44b has an elongated-circular cross section, with the shorter side being as long as 2r.

After punching the leading end of the plate P, the storage/transportation mechanism 2 returns the plate P to the storage/transportation mechanism 2 while conserving the tilt angle U, lowers the plate P in the Z direction, and leads the plate P onto the recording drum 5 by means of the feed roller 24 and the transportation roller 25b. Thus, the plate P is led onto the recording drum 5 while the leading end of the plate P along which the reference notches 44ae and 44be are formed keeps the angle U with the rotation axis 5N of the recording drum 5.

Next, a manner in which the plate P is led onto the recording drum 5 by the storage/transportation mechanism 2 according to the present invention will be described. FIGS. 22A and 22B are plan views schematically illustrating manners in which the plate P may be positioned with respect to the recording drum 5. As described above, the plate P, along whose leading end the reference notch 44ae and the notch 44be have been formed by the punch unit 4, is transported onto the recording drum 5 while retaining the angle U between its leading end and the rotation axis 5N of the recording drum 5. As described above, the positioning pin 51a and the punch 44a each have a cross section in the shape of a full circle with the same radius r, such that the centers of the positioning pin 51a and the punch 44a are aligned on the same imaginary line parallel to the X direction in FIG. 21, i.e., the direction in which the plate is transported by the storage/transportation mechanism 2 (hereinafter referred to as the "plate transportation direction"). Once the plate P is led onto the recording drum 5, the reference notch 44ae in the plate P is fitted with the positioning pin 51a. FIG. 22A is a plan view illustrating how the reference notch 44ae in the plate P fits with the positioning pin 51a. Firstly, as the reference notch 44ae fits with the positioning pin 51a, the plate P is positioned with respect to the recording drum 5 along the Y direction in FIG. 22. Thereafter, the plate P continues to be transported in the X direction by the transportation roller 25b of the storage/transportation mechanism 2, so that the plate P rotates around the positioning pin 51a in the direction of arrow v in FIG. 22. Secondly, as the notch 44be fits with the positioning pin 51b, the plate P is positioned with respect to the recording drum 5 along the X direction. In other words, a two-fold positioning of the plate P with respect to the recording drum 5 occurs, with the positioning pin 51a first fitting in the reference notch 44ae and thereafter the positioning pin 51b fitting in the notch 44be. The positioning along the Y direction is determined by the positioning pin 51a fitting in the reference notch 44ae and the positioning along the X direction is determined by the positioning pins 51a and 51b fitting in the reference notches 44ae and 44be.

As shown in FIG. 22B, the positioning pin 51a and the reference notch 44ae may be dislocated from each other, with a distance w between the centers thereof. A possible reason for this is an insufficient transportation positioning accuracy of the storage/transportation mechanism 2 with respect to the plate P. If the distance w is less than the radius r of the reference notch 44ae and the positioning pin 51a, a portion of the opening defining the reference notch 44ae in the plate P will be in contact with the positioning pin 51a. In other words, since the recording drum 5 and the plate P abut with each other in one position, the friction force from the recording drum 5 along the Y direction is very small. Since the plate P will be further transported in the X direction by the storage/transportation mechanism 2 from the state illustrated in FIG. 22B, the plate P will rotate as the positioning pin 51a gradually fits into the reference notch 44ae. Thus, the positioning pin 51a will eventually fit in the reference notch 44ae, and the positioning pin 51b will fit in the notch 44be.

Thus, according to the present cylindrical outer surface scanning apparatus, the position of a plate with respect to the recording drum occurs as follows: First, the plate is transported onto the recording drum while maintaining a tilt of the leading end of the plate, along which a reference notch is formed. The reference notch in the plate fits with a positioning pin to determine the positioning along the axial direction of the recording drum. Thereafter, as the plate rotates around the positioning pin, another notch (or the leading end of the plate) fits (or abuts) with an associated positioning pin. Furthermore, even if the reference notch in the plate and the positioning pin initially do not fit each other for positioning along the axial direction of the recording drum, the plate keeps rotating as the positioning pin fits into the reference notch, until the positioning pin finally fits properly in the reference notch, and the other notch (or the leading end of the plate) fits (or abuts) with the associated positioning pin. In other words, by ensuring that the fitting of the positioning member for the positioning along the axial direction of the recording drum occurs first, it is possible to accurately position the plate with respect to the recording drum.

As above, the present example illustrates the case where the punch unit 4 is tilted at the angle U with respect to the normal of the plate transportation direction of the storage/transportation mechanism 2 to ensure that the plate P is transported onto the recording drum 5 while being tilted at the angle U. Alternatively, the rotation axis of the recording drum 5 may be tilted with respect to the normal of the plate transportation direction of the storage/transportation mechanism 2. In other words, the punch unit 4 may be disposed perpendicular to the plate transportation direction of the storage/transportation mechanism 2, and the rotation axis of the recording drum 5 may be tilted at the angle U with respect to the normal of the plate transportation direction, whereby similar effects can be expected; however, note that the tilt in this case should be in the opposite direction from the direction of tilt of the reference line 4N shown in FIG. 21.

In the variant where the rotation axis of the recording drum 5 is tilted with respect to the normal of the plate transportation direction of the storage/transportation mechanism 2, the cylindrical outer surface scanning apparatus does not need to incorporate a punch unit because it is possible to use a plate which is prefabricated with the reference notches 44ae and 44be. The punch unit can be omitted even in the case where the rotation axis of the recording drum 5 is disposed perpendicular to the plate transportation direction of the storage/transportation mechanism 2 if an additional mechanism for tilting the plate with respect to the plate transportation direction during plate transportation (e.g., a mechanism for tilting the plate at a predetermined angle during a centering process) is incorporated in the storage/transportation mechanism 2 to permit the use of a plate which is prefabricated with the reference notches 44ae and 44be.

In the present example, both reference notches 44ae and 44be are formed along the leading end of the plate P, so that the reference notch 44ae is fitted with the positioning pin 51a and the notch 44be is fitted with the positioning pin 51b, the present invention is not limited thereto. For example, it would be possible to form only the reference notch 44ae, while omitting the notch 44be. In this case, the positioning of the plate P can be realized by fitting the positioning pin 51a in the reference notch 44ae and abutting the positioning pin 51b with the leading end of the plate P.

Figure 23A:
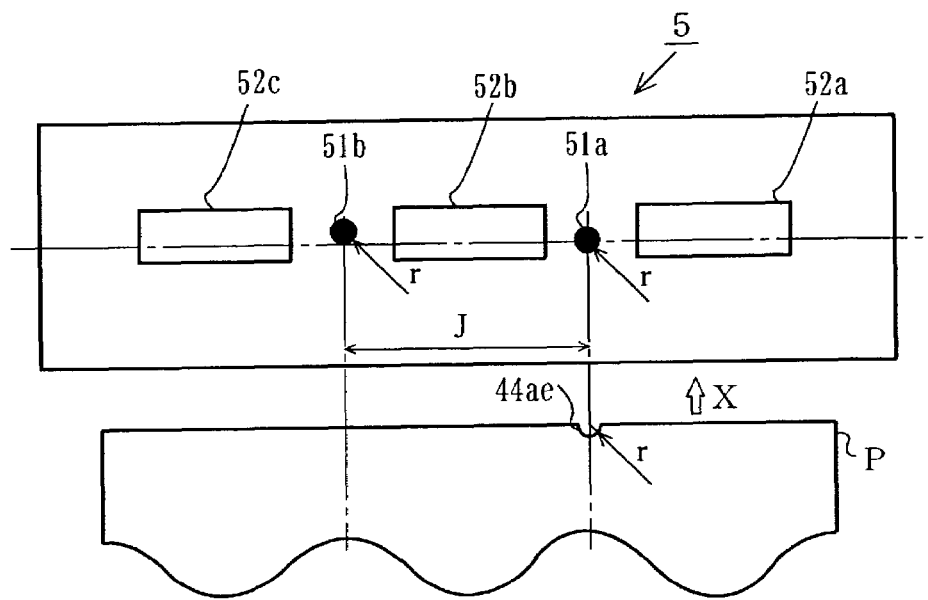
FIGS. 23A and 23B are schematic diagrams illustrating relative positions of a reference notch 44e formed in the plate P and the positioning pins 51 provided on the recording drum 5.
Figure 23B:
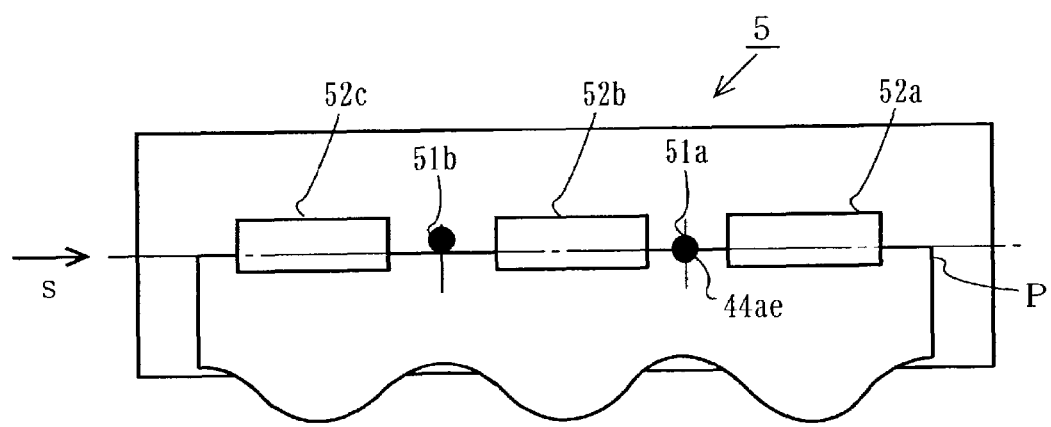

Next, a manner in which a plate P having a notch formed by means of the punch unit 4 comes in contact with and is stabilized against the positioning pins 51 fixed on the recording drum 5 according to the present invention will be described. FIGS. 23A and 23B are schematic diagrams illustrating relative positions of a reference notch 44e formed in the plate P and the positioning pins 51 provided on the recording drum 5. For conciseness, FIGS. 23A and 23B illustrate only the reference notch 44ae being formed in the plate P, as well as two positioning pins 51a and 51b. In FIG. 23A, the leading-end clamps 52a, 52b, and 52c, as well as the positioning pins 51a and 51b, are shown to be provided on the outer surface of the recording drum 5. The reference notch 44ae has been formed along the leading end of the plate P by the punching unit 4 so as to match the positioning pin 51 as described above. The reference notch 44ae has a semicircular shape with the same radius r as that of the positioning pin 51a.

The plate P is transported onto the recording drum 5 in the X direction in FIG. 23A by means of a transporter (not shown), and positioned as the positioning pin 51a fits into the reference notch 44ae and the positioning pin 51b abuts with the leading end of the plate P. Thereafter, the leading-end clamps 51a to 51c pinch down the leading end of the plate P on the recording drum 5 for stabilization. FIG. 23B is a schematic diagram illustrating plate P having been positioned and stabilized on the recording drum 5. As shown in FIG. 23B, the positioning of the plate P along the cylindrical axis direction of the recording drum 5 is determined as the positioning pin 51a fits in the reference notch 44ae, whereas the positioning of the plate P along the circumferential direction (i.e., the X direction in FIG. 23A) is determined as the positioning pin 51a fits in the reference notch 44ae and the positioning pin 51b abuts with the leading end of the plate P.

Figure 24A:
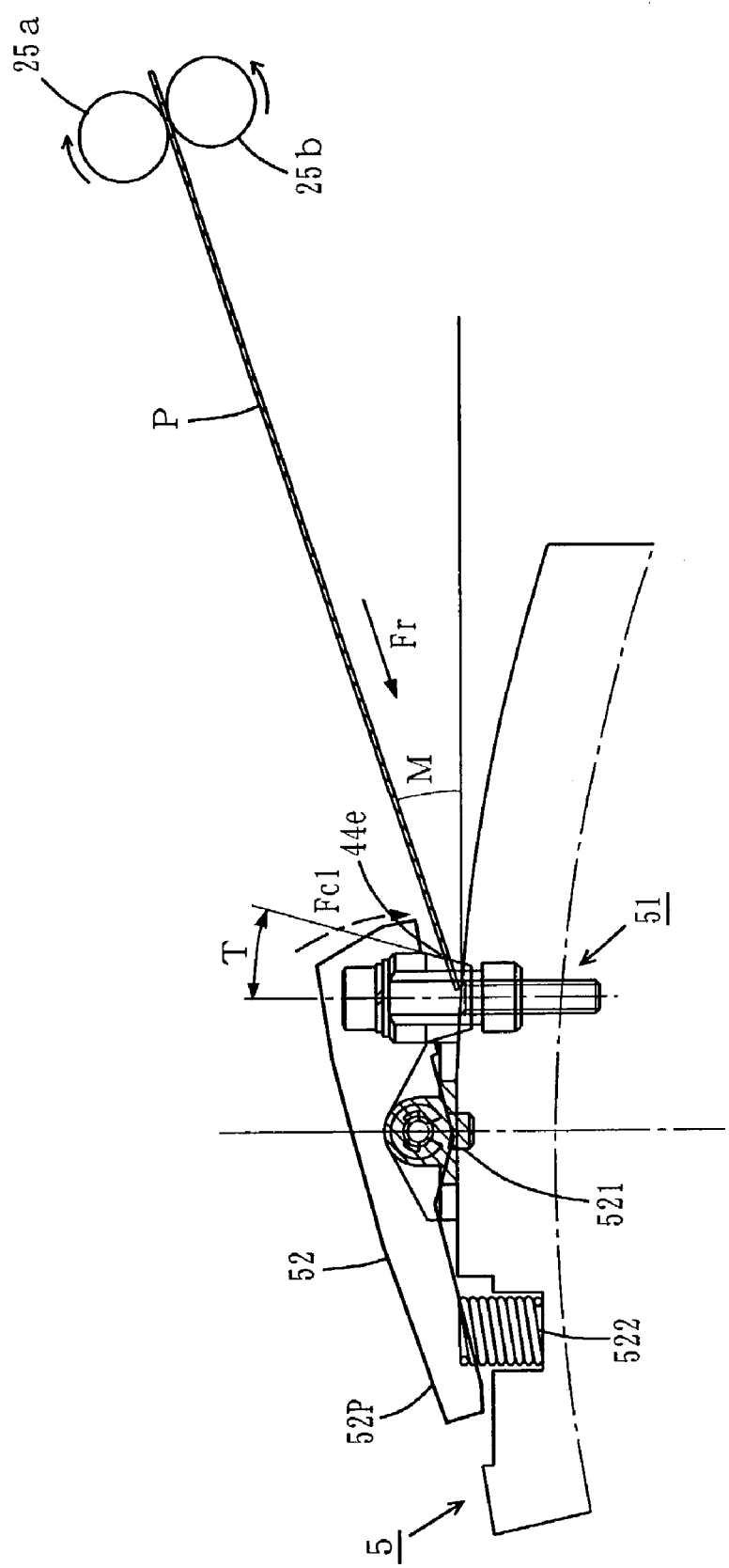
FIGS. 24A and 24B are longitudinal cross-sectional views illustrating how the plate P is positioned and stabilized on the recording drum 5, as seen from an s direction in FIG. 23B.
Figure 24B:
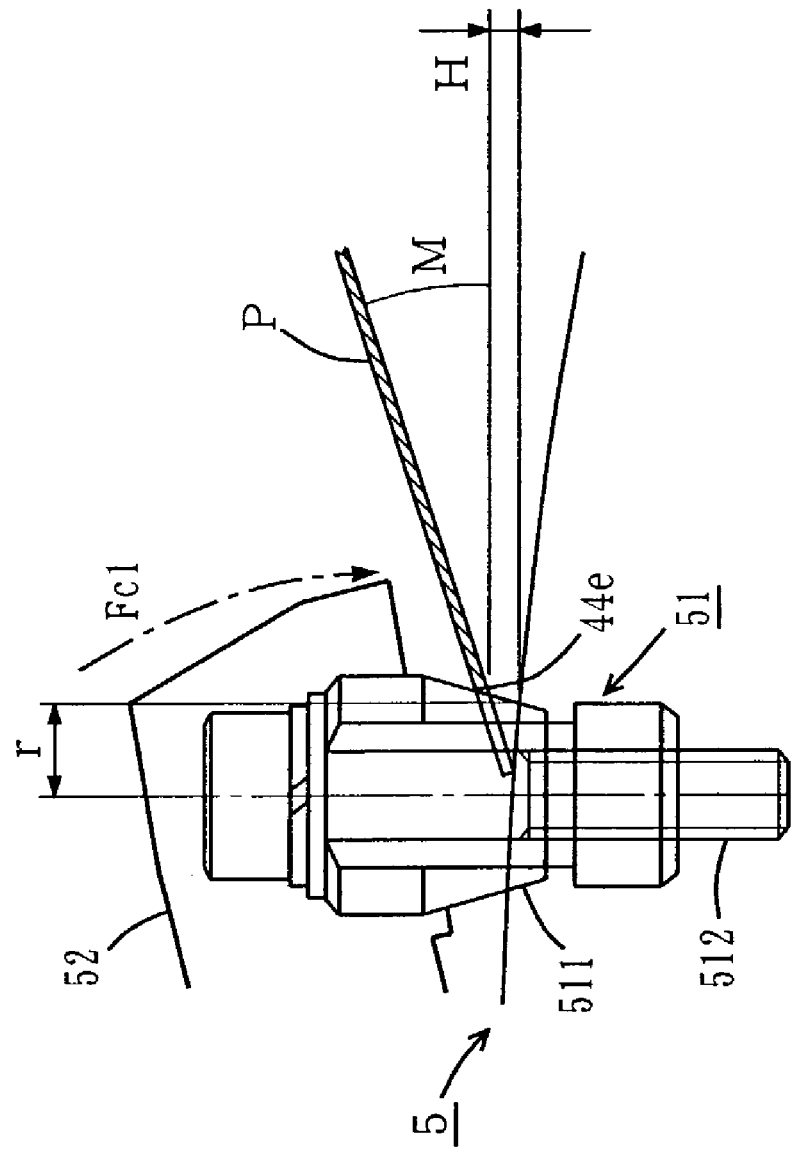

Next, the structures of the leading-end clamp 52 and the positioning pin 51 will be described. FIGS. 24A and 24B are longitudinal cross-sectional views illustrating how the plate P is positioned and stabilized on the recording drum 5, as seen from an s direction in FIG. 23B. The longitudinal cross-sectional view of FIG. 24A illustrates the neighborhood of one of the positioning pins 51 and a corresponding one of the leading-end clamps 52. The longitudinal cross-sectional view of FIG. 24B provides an enlarged view of the neighborhood of the positioning pin 51. In FIGS. 24A and 24B, the leading-end clamp 52 is disposed so as to pivot around a leading-end clamp axis 521. At one end, the leading-end clamp 52 is biased by a spring 522 so as to pivot in an Fcl direction in FIGS. 24A and 24B and clamp the leading end of the plate P. An end 52P of the leading-end clamp 52, at which the spring 522 is provided, is shown as being lowered by the aforementioned first clamp driving section (not shown) in FIGS. 24A and 24B. The positioning pin 51 comprises a generally cylindrical pin 511 being internally fastened with a bolt 512, thereby being fixed on the recording drum 5. The pin 511 may include: a tapered portion having a reference taper angle 2T; and a cylindrical portion. The pin 511 is disposed in such a manner that the smaller end of the tapered portion is in contact with the outer surface of the cylindrical recording drum 5, with the point of contact closer to the storage/transportation mechanism 2 being at the distance of r from the center of the positioning pin 51. It is ensured that the central axis of the positioning pin 51 runs parallel to an imaginary line connecting the cylindrical center of the recording drum 5 and the center of rotation of the leading-end clamp axis 521.

As described above, the plate P is transported onto the recording drum 5 from the transportation rollers 25 of the storage/transportation mechanism 2. The plate P is transported onto the recording drum 5 by the transportation rollers 25 of the storage/transportation mechanism 2, so as to travel in the Fr direction at a transportation angle of M with respect to the normal of the central axis of the positioning pin 51. The leading end of the plate P comes in contact with the outer surface of the cylindrical recording drum 5, so that the reference notch 44e in the plate P fits with the tapered portion of the positioning pin 51 (the illustrated plate P is in this state). Next, once the first clamp driving section (not shown) releases the end 52P of the leading-end clamp 52, the leading-end clamp 52, which is biased by the spring 522, pivots in the Fcl direction. As a result, the leading end of the plate P is pinched by the leading-end clamp 52 onto the recording drum 5 for stabilization.

When the plate P is transported onto the recording drum 5 by the transportation rollers 25 so that the positioning pin 51 is fitted in the reference notch 44e (i.e., before the leading end of the plate P is clamped by the leading-end clamp 52), the deep end of the reference notch 44e is at a distance H off the outer surface of the cylindrical recording drum 5, where the distance H is given as follows:

$$H \geq r \cdot \tan M.$$

Next, the leading end of the plate P is clamped by the leading-end clamp 180 while receiving a driving force in the Fr direction from the transportation rollers 25. Through this clamping operation, the periphery of the reference notch 44e is pressed against the outer surface of the cylindrical recording drum 5. In other words, the periphery of the reference notch 44e must travel the distance H while being in contact with the positioning pins 51 under the driving force applied in the Fr direction. Since the plate P is prevented from moving in a direction perpendicular to the outer surface of the cylindrical recording drum 5 due to a friction force against the positioning pins 51, deformation would conventionally have occurred around the reference notch 44e. However, according to the present example of the invention, the plate P is in contact with the tapered portion of the pin 511, a less friction force is applied than in the case of employing the conventional cylindrical-shaped pin, thereby effectively preventing the deformation of the plate P. The inventors have confirmed this effect, as shown in the table below.

| plate transportation angle | taper angle (2T) | thickness of plate p | result |
| --- | --- | --- | --- |
| 3.7° | 0° | 0.24 mm | substantial deformation |
| | 0° | 0.30 mm | substantial deformation |
| | 10° | 0.24 mm | substantial deformation |
| | 10° | 0.30 mm | slight deformation |
| | 20° | 0.24 mm | slight deformation |
| | 20° | 0.30 mm | slight deformation |
| | 30° | 0.24 mm | no deformation |
| | 30° | 0.30 mm | no deformation |

As can be seen from the above results, in the case where the transportation angle M of the plate P is 3.7°, the deformation of the plate can be prevented by setting the taper angle 2T of the positioning pin 51 to be 30° or above. Note, however, that the taper angle 2T may be prescribed in accordance with the transportation conditions (e.g., the transportation angle and/or the thickness of the P) for the plate P.

Figure 25A:
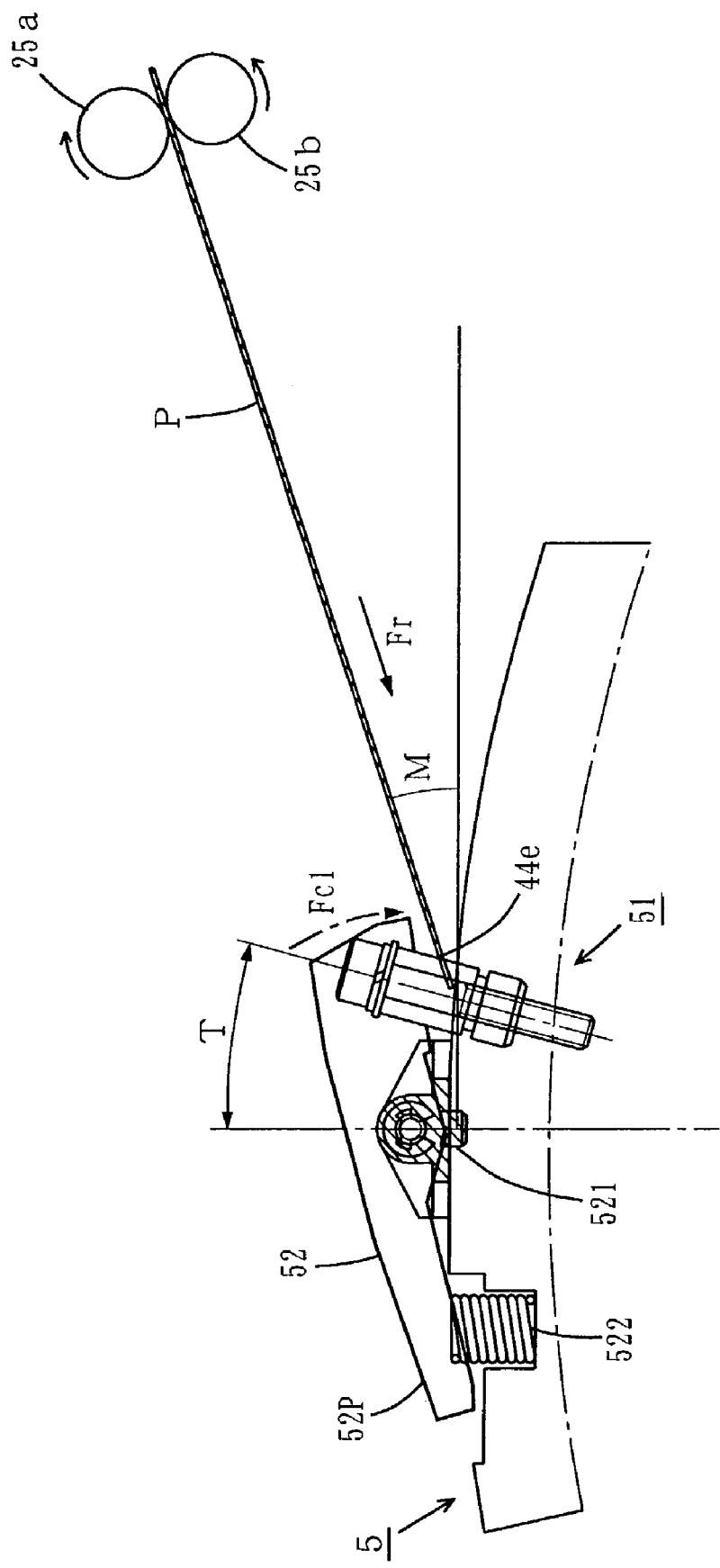
FIGS. 25A and 25B are longitudinal cross-sectional views illustrating how the plate P is positioned and stabilized on the recording drum 5 by employing cylindrical-shaped positioning pins, as seen from an s direction in FIG. 23B.
Figure 25B:
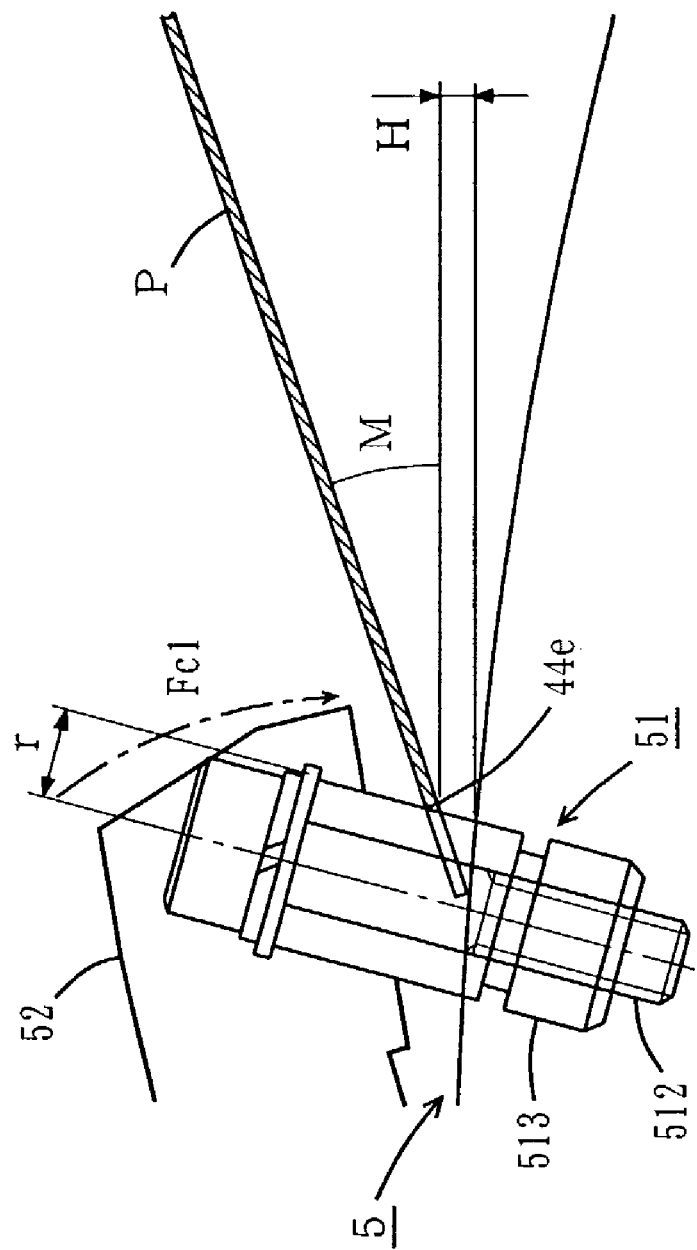
Figure 26:
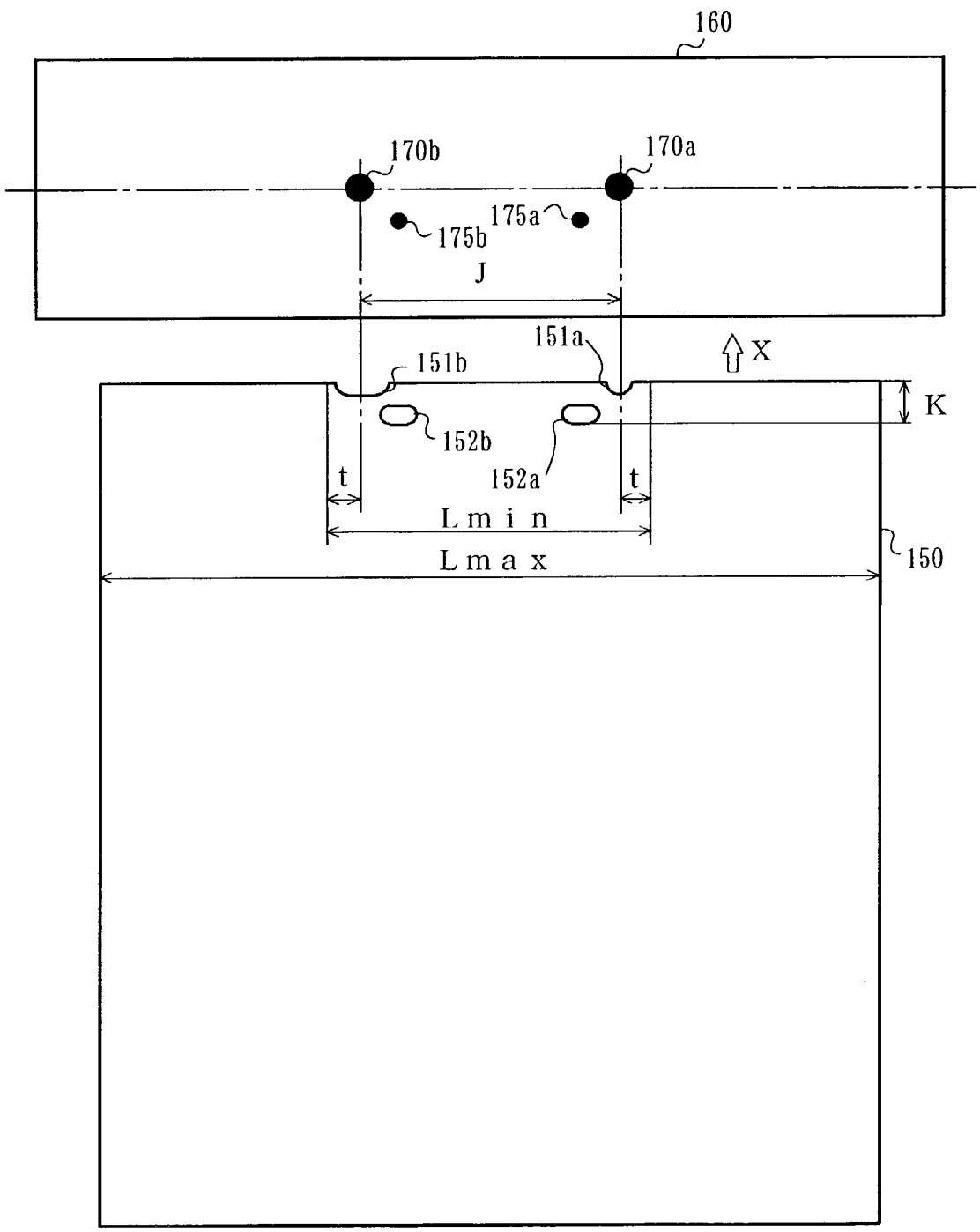
FIG. 26 is a schematic diagram showing the relative positions of holes which are provided in a plate with various purposes and pins which are provided on the recording drum.
Figure 27A:
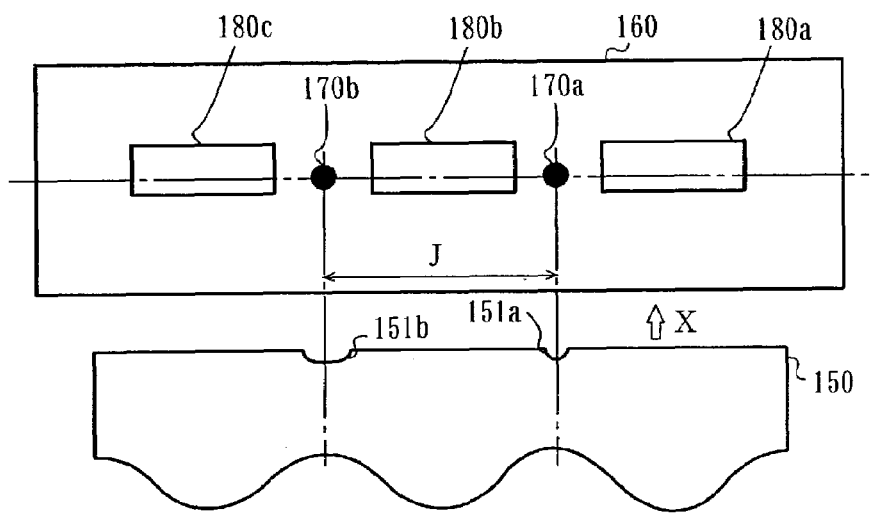
FIGS. 27A and 27B are schematic diagrams illustrating exemplary relative positions of positioning notches (for a recording drum) formed on a conventional plate and pins provided on the recording drum.
Figure 27B:
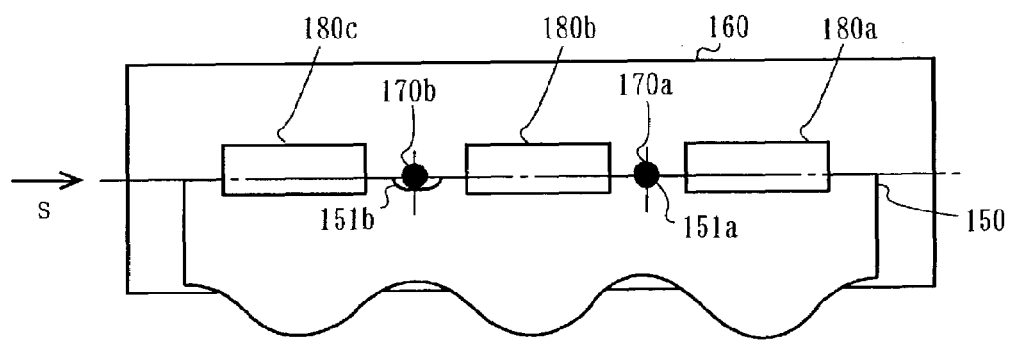

Although the above-described positioning pins 51 are illustrated to have tapered portions, positioning pins having the conventional cylindrical shape may instead be employed as follows. FIGS. 25A and 25B are longitudinal cross-sectional views illustrating how the plate P is positioned and stabilized on the recording drum 5 by employing cylindrical-shaped positioning pins, as seen from an s direction in FIG. 23B. The longitudinal cross-sectional view of FIG. 25A illustrates the neighborhood of one of the positioning pins 51 and a corresponding one of the leading-end clamps 52. The longitudinal cross-sectional view of FIG. 25B provides an enlarged view of the neighborhood of the positioning pin 51.

In FIGS. 25A and 25B, the positioning pin 51 comprises a generally cylindrical pin 513 being internally fastened with a bolt 512, thereby being fixed on the recording drum 5. The positioning pin 51 includes a cylindrical portion having a radius r. The central axis of the positioning pin 51 is disposed at an angle T with respect to an imaginary line connecting the cylindrical center of the recording drum 5 and the center of rotation of the leading-end clamp axis 521, so as to be tilted toward the storage/transportation mechanism 2. Otherwise, the structure shown in FIGS. 25A and 25B are similar to the structure shown in FIGS. 24A and 24B; any portions which also appear in FIGS. 24A and 24B are denoted by the same reference numerals as those used therein, and the descriptions thereof are omitted.

As described above, the plate P is transported onto the recording drum 5 from the transportation rollers 25 of the storage/transportation mechanism 2. The plate P is transported onto the recording drum 5 by the transportation rollers 25 of the storage/transportation mechanism 2, so as to travel in the Fr direction at a transportation angle of M with respect to the normal of an imaginary line connecting the cylindrical center of the recording drum 5 and the center of rotation of the leading-end clamp axis 521. The leading end of the plate P comes in contact with the outer surface of the cylindrical recording drum 5, so that the reference notch 44e in the plate P fits with the tapered portion of the positioning pin 51 (the illustrated plate P is in this state). Next, once the first clamp driving section (not shown) releases the end 52P of the leading-end clamp 52, the leading-end clamp 52, which is biased by the spring 522, pivots in the Fcl direction. As a result, the leading end of the plate P is pinched by the leading-end clamp 52 onto the recording drum 5 for stabilization.

When the plate P is transported onto the recording drum 5 by the transportation rollers 25 so that the positioning pin 51 is fitted in the reference notch 44e (i.e., before the leading end of the plate P is clamped by the leading-end clamp 52), the deep end of the reference notch 44e is at a distance H off the outer surface of the cylindrical recording drum 5, where the distance H is given as follows, as in the example illustrated in FIGS. 24A and 24B:

$H \geq r \cdot \tan M.$

Next, the leading end of the plate P is clamped by the leading-end clamp 180 while receiving a driving force in the Fr direction from the transportation rollers 25. Through this clamping operation, the periphery of the reference notch 44e is pressed against the outer surface of the cylindrical recording drum 5. In other words, the periphery of the reference notch 44e must travel the distance H while being in contact with the positioning pins 51 under the driving force applied in the Fr direction. Since the plate P is prevented from moving in a direction perpendicular to the outer surface of the cylindrical recording drum 5 due to a friction force against the positioning pins 51, deformation would conventionally have occurred around the reference notch 44e. However, according to the present example of the invention, the plate P is in contact with the positioning pin 51 at the same angle T as the positioning pin including a tapered portion having a taper angle 2T, illustrated in FIGS. 24A and 24B. Thus, it will be appreciated that similar effects to those obtained by employing the aforementioned positioning pin including a tapered portion having a taper angle 2T can be attained.

Thus, in accordance with the present cylindrical outer surface scanning apparatus, a positioning pin for positioning a plate on the recording drum is employed such that the positioning pin has a tapered shape with a predetermined taper angle or the plate is tilted at an angle in the direction in which the plate is transported onto the recording drum. As a result, the plate is prevented from undergoing deformation when clamped on the recording drum. This allows the plate mounted on the recording drum to be in close contact with the recording drum across the entire area, and an exposure process using an exposure head can be successfully carried out because all area falls in the depth of focus for an exposure head. Thus, unsatisfactory printing results such as blurred images can be precluded.

Although the above description of the present invention is directed to a cylindrical outer surface scanning apparatus incorporating a punch unit for forming a positioning notch(es) in a plate, the present invention is not limited to such a cylindrical outer surface scanning apparatus. The cylindrical outer surface scanning apparatus does not need to include a punch unit because the present invention also allows the use of a plate which is prefabricated with a fitting portion(s) for positioning purposes.

While the invention has been described in detail, the foregoing description is in all aspects illustrative and not restrictive. It is understood that numerous other modifications and variations can be devised without departing from the scope of the invention.

What is claimed is:

1. A cylindrical outer surface scanning apparatus for recording an image on an image recording material mounted thereon, comprising:

a recording section having a cylindrical outer surface on which the image recording material is mounted, wherein the recording section at least includes:

a first positioning member fixed on the cylindrical outer surface;

a second positioning member fixed on the cylindrical outer surface and located at a first pitch from the first positioning member along a cylindrical axis direction of the recording section; and a third positioning member fixed on the cylindrical outer surface and located at a second pitch from the first positioning member along the cylindrical axis direction, so that the third positioning member is further away from the first positioning member than the second positioning member, the second pitch being greater than the first pitch;

wherein the cylindrical outer surface scanning apparatus further comprises a first non-contacting portion forming section for forming a first non-contacting portion in the image recording material to prevent the second positioning member from coming in contact with the image recording material when the image recording material is mounted and positioned in place on the recording section by the first and third positioning members; and wherein the cylindrical outer surface scanning apparatus further comprises a punching section for punching the image recording material to specify where on the recording section the image recording material is to be mounted, wherein the punching section at least includes: the first non-contacting portion forming section; and a fitting portion forming section for forming a fitting portion in the image recording material, such that the first positioning member fits in the fitting portion, wherein, in a case where the image recording material is to be positioned in place on the recording section by using the first and second positioning members, the fitting portion forming section forms the fitting portion in the image recording material, so that the image recording material is positioned in place by fitting the first positioning member in the fitting portion and abutting the second positioning member with an end of the image recording material, and wherein, in a case where the image recording material is to be positioned in place on the recording section by using the first and third positioning members, the fitting portion forming section and the first non-contacting portion forming section form the fitting portion and the first non-contacting portion, respectively, in the image recording material, and the image recording material is positioned in place by fitting the first positioning member in the fitting portion and abutting the third positioning member with the end of the image recording material.

2. The cylindrical outer surface scanning apparatus according to claim 1, wherein, in a case where the end of the image recording material along which the fitting portion is formed is shorter than the second pitch, the fitting portion forming section forms the fitting portion in the image recording material, and the image recording material is positioned in place by fitting the first positioning member in the fitting portion and abutting the second positioning member with the end of the image recording material, and wherein, in a case where the end of the image recording material along which the fitting portion is formed is longer than the second pitch, the fitting portion forming section and the first non-contacting portion forming section form the fitting portion and the first non-contacting portion, respectively, in the image recording material, and the image recording material is positioned in place by fitting the first positioning member in the fitting portion and abutting the third positioning member with the end of the image recording material.

3. The cylindrical outer surface scanning apparatus according to claim 1, wherein the punching section further includes: a second non-contacting portion forming section for forming a second non-contacting portion in the image recording material to prevent the third positioning member from coming in contact with the image recording material when the image recording material is mounted on the recording section, and wherein, in a case where a corner along the end of the image recording material is to be located near the third positioning member when the image recording material is positioned in place on the recording section, the fitting portion forming section and the second non-contacting portion forming section form the fitting portion and the second non-contacting portion, respectively, in the image recording material, and the image recording material is positioned in place by fitting the first positioning member in the fitting portion and abutting the second positioning member with the end of the image recording material.

4. The cylindrical outer surface scanning apparatus according to claim 3, wherein a center line of the image recording material is aligned with a middle point between the first and second positioning members for positioning, wherein, in a case where the end of the image recording material along which the fitting portion is formed is shorter than a first length, the first length being a sum of the second pitch and a difference between the second and first pitches, the fitting portion forming section forms the fitting portion in the image recording material, and the image recording material is positioned in place by fitting the first positioning member in the fitting portion and abutting the second positioning member with the end of the image recording material, wherein, in a case where the end of the image recording material along which the fitting portion is formed is longer than a second length, the second length being a sum of the second pitch, the difference between the second and first pitches and a predetermined margin, the fitting portion forming section and the first non-contacting portion forming section form the fitting portion and the first non-contacting portion, respectively, in the image recording material, and the image recording material is positioned in place by fitting the first positioning member in the fitting portion and abutting the third positioning member with the end of the image recording material, and wherein, in a case where the end of the image recording material along which the fitting portion is formed is longer than the first length and shorter than the second length, the fitting portion forming section and the second non-contacting portion forming section form the fitting portion and the second non-contacting portion, respectively, in the image recording material, and the image recording material is positioned in place by fitting first positioning member in the fitting portion and abutting the second positioning member with the end of the image recording material.

5. The cylindrical outer surface scanning apparatus according to claim 1, wherein each of the first to third positioning members is a positioning pin having a radius r, and wherein the second and third positioning members are disposed at the distance of r from the first positioning member along a circumferential direction of the cylindrical outer surface.

6. The cylindrical outer surface scanning apparatus according to claim 1, further comprising a transportation section for transporting the image recording material having been punched by the punching section onto the recording section, wherein the recording section rotates around the cylindrical axis of the recording section, and wherein, when transporting the image recording material having been punched by the punching section onto the recording section, the transportation section transports the image recording material in such a manner that the end of the image recording material is tilted with respect to the cylindrical axis of the recording section, and the image recording material is positioned in place on the recording section by fitting the first positioning member in the fitting portion formed in the image recording material and thereafter abutting the second positioning member with the end of the image recording material.

7. The cylindrical outer surface scanning apparatus according to claim 6,
wherein the punching section and the transportation section are disposed in such a manner that a punching reference line, on which the end of the image recording material is aligned when the fitting portion forming section forms the fitting portion, is not perpendicular to a direction in which the transportation section transports the image recording material, and
wherein the transportation section transports the image recording material in such a manner that the end of the image recording material is tilted with respect to the cylindrical axis of the recording section.

8. The cylindrical outer surface scanning apparatus according to claim 6,
wherein the recording section and the transportation section are disposed in such a manner that the cylindrical axis of the recording section is not perpendicular to a direction in which the transportation section transports the image recording material, and
wherein the transportation section transports the image recording material in such a manner that the end of the image recording material is tilted with respect to the cylindrical axis of the recording section.

9. The cylindrical outer surface scanning apparatus according to claim 6, wherein each of the first and second positioning members is a positioning pin having a radius r, and the first and second positioning members are disposed at the distance of r from each other along a circumferential direction of the cylindrical outer surface, and
wherein the fitting portion is a semicircular notch having the radius r.

10. The cylindrical outer surface scanning apparatus according to claim 1, further comprising a transportation section for transporting the image recording material having been punched by the punching section onto the recording section,
wherein the recording section rotates around the cylindrical axis of the recording section, and
wherein, when transporting the image recording material having been punched by the punching section onto the recording section, the transportation section transports the image recording material in such a manner that the end of the image recording material is tilted with respect to the cylindrical axis of the recording section, and the image recording material is positioned in place on the recording section by fitting the first positioning member in the fitting portion formed in the image recording material and thereafter abutting the third positioning member with the end of the image recording material.

11. The cylindrical outer surface scanning apparatus according to claim 10,
wherein the punching section and the transportation section are disposed in such a manner that a punching reference line, on which the end of the image recording material is aligned when the fitting portion forming section forms the fitting portion, is not perpendicular to a direction in which the transportation section transports the image recording material, and
wherein the transportation section transports the image recording material in such a manner that the end of the image recording material is tilted with respect to the cylindrical axis of the recording section.

12. The cylindrical outer surface scanning apparatus according to claim 10,
wherein the recording section and the transportation section are disposed in such a manner that the cylindrical axis of the recording section is not perpendicular to a direction in which the transportation section transports the image recording material, and
wherein the transportation section transports the image recording material in such a manner that the end of the image recording material is tilted with respect to the cylindrical axis of the recording section.

13. The cylindrical outer surface scanning apparatus according to claim 10, wherein each of the first and third positioning members is a positioning pin having a radius r, and the first and second positioning members are disposed at the distance of r from each other along a circumferential direction of the cylindrical outer surface, and wherein the fitting portion is a semicircular notch having the radius r.

14. The cylindrical outer surface scanning apparatus according to claim 1, further comprising:
a clamp section disposed on the cylindrical outer surface of the recording section for pinching the end of the image recording material against the cylindrical outer surface of the recording section to stabilize the image recording material on the recording section; and
a transportation section for transporting the image recording material with the fitting portion into the clamp section on the recording section,
wherein the recording section rotates around the cylindrical axis of the recording section,
wherein the first positioning member includes a tilted portion presenting a tilt toward a direction in which the transportation section transports the image recording material, such that the fitting portion formed in the image recording material is fitted with the tilted portion when positioning the image recording material in place on the recording section, and
wherein, the transportation section transports the image recording material with the fitting portion into the clamp section in such a manner the tilted portion of the first positioning member fits in the fitting portion, and
wherein the clamp section stabilizes on the recording section the image recording material having been transported by the transportation section so that the tilted portion of the first positioning member fits in the fitting portion.

15. The cylindrical outer surface scanning apparatus according to claim 14,
wherein a relationship $\gamma=90°-\alpha-\beta$ exists among: an angle $\alpha$ with which the transportation section transports the image recording material into the clamp section relative to a tangent of the cylindrical outer surface of the recording section extending through the clamp section; a tilt angle $\beta$ of the tilt of the tilted portion toward the direction in which the transportation section transports the image recording material; and an angle $\gamma$ of the image recording material existing when the fitting portion fits with the tilted portion.

16. The cylindrical outer surface scanning apparatus according to claim 14, wherein the tilted portion is constituted by a tapered portion formed in at least a portion of the first positioning member, a smaller end of the tilted portion being fixed on the cylindrical outer surface of the recording section.

17. The cylindrical outer surface scanning apparatus according to claim 16, wherein a taper angle of the tapered portion of the first positioning member is about 30°.

18. The cylindrical outer surface scanning apparatus according to claim 14, wherein the tilted portion is constituted by a cylindrical portion formed in at least a portion of the first positioning member, the cylindrical portion being fixed on the cylindrical outer surface of the recording section in such a manner that a central axis of the cylindrical portion is tilted toward the direction in which the transportation section transports the image recording material.

19. The cylindrical outer surface scanning apparatus according to claim 18, wherein a tilt angle of the cylindrical portion of the first positioning member is about 15°.

20. A cylindrical outer surface scanning method for recording an image on an image recording material mounted on a cylindrical outer surface, comprising:
a mounting step of mounting the image recording material on the cylindrical outer surface,
wherein the mounting step further comprises a positioning step of positioning the image recording material in place on the cylindrical outer surface by selectively employing:
a first positioning member fixed on the cylindrical outer surface;
a second positioning member fixed on the cylindrical outer surface and located at a first pitch from the first positioning member along a cylindrical axis direction of cylindrical outer surface; and
a third positioning member fixed on the cylindrical outer surface and located at a second pitch from the first positioning member along the cylindrical axis direction, so that the third positioning member is further away from the first positioning member than the second positioning member, the second pitch being greater than the first pitch,
wherein the cylindrical outer surface scanning method further comprises:
a non-contacting portion forming step of forming a non-contacting portion in the image recording material to prevent the second positioning member from coming in contact with the image recording material when the positioning step positions the image recording material in place on the cylindrical outer surface by employing the first and third positioning members;
the cylindrical outer surface scanning apparatus further comprising:
a punching section for punching the image recording material to specify where on the recording section the image recording material is to be mounted; and
a transportation section for transporting the image recording material having been punched by the punching section onto the recording section,
wherein the punching section at least includes: the first non-contacting portion forming section; a first fitting portion forming section for forming a first fitting portion in the image recording material such that the first, fitting portion fits with the first positioning member; and
a second fitting portion forming section for forming a second fitting portion in the image recording material such that the second fitting portion fits with the third positioning member, wherein the recording section rotates around the cylindrical axis of the recording section, and
wherein, when transporting the image recording material having been punched by the punching section onto the recording section, the transportation section transports the image recording material in such a manner that the end of the image recording material is tilted with respect to the cylindrical axis of the recording section, and the image recording material is positioned in place on the recording section by fitting the first positioning member in the fitting portion formed in the image recording material and thereafter fitting the third positioning member in the second fitting portion formed in the image recording material;
the cylindrical outer surface scanning apparatus further comprising:
a clamp section disposed on the cylindrical outer surface of the recording section for pinching the end of the image recording material against the cylindrical outer surface of the recording section to stabilize the image recording material on the recording section; and
a second transportation section for transporting the image recording material with the fitting portion into the clamp section on the recording section,
wherein the recording section rotates around the cylindrical axis of the recording section,
wherein the first positioning member includes a tilted portion presenting a tilt toward a direction in which the second transportation section transports the image recording material, such that the fitting portion formed in the image recording material is fitted with the tilted portion when positioning the image recording material in place on the recording section, and
wherein, the second transportation section transports the image recording material with the fitting portion into the clamp section in such a manner the tilted portion of the first positioning member fits in the fitting portion, and
wherein the clamp section stabilizes on the recording section the image recording material having been transported by the second transportation section so that the tilted portion of the first positioning member fits in the fitting portion.

21. The cylindrical outer surface scanning apparatus according to claim 20, wherein each of the first and third positioning members is a positioning pin having a radius r, and the first and third positioning members are aligned in a direction parallel to the cylindrical axis of the recording section, and wherein the first fitting portion is a semicircular notch having the radius r.

22. The cylindrical outer surface scanning apparatus according to claim 20,
wherein a relationship $\gamma=90°-\alpha-\beta$ exists among: an angle $\alpha$ with which the second transportation section transports the image recording material into the clamp section relative to a tangent of the cylindrical outer surface of the recording section extending through the clamp section; a tilt angle $\beta$ of the tilt of the tilted portion toward the direction in which the second transportation section transports the image recording material; and an angle $\gamma$ of the image recording material existing when the fitting portion fits with the tilted portion.

23. The cylindrical outer surface scanning apparatus according to claim 20, wherein the tilted portion is constituted by a tapered portion formed in at least a portion of the first positioning member, a smaller end of the tilted portion being fixed on the cylindrical outer surface of the recording section.

24. The cylindrical outer surface scanning apparatus according to claim 23, wherein a taper angle of the tapered portion of the first positioning member is about 30°.

25. The cylindrical outer surface scanning apparatus according to claim 20, wherein the tilted portion is constituted by a cylindrical portion formed in at least a portion of the first positioning member, the cylindrical portion being fixed on the cylindrical outer surface of the recording section in such a manner that a central axis of the cylindrical portion is tilted toward the direction in which the second transportation section transports the image recording material.

26. The cylindrical outer surface scanning apparatus according to claim 25, wherein a tilt angle of the cylindrical portion of the first positioning member is about 15°.

* * * * *